United States Patent
Ogawa et al.

(10) Patent No.: US 7,237,220 B2
(45) Date of Patent: Jun. 26, 2007

(54) HIGH LEVEL SYNTHESIS METHOD FOR SEMICONDUCTOR INTEGRATED CIRCUIT

(75) Inventors: Osamu Ogawa, Neyagawa (JP); Dai Hattori, Otsu (JP); Keiichi Kurokawa, Takaraduka (JP); Masahiko Toyonaga, Kochi (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 239 days.

(21) Appl. No.: 11/159,291

(22) Filed: Jun. 23, 2005

(65) Prior Publication Data

US 2005/0289499 A1    Dec. 29, 2005

(30) Foreign Application Priority Data

Jun. 25, 2004    (JP)    ............................. 2004-188840

(51) Int. Cl.
G06F 17/50    (2006.01)
(52) U.S. Cl. ............................................ 716/18; 716/2
(58) Field of Classification Search .................... 716/1, 716/2, 18; 703/14, 15
See application file for complete search history.

(56) References Cited

U.S. PATENT DOCUMENTS

| | | | |
|---|---|---|---|
| 5,870,588 A * | 2/1999 | Rompaey et al. .............. 703/13 |
| 6,324,678 B1 * | 11/2001 | Dangelo et al. ............... 716/18 |
| 6,415,420 B1 | 7/2002 | Cheng et al. | |
| 6,604,232 B2 | 8/2003 | Okada et al. | |
| 6,782,511 B1 * | 8/2004 | Frank et al. .................... 716/1 |
| 6,925,628 B2 * | 8/2005 | Ogawa et al. ................. 716/18 |
| 2003/0006575 A1 | 1/2003 | Genis et al. | |
| 2004/0083443 A1 | 4/2004 | Ogawa et al. | |

FOREIGN PATENT DOCUMENTS

JP    2977422    7/1994

OTHER PUBLICATIONS

Lev et al., Eedesign, "Right on time—requirements for advanced custom design" (searched on Jun. 1, 2004 in the Internet (URL: http://www.eedesign.com/story/OEG20030822S0027), Aug. 22, 2003.
Dougherty et al., "Unifying Behavioral Synthesis and Physical Design", Proceedings for the 37th Design Automation Conference (2000).
Um et al., "Layout-Driven Resource Sharing in High-Level Synthesis", Proceedings for International Conference on Computer Aided Design (2002).
Paulin et al., "Force-Directed Scheduling for the Behavioral Synthesis of ASIC's", IEEE Transactions on Computer-Aided Design, vol. 8, No. 6, Jun. 1989.

* cited by examiner

Primary Examiner—Thuan Do
Assistant Examiner—Binh Tat
(74) Attorney, Agent, or Firm—McDermott Will & Emery LLP

(57) ABSTRACT

A CDFG which is a graph representing calculations and a data flow included in the design specifications of a circuit is generated S101, a clock cycle required for the processing is obtained and thus an allocated resource connection graph is generated S102. When the allocated resource connection graph includes nodes to which hardware resources having the same function are allocated, a sharing edge for controlling sharing of the nodes is added between the nodes S103. A provisional layout of the allocated resource connection graph having the sharing edge added thereto is provided S104, and the nodes of the allocated resource connection graph are shared based on the layout result S105. The sharing edge is provided with attribute or weight such as attraction or repulsion. Thus, the distance between the nodes in the layout result is controlled and the degree at which the resources are shared is controlled.

49 Claims, 35 Drawing Sheets

F I G. 2
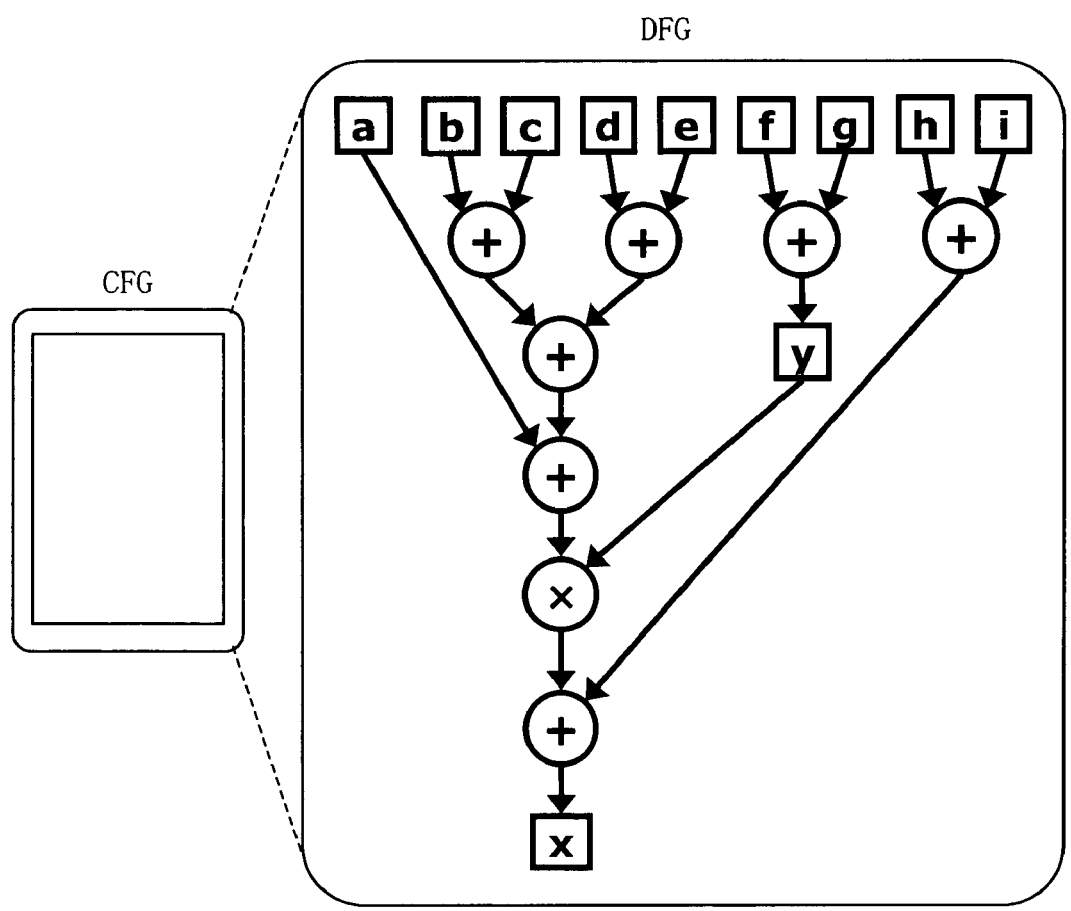

F I G. 5

|  | $+_1$ | $+_2$ | $+_3$ | $+_4$ | $+_5$ | $+_6$ | $+_7$ |
|---|---|---|---|---|---|---|---|
| $+_1$ |  | REPULSION FORCE | ATTRACTION FORCE | ATTRACTION FORCE | — | ATTRACTION FORCE | ATTRACTION FORCE |
| $+_2$ |  |  | ATTRACTION FORCE | ATTRACTION FORCE | — | ATTRACTION FORCE | ATTRACTION FORCE |
| $+_3$ |  |  |  | ATTRACTION FORCE | REPULSION FORCE | ATTRACTION FORCE | ATTRACTION FORCE |
| $+_4$ |  |  |  |  | ATTRACTION FORCE | ATTRACTION FORCE | — |
| $+_5$ |  |  |  |  |  | — | ATTRACTION FORCE |
| $+_6$ |  |  |  |  |  |  | ATTRACTION FORCE |
| $+_7$ |  |  |  |  |  |  |  |

FIG. 7       PRIOR ART

▨ : SCHEDULE CHANGEABLE RANGE

F I G. 1 0

|     | $+_1$ | $+_2$ | $+_3$ | $+_4$ | $+_5$ | $+_6$ | $+_7$ |
|-----|-----|-----|-----|-----|-----|-----|-----|
| $+_1$ |     | 0   | 2/3 | 3/4 | 1   | 1   | 1   |
| $+_2$ |     |     | 2/3 | 3/4 | 1   | 1   | 1   |
| $+_3$ |     |     |     | 3/4 | 2/3 | 2/3 | 1   |
| $+_4$ |     |     |     |     | 3/4 | 3/4 | 1   |
| $+_5$ |     |     |     |     |     | 1   | 1   |
| $+_6$ |     |     |     |     |     |     | 1   |
| $+_7$ |     |     |     |     |     |     |     |

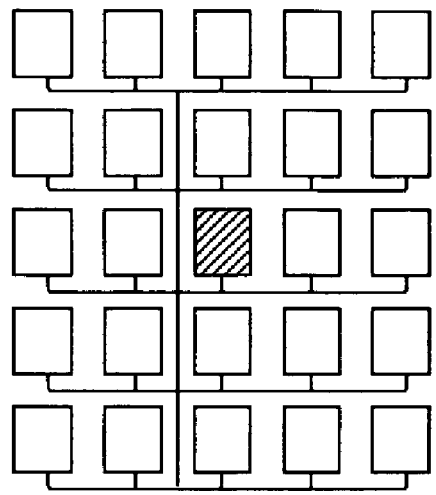
F I G. 17 A
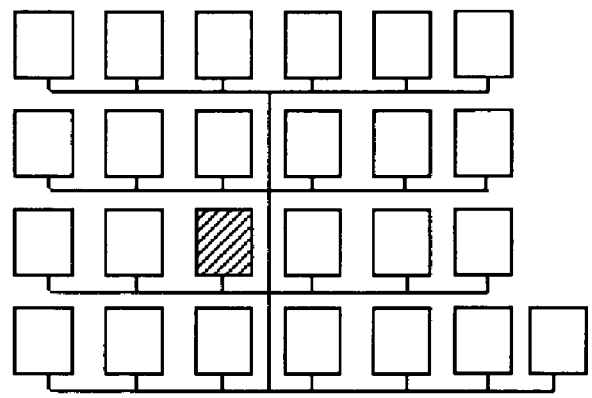
F I G. 17 B
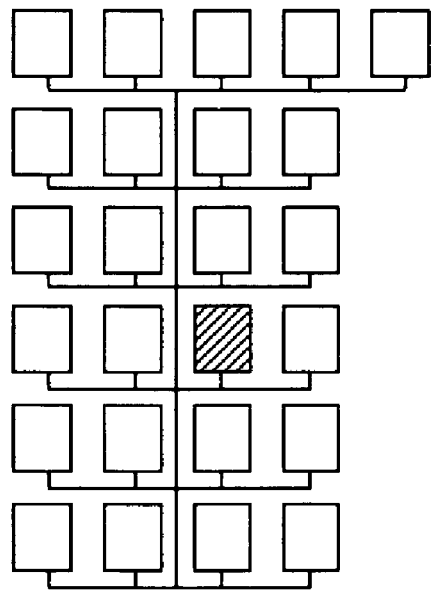
F I G. 17 C

FIG. 24
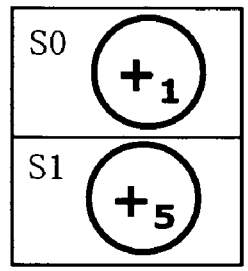
FIG. 25
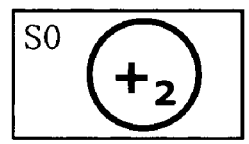
FIG. 26A   FIG. 26B   FIG. 26C
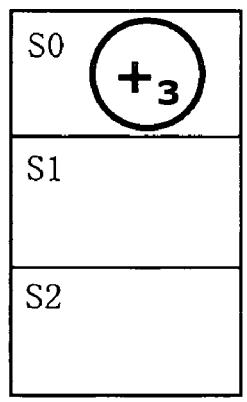 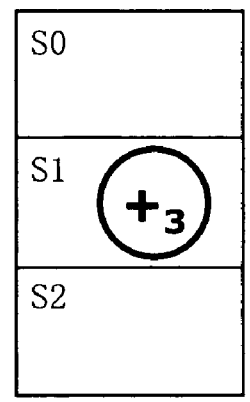 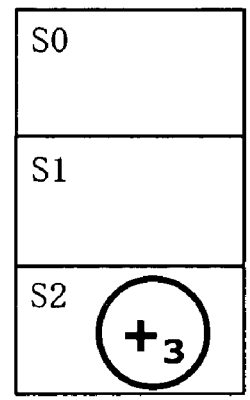

F I G. 3 1

| | $+_{1/5}$ | $+_2$ | $+_3$ | $+_{4/7}$ | $+_6$ |
|---|---|---|---|---|---|
| $+_{1/5}$ | | — | 1/3 | 1/2 | — |
| $+_2$ | | | 2/3 | 3/4 | 1 |
| $+_3$ | | | | 3/4 | 2/3 |
| $+_{4/7}$ | | | | | 3/4 |
| $+_6$ | | | | | |

FIG. 33
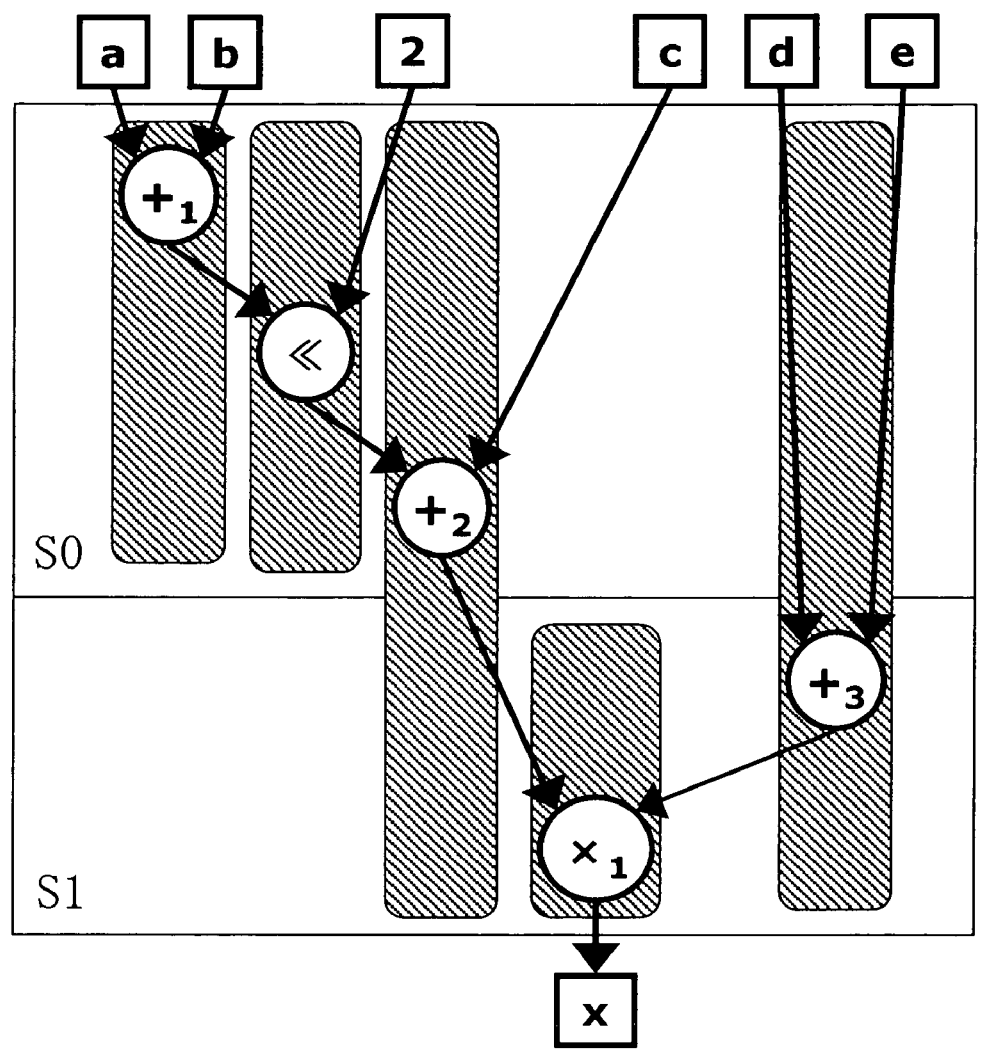
 : SCHEDULE CHANGEABLE RANGE

FIG. 37
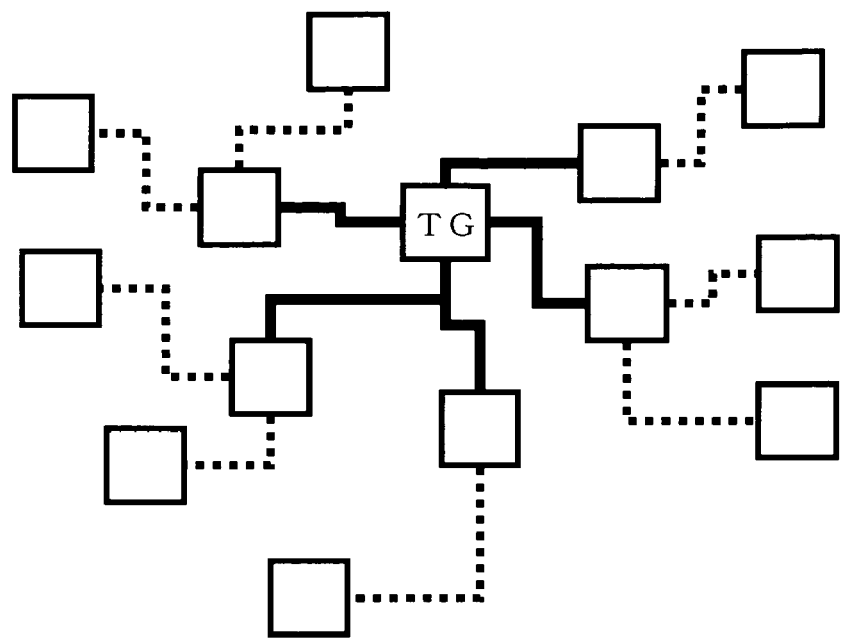
FIG. 38
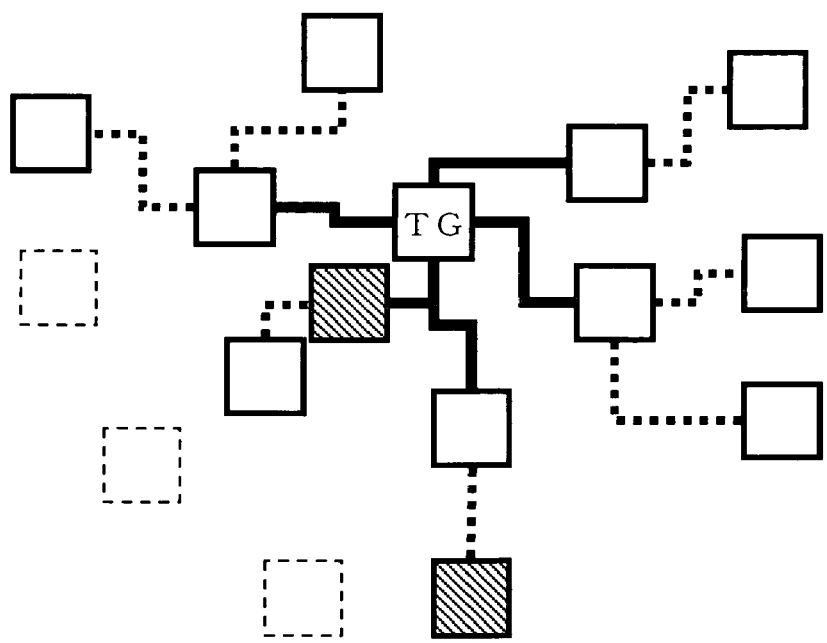
 : DUMMY NODE

▨ : SCHEDULE CHANGEABLE RANGE
■ : LIFETIME OF OUTPUT VALUE

▨ : SCHEDULE CHANGEABLE RANGE

■ : LIFETIME OF OUTPUT VALUE

HIGH LEVEL SYNTHESIS METHOD FOR SEMICONDUCTOR INTEGRATED CIRCUIT

BACKGROUND OF THE INVENTION

1. Field of the Invention

The present invention relates to a high level synthesis method for a semiconductor integrated circuit, and more specifically to a high level synthesis method for a semiconductor integrated circuit for performing high level synthesis in consideration of a layout.

2. Description of the Background Art

With the spread of increasingly efficient use of information in the society and the development of information technology for supporting such a tendency, information processing functions of electronic devices have been remarkably enhanced. In electronic devices, large scale integrated circuits play a central role for realizing information processing functions. Research and development of ultra-fine and high-precision technologies have been actively performed as process technologies for producing large scale integrated circuits providing higher performance with more complicated structures and lower power consumption at lower cost. On the other hand, for technologies for designing large scale integrated circuits with less work in a shorter period of time, research and development have been performed in a wide range of technologies from highly abstract high level designing to logic circuit synthesis technologies using support by software, physical circuit synthesis technologies, and technologies for using existing circuit designs.

The following problems are described in Lavi Lev and one other, Eedesign, "Right on time—requirements for advanced custom design" (searched on Jun. 1, 2004 in the Internet (URL: http://www.eedesign.com/story/OEG20030822S0027), Aug. 22, 2003). Recent process technologies have reached nano-scale structures and voltage reduction has been advanced. As a result, physical effects, which could be estimated with sufficient precision or could be ignored in circuit designs using the conventional process technologies now cause problems. For example, recent, highly precise semiconductor integrated circuits conspicuously present the influences of charge capacitance parasitic between lines, line resistance, signal interference between electronic circuits (crosstalk, noise, etc.), voltage drop, and the like. The degree of influence of these factors is not known with certainty. For these reasons, it is now difficult to complete layout design and physical design, which are the final stages of circuit design, with certainty.

As described above, while more abstract design technologies are desired for efficiently designing large scale integrated circuits on one hand, the difficulty in guaranteeing completion of circuit design is becoming serious on the other hand.

In order to solve this problem, a method of repeating the steps of high level design to physical design many times is provided. However, this solution is not practical because these two design steps are significantly time-consuming. Recently, a method of performing simple, provisional layout processing in the high level design process is proposed in order to estimate the minimum necessary physical properties.

For example, a high level design method for estimating the layout result in a simple manner as shown in FIG. 44 is proposed in the following two documents: William E. Dougherty and one other, "Unifying Behavioral Synthesis and Physical Design", Proceedings for the 37th Design Automation Conference (2000); and Junhyung Um and two others, "Layout-Driven Resource Sharing in High-Level Synthesis", Proceedings for International Conference on Computer Aided Design (2002). According to the high level design method shown in FIG. 44, a CDFG generation step, an initial allocation scheduling step, a resource arrangement step, and a resource sharing step are performed for operation description data describing the operation specifications of a semiconductor integrated circuit to be designed.

First, in the CDFG generation step (step S11), a graph referred to as a "CDFG" (Control Data Flow Graph; see FIG. 2 described later) is generated based on input operation description data. The CDFG includes a DFG (Data Flow Graph) representing a flow of calculations and data and a CFG (Control Flow Graph) representing execution control of calculations.

Next, in the initial allocation scheduling step (step S12), an allocation schedule (see FIG. 3 described later) and an allocated resource connection graph (see FIG. 4 described later) are generated based on the CDFG generated in the CDFG generation step. The allocation schedule indicates to which clock cycles the processing nodes included in the CDFG are allocated. The allocated resource connection graph is a graph in which nodes represent hardware resources allocated to the processing nodes of the CDFG (hereinafter, referred to as the "allocated resources") and edges represent flows of signals in the CDFG. The CDFG generation step and the initial allocation scheduling step will be described in a first embodiment of the present invention.

Next, in the resource arrangement step (step S13), a rough arrangement of the allocated resources in a provisional layout area is determined based on the allocated resource connection graph generated in the initial allocation scheduling step. This step uses the allocated resources as the nodes to be arranged, and the edges of the allocated resource connection graph as connection elements between the elements to be arranged. In the resource arrangement step, a simplified arrangement technique is used, instead of a precise technique for arranging the elements to be arranged having a determined shape, which is used in a general physical design step (for example, the arrangement technique of standard cells). Specifically, a relative positional relationship when the allocated resources are represented with points having no size is obtained, and then an arranged position of each element to be arranged in the provisional layout area is determined.

Finally, in the resource sharing step (step S14), when a plurality of allocated resources having the same function are arranged close to each other in the layout result, such allocated resources are shared in consideration of the processing timing. This is conducted in order to reduce the number of allocated resources. The allocated resources can be shared for the following reasons. When there are a plurality of allocated resources having the same function, a plurality of allocated resources operating at different clock cycles can be replaced with one of the allocated resources by making the resource operate at these different clock cycles. Then, the other allocated resources are unnecessary.

As a result of sharing, the number of allocated resources is decreased. This can reduce the circuit area. By sharing allocated resources in consideration of the relative positions in the layout, the allocated resources can be shared with no specific difficulty after the layout design, and as a result, high level design with highly precise estimation of the physical design can be performed.

However, the above-described conventional sharing method has the following problems. According to the conventional sharing method, allocated resources are provisionally arranged using an allocated resource connection graph. When a plurality of allocated resources having the same function are arranged close to each other by chance in the layout result, such allocated resources are shared. This method does not consider the allocation schedule obtained in the initial allocation scheduling step. Therefore, when the allocated resources having the same function which are arranged close to each other are shared, the allocation schedule may be changed, which may result in a situation where given design specifications cannot be fulfilled.

One possible solution to this problem is to perform the initial allocation scheduling step with timing conditions which are more stringent than the design specifications (i.e., with higher-speed operation conditions). However, introduction of such an unnecessarily high performance requires more hardware resources and thus increases the circuit area and power consumption. As a result, an optimum circuit cannot be provided.

SUMMARY OF THE INVENTION

Therefore, an object of the present invention is to provide a layout-based high level synthesis method for efficiently performing the sharing of allocated resources, without increasing the number of clock cycles necessary for the processing which is obtained in the allocation scheduling step.

The present invention has the following features to attain the object mentioned above.

A high level synthesis method is a high level synthesis method for a semiconductor integrated circuit in consideration of layout. The high level synthesis method comprises a flow graph generation step of generating a flow graph associating calculations included in a function description of a design target circuit with nodes, and also associating a data flow included in the function description with edges; an initial allocation scheduling step of allocating a usable hardware resource to each of the nodes of the flow graph; allocating each node of the flow graph to a state corresponding to a clock cycle in consideration of the ordering represented by the edges of the flow graph; obtaining a total number of states required for executing processing represented by the flow graph from a result of the state allocation; and generating an allocated resource connection graph which has nodes corresponding to the nodes of the flow graph after the allocation of the hardware resource, and signal edges corresponding to the edges of the flow graph; a sharing edge generation step of adding a sharing edge between a pair of nodes which are included in the allocated resource connection graph and to which sharable hardware resources are allocated, the sharing edge being added for controlling sharing of the nodes; a resource arrangement step of providing a provisional layout of the allocated resource connection graph having the sharing edges added thereto; and a resource sharing step of sharing nodes of the allocated resource connection graph based on a layout result obtained in the resource arrangement step.

When there are nodes allocated to different states in the state allocation result, the sharing edge generation step may add attraction force sharing edges for promoting sharing between the corresponding nodes of the allocated resource connection graph; and when there are nodes allocated to the same state in the state allocation result, the sharing edge generation step may add repulsion force sharing edges for suppressing sharing between the corresponding nodes of the allocated resource connection graph; and the resource arrangement step may arrange the nodes connected by an attraction force sharing edge close to each other, and arranges the nodes connected by a repulsion force sharing edge discretely. More preferably, the sharing edge generation step may give a weight to an edge in the allocated resource connection graph; and the resource arrangement step may obtain the layout result based on the weight given by the sharing edge generation step.

In this case, when each node of the flow graph is re-allocated to a state in the range that a total state number does not exceed a value obtained in the initial allocation scheduling step, the sharing edge generation step may set the weight given to an attraction force sharing edge added between nodes, having a higher possibility of being allocated to different states, to a value which more highly promotes sharing. The sharing edge generation step may set the weight given to a repulsion force sharing edge added between nodes, having a lower possibility of being allocated to different states, to a value which more highly suppresses sharing. Alternatively, the sharing edge generation step may set the weight given to the repulsion force sharing edge, added between the corresponding nodes of the allocated resource connection graph, to an invalid value.

When there are nodes allocated to different states in the state allocation result, the sharing edge generation step may add attraction force sharing edges for promoting sharing between the corresponding nodes of the allocated resource connection graph; and the resource arrangement step may arrange the nodes connected by the attraction force sharing edge close to each other based on the weight given in the sharing edge generation step.

The resource arrangement step may be a scheduling and resource arrangement step of re-allocating each node of the flow graph to each state in the range that a total state number does not exceed a value obtained in the initial allocation scheduling step, and of providing a provisional layout of the allocated resource connection graph having the sharing edges added thereto. More preferably, the high level synthesis method may further comprise a sharing edge re-generation step of re-adding a sharing edge to the allocated resource connection graph processed in the resource sharing step. The scheduling and resource arrangement step, the resource sharing step, and the sharing edge re-generation step may be repeated until a predetermined condition is fulfilled.

The resource sharing step may comprise a sharing target selection step of selecting a set of nodes to be shared from the allocated resource connection graph; a selected resource sharing step of sharing the nodes selected in the sharing target selection step; a sharing edge re-generation step of re-adding a sharing edge to the allocated resource connection graph processed in the selected resource sharing step; and a layout result correction step of correcting the layout result obtained in the resource arrangement step based on the allocated resource connection graph processed in the sharing edge re-generation step. The resource sharing step may be an incremental improving resource sharing step of repeating the sharing target selection step, the selected resource sharing step, the sharing edge re-generation step and the layout result correction step until a predetermined condition is fulfilled.

The resource sharing step may obtain a priority level of a pair of nodes which are included in the allocated resource connection graph and to which sharable hardware resources are allocated, and shares the nodes in a predetermined range, starting from the pair of nodes having a higher priority level. In this case, the priority level in the resource sharing step may be in inverse proportion to a distance between the nodes in the layout result obtained in the resource arrangement step. Alternatively, the sharing edge generation step may a weight to an edge in the allocated resource connection graph; and the priority level in the resource sharing step may be in proportion to a value obtained by dividing the weight given to an edge added between the nodes by the distance between the nodes in the layout result obtained in the resource arrangement step. Alternatively, the priority level in the resource sharing step may be calculated using a calculation formula including a term in proportion to the weight given to the edge added between the nodes and a term in inverse proportion to the distance between the nodes in the layout result obtained in the resource arrangement step.

When using weighted attraction force sharing edges and repulsion force sharing edges, the high level synthesis method may further comprise a layout difficulty level evaluation step of evaluating a layout difficulty level of the allocated resource connection graph having sharing edges added thereto; an attraction force sharing edge selection step of, when the layout difficulty level evaluation step determines that the layout is difficult, selecting an attraction force sharing edge having a low sharing efficiency from the allocated resource connection graph having sharing edges added thereto; and an attraction force sharing edge weight reduction step of reducing the weight of the attraction force sharing edge selected in the attraction force sharing edge selection step. When using weighted attraction force sharing edges, the high level synthesis method may further comprises an attraction force sharing edge deleting step of deleting the attraction force sharing edge selected in the attraction force sharing edge selection step, instead of the attraction force sharing edge weight reduction step.

In these cases, the layout difficulty level evaluation step may evaluate the layout difficulty level based on a sum of weights given to signal edges and attraction force sharing edges in the allocated resource connection graph having the sharing edges added thereto; a difference between a sum of weights given to signal edges and a sum of weights given to attraction force sharing edges in the allocated resource connection graph having the sharing edges added thereto; a ratio of a sum of weights given to attraction force sharing edges with respect to a sum of weights given to the signal edges and the attraction force sharing edges in the allocated resource connection graph having the sharing edges added thereto. Alternatively, the layout difficulty level evaluation step may add a node, to which a dummy hardware resource is allocated, to an attraction force sharing edge having a weight of a predetermined value or less based on the allocated resource connection graph having the sharing edges added thereto, thereby generating an allocated resource connection graph for evaluation; obtain a total number of primary adjacent nodes connected to each of all the nodes in the allocated resource connection graph for evaluation via one signal edge and obtains a total number of up-to-secondary adjacent nodes connected to each of all the nodes in the allocated resource connection graph for evaluation via two or less signal edges; and evaluate the layout difficulty level based on the difference between the logarithms of the two total numbers.

When hardware resources allocated to nodes connected to both ends of a certain attraction force sharing edge have a large difference in bit length, or when hardware resources allocated to nodes connected to both ends of a certain attraction force sharing edge have a large difference in delay time, the attraction force sharing edge selection step may select the certain attraction force sharing edge as an attraction force sharing edge having a low sharing efficiency. When one of hardware resources allocated to nodes connected to both ends of a certain attraction force sharing edge has a smaller area than the other hardware resource, and the value of the smaller area is sufficiently small, the attraction force sharing edge selection step may select the certain attraction force sharing edge as an attraction force sharing edge having a low sharing efficiency. The attraction force sharing edge selection step may select an attraction force sharing edge given a weight which suppresses sharing as an attraction force sharing edge having a low sharing efficiency. When lifetimes of output values of hardware resources allocated to nodes connected to both ends of a certain attraction force sharing edge have a certain probability of overlapping, the attraction force sharing edge selection step may select the certain attraction force sharing edge as an attraction force sharing edge having a low sharing efficiency.

The resource arrangement step may provide a provisional layout of the allocated resource connection graph having sharing edges added thereto in accordance with a layout model which allows nodes, to which sharable hardware resources are allocated, to be arranged at the same position. In this case, in the layout model in the resource arrangement step, the number of nodes which can be arranged at the same position may be limited. Alternatively, when a new node is arranged at the same position as another node already arranged, the resource arrangement step may estimate a delay time of a selection circuit provided on an input side of the hardware resource provisionally shared by the nodes arranged at the same position; and then may estimate estimates the processing time of the state to which the nodes are allocated, including the delay time of the selection circuit; and when the estimated processing time is close to the clock cycle, the resource arrangement step may move the newly arranged node to another position and prohibits arranging a node at the same position as the node already arranged in the subsequent processing. Alternatively, when providing the provisional layout of the allocated resource connection graph having the sharing edges added thereto, the resource arrangement step may use an evaluation function by which an evaluation value is decreased when the number of nodes arranged at the same position exceeds a predetermined value.

The resource arrangement step may convert a node of the allocated resource connection graph having sharing edges added thereto into a plurality of unit elements and connection elements connecting the unit elements in accordance with the hardware resource allocated to the node, and provides a provisional layout of the post-conversion allocated resource connection graph. More preferably, when the hardware resource allocated to a node of the allocated resource connection graph having sharing edges added thereto is a hard resource having a fixed shape, the resource arrangement step may provide the connection elements at high density; and when the hardware resource allocated to a node of the allocated resource connection graph having sharing edges added thereto is a soft resource having a variable shape, the resource arrangement step may provide the connection elements at low density. In this case, the resource arrangement step may provide a connection element having a large weight to a hardware resource as the hard resource; may provide a connection element having a small weight to a hardware resource as the soft resource; and may provide a provisional layout of the post-conversion allocated resource connection graph based on the weight given to each connection element. Alternatively, the hardware resource as the hard resource may be provided with connection elements for connecting all the unit elements which are adjacent to each other in up, down, right and left directions; and the hardware resource as the soft resource may be provided with one connection element for connecting all the unit elements, a connection element to be connected with one or more but three or less unit elements, among the unit elements which are adjacent to each other in up, down, right and left directions, with a connection element for connecting a central unit element and each of the other unit elements, or a connection element in a style in accordance with an architecture of the hardware resource.

The flow graph generation step may generate a control/data flow graph including a data flow graph representing calculations and a data flow included in the functional description and a control flow graph representing execution control of the calculations included in the functional description.

A high level synthesis method according to the present invention executes processing for adding a sharing edge for controlling the sharing of the nodes between sharable nodes, processing of providing a provisional layout of the allocated resource connection graph having the sharing edges added thereto, and processing of sharing the nodes based on the layout result. By using sharing edges in this manner, sharable nodes can be arranged close to each other in the layout result, or the allocated resources arranged close to each other can be shared. Accordingly, the nodes can be shared efficiently without the number of the clock cycles required for the processing exceeding the initially obtained value. Thus, a small scale circuit can be provided.

These and other objects, features, aspects and advantages of the present invention will become more apparent from the following detailed description of the present invention when taken in conjunction with the accompanying drawings.

BRIEF DESCRIPTION OF THE DRAWINGS

FIG. 2 shows an example of a CDFG;

FIG. 5 shows types of sharing edges added to the allocated resource connection graph shown in FIG. 4 in the sharing edge generation step shown in FIG. 1;

FIG. 10 shows weights of the sharing edges to be added to the allocated resource connection graph shown in FIG. 4;

FIG. 17A through FIG. 17C show models of a soft resource in a layout model used in the scheduling and resource arrangement step shown in FIG. 1;

FIG. 24 shows a usable schedule of processing node corresponding to an allocated resource $R_{+1/5}$ shown in FIG. 23;

FIG. 25 shows a usable schedule of processing node corresponding to allocated resource $R_{+2}$ shown in FIG. 23, FIG. 26A through FIG. 26C show usable schedules of processing node corresponding to an allocated resource $R_{+3}$ shown in FIG. 23;

FIG. 31 shows weights of sharing edges added to the allocated resource connection graph shown in FIG. 23 in the sharing edge generation step shown in FIG. 22;

FIG. 33 shows an allocation schedule including chained processing nodes corresponding to a CDFG and schedule changeable ranges;

FIG. 37 shows an arrangement result illustrating primary adjacent nodes and up-to-secondary adjacent nodes;

FIG. 38 shows a result of adding dummy nodes to the arrangement result shown in FIG. 37;

DESCRIPTION OF THE PREFERRED EMBODIMENTS

First Embodiment

Figure 1:
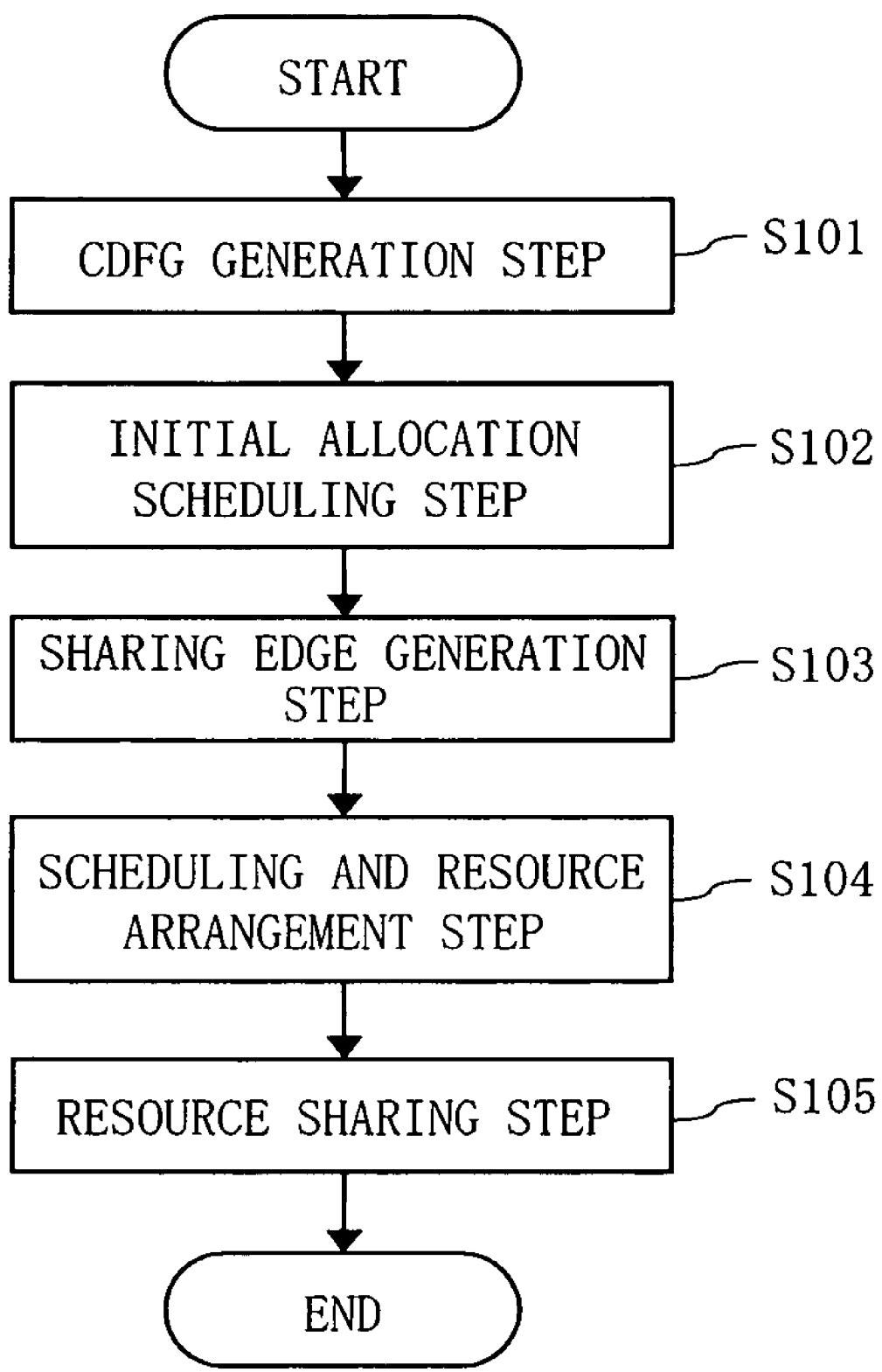
FIG. 1 is a flowchart showing a high level synthesis method according to a first embodiment of the present invention.
Figure 44:
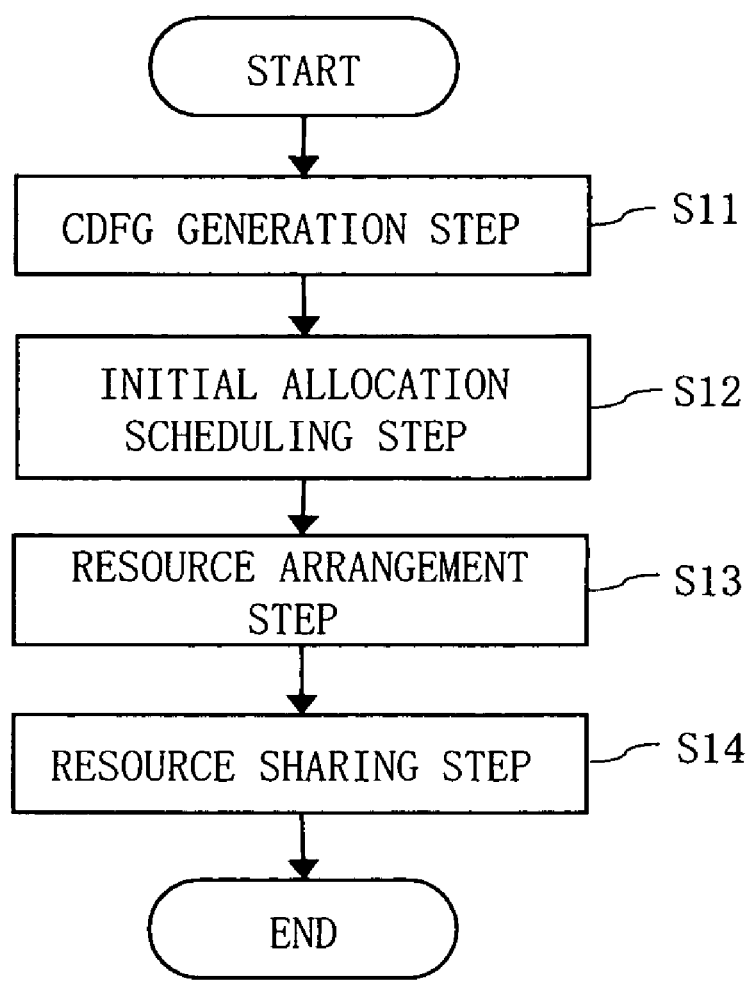
FIG. 44 is a flowchart showing a conventional high level synthesis method.

FIG. 1 is a flowchart showing a layout-based high level synthesis method according to a first embodiment of the present invention. According to the high level synthesis method shown in FIG. 1, a CDFG generation step, an initial allocation scheduling step, a sharing edge generation step, a scheduling and resource arrangement step, and a resource sharing step are performed for operation description data describing the operation specifications of a semiconductor integrated circuit to be designed (hereinafter, referred to as a "design target circuit"). Among these steps, the CDFG generation step and the initial allocation scheduling step are the same as those included in the conventional high level synthesis method (FIG. 44).

In the CDFG generation step (step S101), a CDFG (Control Data Flow Graph) including a CFG (Control Flow Graph) and a DFG (Data Flow Graph) is generated based on input operation description data. In more detail, the operation description data is described using, for example, a programming language such as C or C++. In the CDFG generation step, a flow of each signal (data signal and control signal) included in the operation description data is analyzed, and thus a DFG representing a flow of calculations and data and a CFG representing the execution control of calculations are generated. The DFG and CFG thus generated are collectively referred to as a CDFG. Each node of the CDFG (hereinafter, referred to as a "processing node") represents the content of a calculation which is executable by one calculator. In the CDFG, variables for temporarily storing signal values are also represented with processing nodes.

In the initial allocation scheduling step (step S102), an allocation schedule and an allocated resource connection graph are generated based on the CDFG generated in the CDFG generation step. In more detail, prior to the initial allocation scheduling step, a hardware resource library including properties (for example, functions and delay time) of a calculator (for example, an adder, a multiplier, etc.; hereinafter, referred to as a hardware resource) usable in the design target circuit is prepared. In the initial allocation scheduling step, hardware resources, which can perform a calculation executed at each of the processing nodes in the CDFG and which fulfill the design specifications including the operating frequency and the like, are selected from the hardware resource library, and a reallocated to the corresponding processing nodes. The hardware resource allocated to the processing node is referred to as an "allocated resource".

Next, each processing node of the CDFG having a hardware resource allocated thereto is allocated to a state corresponding to a clock cycle (hereinafter, referred to a "state"), such that the calculation performed at each processing node is performed at a clock cycle. Allocating the processing nodes to the states is referred to "scheduling", the state having a processing node allocated thereto is referred to as an "allocated state", and an allocation result of the processing nodes to the states is referred to as an "allocation schedule". In an allocation schedule determined in the initial allocation scheduling step (hereinafter, referred to as an "initial allocation schedule"), an allocated state is provisionally determined for each processing node.

In the initial allocation scheduling step, a total number of states which is required to execute the processing which is represented by the CDFG is obtained from the initial allocation schedule (the total number of states will be referred to as a "total execution state number"). In addition, an allocated resource connection graph is generated in which nodes each represent an allocated resource corresponding to the processing node of the CDFG, and edges each represent an edge of the CDFG.

In the sharing edge generation step (step S103), to the allocated resource connection graph generated in the initial allocation scheduling step, a new edge (hereinafter, referred to as a "sharing edge") is added between sharable allocated resources. Sharable allocated resources are allocated resources which can perform the same function (i.e., which have the same function). For example, if the allocated resource connection graph includes nodes to which exactly the same hardware resources are allocated, these allocated resources are sharable. In this case, these allocated resources may be considered to be sharable even if the hardware resources have different bit lengths, or alternatively these allocated resources may be considered to be unsharable if the bit lengths are different to a certain degree.

Next, in the scheduling and resource arrangement step (step S104), the allocated state of each processing node is determined using the initial allocation schedule as an initial solution. Also, a rough arrangement of the allocated resources included in the allocated resource connection graph which has sharing edges added thereto in the sharing edge generation step is determined.

Finally, in the resource sharing step (step S105), sharable allocated resources are shared in accordance with the arranged positions of the allocated resources which are determined in the scheduling and resource arrangement step. Here, the allocated resources, which are determined to be arranged close to each other in the layout result, are shared. Thus, the final number of hardware resources and the rough arrangement of the hardware resources are determined.

According to the conventional high level synthesis method (FIG. 44), the resource arrangement step and the resource sharing step are performed on the allocated resource connection graph generated in the initial allocation scheduling step, which has no sharing edge added thereto. As can be appreciated from this, according to the conventional high level synthesis method, the allocated resources are provisionally arranged and the allocated resources which are arranged close to each other by chance in the obtained layout result are shared, without any consideration of whether each allocated resource is sharable or not.

By contrast, according to the high level synthesis method according to this embodiment (FIG. 1), the scheduling and resource arrangement step and the resource sharing step are performed on the allocated resource connection graph having sharing edges added thereto which is generated in the sharing edge generation step. In this manner, in the high level synthesis method according to this embodiment, the allocated resources are provisionally arranged in consideration of whether each allocated resource is sharable or not. Therefore, by arranging the sharable allocated resources close to each other at the stage of arrangement, occurrence of clock timing errors and the like can be prevented when the allocated resources are shared later.

Hereinafter, exemplary processing performed by the high level synthesis method according to this embodiment will be described when equations (1a) and (1b) are input as operation description data. In the following description, equations (1a) and (1b) are referred to as "operation description BD".

$$y = f + g \tag{1a}$$

$$x = ((a+b+c)+(d+e) \times y) + (h+i) \tag{1b}$$

First, in the CDFG generation step (step S101), lexical analysis, syntactic analysis, and semantic analysis are performed on the input operation description BD in this order. As shown in FIG. 2, a CDFG including a CFG and a DFG is generated. In the CDFG, variables and calculations are represented by nodes, and the flow of data is represented by edges. In FIG. 2, the contents of the CFG are omitted. In general, the operation description data of a design target circuit can be converted into a CDFG including a CFG and a DFG.

Next, in the initial allocation scheduling step (step S102), the following processing is performed, referring to the hardware resource library describing functions and properties such as delay time of hardware resources which can be used in the design target circuit, and also referring to a design restriction file describing design restriction conditions for the design target circuit (for example, the operating frequency and the like).

First, at a first stage, the result (initial allocation schedule) provided by provisionally allocating separate hardware resources to each processing nodes of the CDFG, and allocating each processing node having a hardware resource allocated thereto to a state is obtained. In the initial allocation schedule, the order of execution of the processing nodes is provisionally determined. Referring to the initial allocation schedule, the total execution state number which is required for executing the processing represented by the input operation description data is determined.

Figure 3:
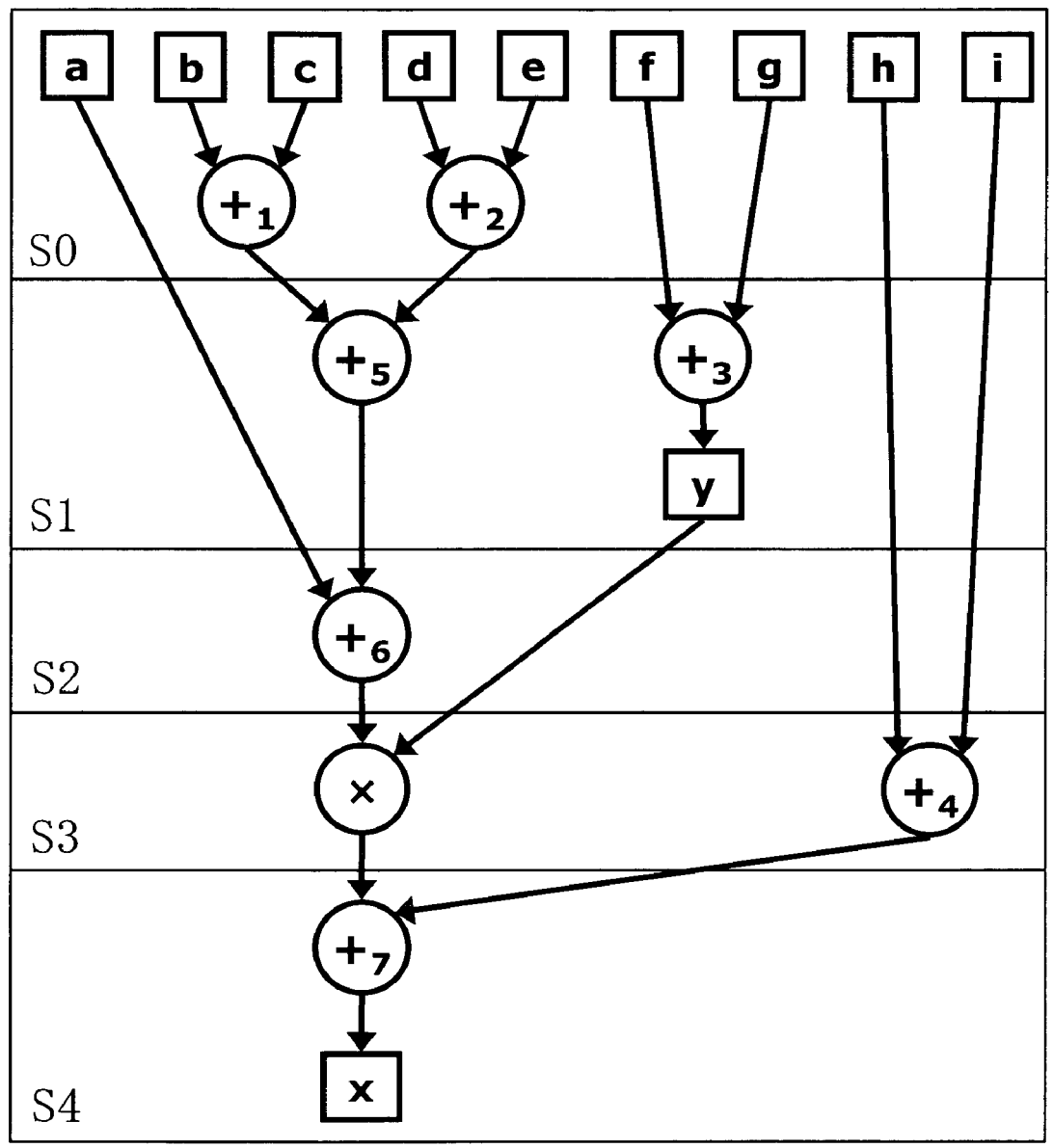
FIG. 3 shows an initial allocation schedule, corresponding to the CDFG shown in FIG. 2, generated in the initial allocation scheduling step shown in FIG. 1.

FIG. 3 shows an initial allocation schedule obtained from the CDFG shown in FIG. 2. In FIG. 3, inputs a through i are allocated to state S0, eight processing nodes each having hardware resource allocated thereto are allocated to states S0 through S4, and outputs x and y are allocated to states S4 and S1, respectively. In this initial allocation schedule, the total execution state number is five. In FIG. 3, the processing nodes for executing the same calculation are provided with numbers such as 1, 2, and 3 as subscripts. Hereinafter, regarding allocation schedules, a processing node provided with label L is represented as $N_L$.

Next, at a second stage, an allocated resource connection graph corresponding to the CDFG after the hardware resources are allocated is generated. The allocated resource connection graph has nodes corresponding to the processing nodes of the CDFG having hardware resources allocated thereto and edges corresponding to the edges of the CDFG.

Figure 4:
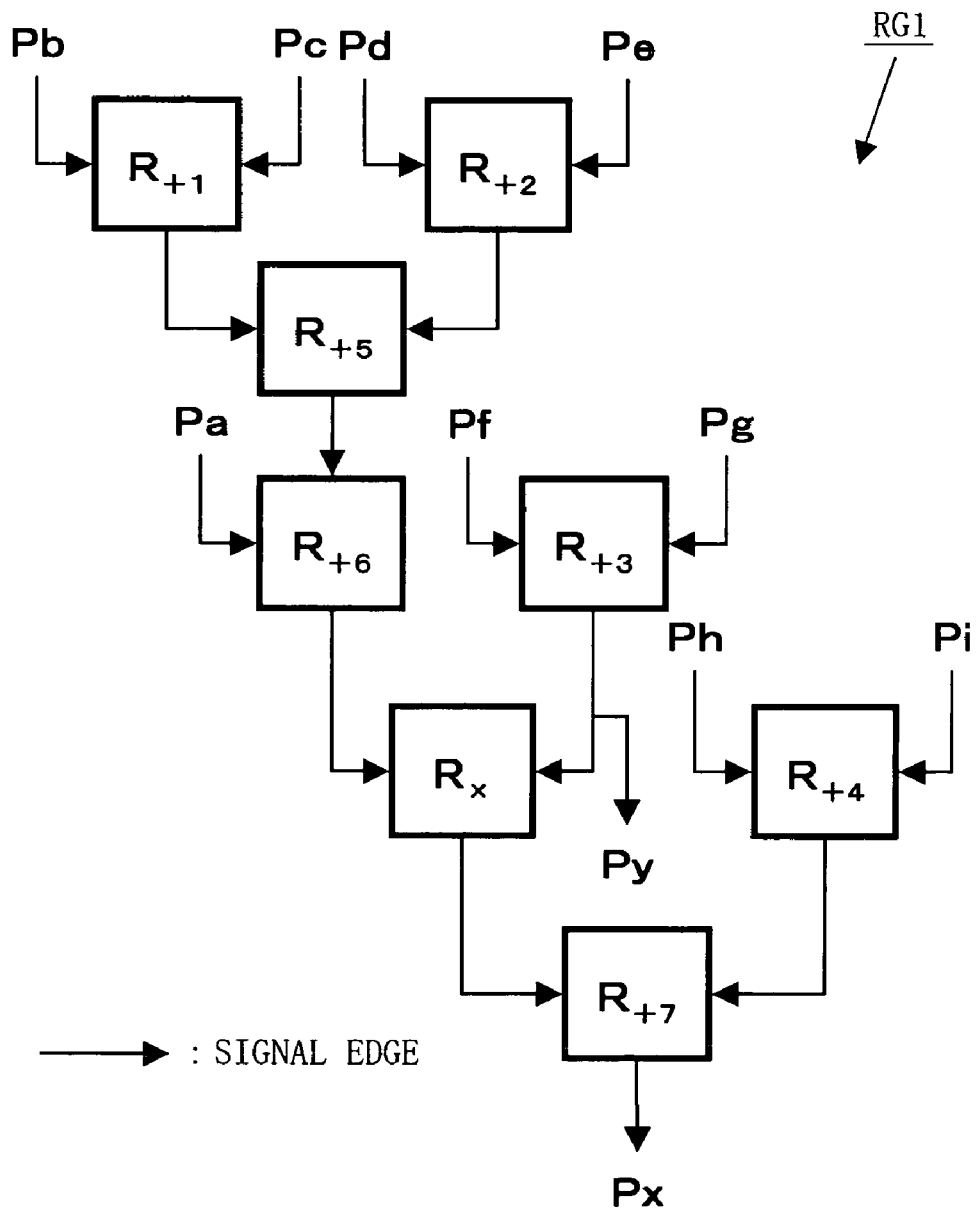
FIG. 4 shows an allocated resource connection graph, corresponding to the CDFG shown in FIG. 2, generated in the initial allocation scheduling step shown in FIG. 1.

FIG. 4 shows an allocated resource connection graph RG1 corresponding to the CDFG after the hardware resources are allocated in FIG. 3. Allocated resources $R_{+1}$ through $R_{+7}$, $R_x$ represented as nodes in FIG. 4 respectively correspond to processing nodes $N_{+1}$ through $N_{+7}$, $N_x$ shown in FIG. 3. In the allocated resource connection graph RG1, the processing nodes for storing variables are converted into signal edges for transmitting signals, and signal edges converted from primary input/output variables are connected to input/output pins of the allocated resources. In the operation description BD, all the variables are primary inputs/outputs. Therefore, the signal edges converted from these variables are all connected to the input/output pins of the allocated resources.

When the initial allocation scheduling step is completed, the number of states required for executing the processing represented by the operation description data (total execution state number) is determined, but the processing nodes of the CDFG having the hardware resources allocated thereto are merely provisionally allocated to the states. The allocated state of each processing node is determined in the scheduling and resource arrangement step performed later.

In the sharing edge generation step (step S103), sharing edges for controlling the sharing of the allocated resources are added between the nodes in the allocated resource connection graph, referring to the initial allocation schedule. In this embodiment, a sharing edge is added between all the sharable nodes which are not directly connected to each other via one signal edge. The added sharing edges are given the following properties.

In the case where the CDFG includes two critical paths and two processing nodes having hardware resources having the same function allocated thereto are present in the same state on each critical path, a sharing edge having the property for "not arranging close to each other" is added between nodes in the allocated resource connection graph corresponding to the processing nodes. By this, these two allocated resources are arranged discretely when the allocated resources are provisionally arranged later. Therefore, these two allocated resources can be prevented from being shared as the "allocated resources having the same function and arranged close to each other" when the allocation resources are shared later.

In the case where the CDFG includes two critical paths and two processing nodes having hardware resources having the same function allocated thereto are present in different states on each critical path, a sharing edge having the property for "arranging close to each other" is added between nodes in the allocated resource connection graph corresponding to the processing nodes. By this, these two allocated resources are arranged close to each other when the allocated resources are provisionally arranged later. Therefore, these two allocated resources are shared as the "allocated resources having the same function and arranged close to each other" when the allocation resources are shared later.

In the other cases where there are two processing nodes having the same function, a sharing edge having the property for "permitting to arrange close to each other" is added between nodes in the allocated resource connection graph corresponding to the processing nodes. By setting the property of a sharing edge in this manner, the allocated resources are controlled to be arranged close to each other or discretely in the layout result. Thus, the allocated resources can be controlled to be shared or not to be shared.

Figure 6:
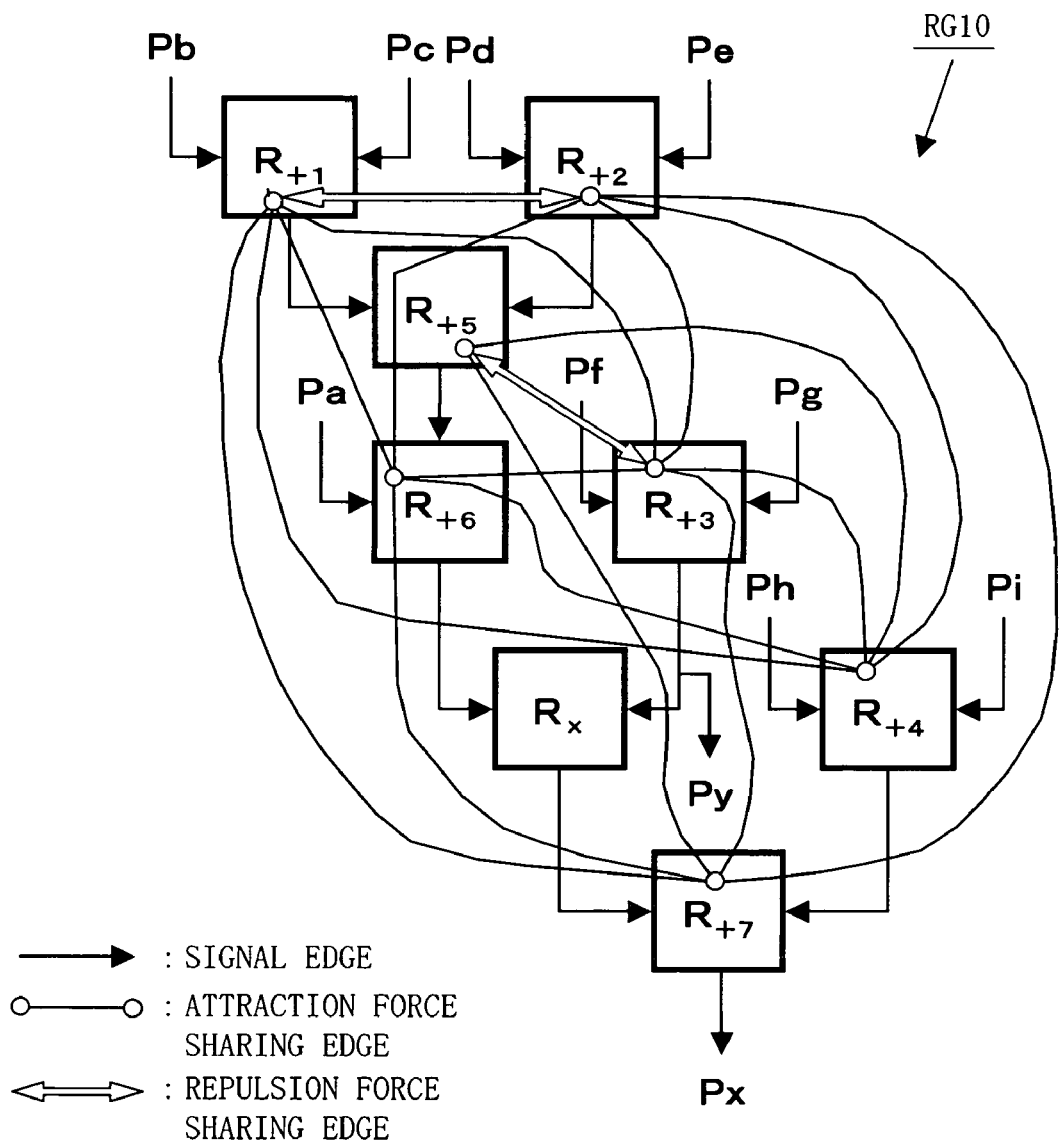
FIG. 6 shows the allocated resource connection graph shown in FIG. 4 which has the sharing edges of the types shown in FIG. 5.

FIG. 5 shows types of sharing edges which are to be added to the allocated resource connection graph RG1 shown in FIG. 4, referring to the initial allocation schedule shown in FIG. 3. FIG. 6 shows an allocated resource connection graph RG10 which is obtained by adding the sharing edges of the types shown in FIG. 5 to the allocated resource connection graph RG1 shown in FIG. 4. In the sharing edge generation step, a sharing edge is added between two allocated resources having the same function, but is not added between allocated resources which are directly connected to each other via one signal edge.

In the scheduling and resource arrangement step (step S104), based on the initial allocation schedule shown in FIG. 3 and the allocated resource connection graph RG10 shown in FIG. 6, the allocated state of each processing node of the CDFG and a rough arrangement of the allocated resources are determined. Then, in the resource sharing step (step S105), in the case where the distance between two allocated resources in the layout result obtained in the scheduling and resource arrangement step is equal to or less than a predetermined value, these allocated resources are shared.

By generating sharing edges having a preferable property in the sharing edge generation step, the allocated resources can be controlled to be shared or not to be shared, such that the total execution state number does not exceed the value obtained in the initial allocation scheduling step.

In the resource sharing step, even if the distance of two allocated resources is equal to or less than the predetermined value, these allocated resources may not be shared in the case where these allocated resources correspond to two processing nodes allocated to the same state. By this setting, more secure control can be performed such that the total execution state number does not exceed the value obtained in the initial allocation scheduling step.

An effect of the high level synthesis method according to this embodiment will be described with reference to the initial allocation schedule shown in FIG. 3 as an example. In this allocation schedule, a route from the input b or c to the output y via five nodes $N_{+1}$, $N_{+5}$, $N_{+6}$, $N_x$ and $N_{+7}$, and a route from the input d or e to the output y via five nodes $N_{+2}$, $N_{+5}$, $N_{+6}$, $N_x$ and $N_{+7}$, are critical paths.

Figure 7:
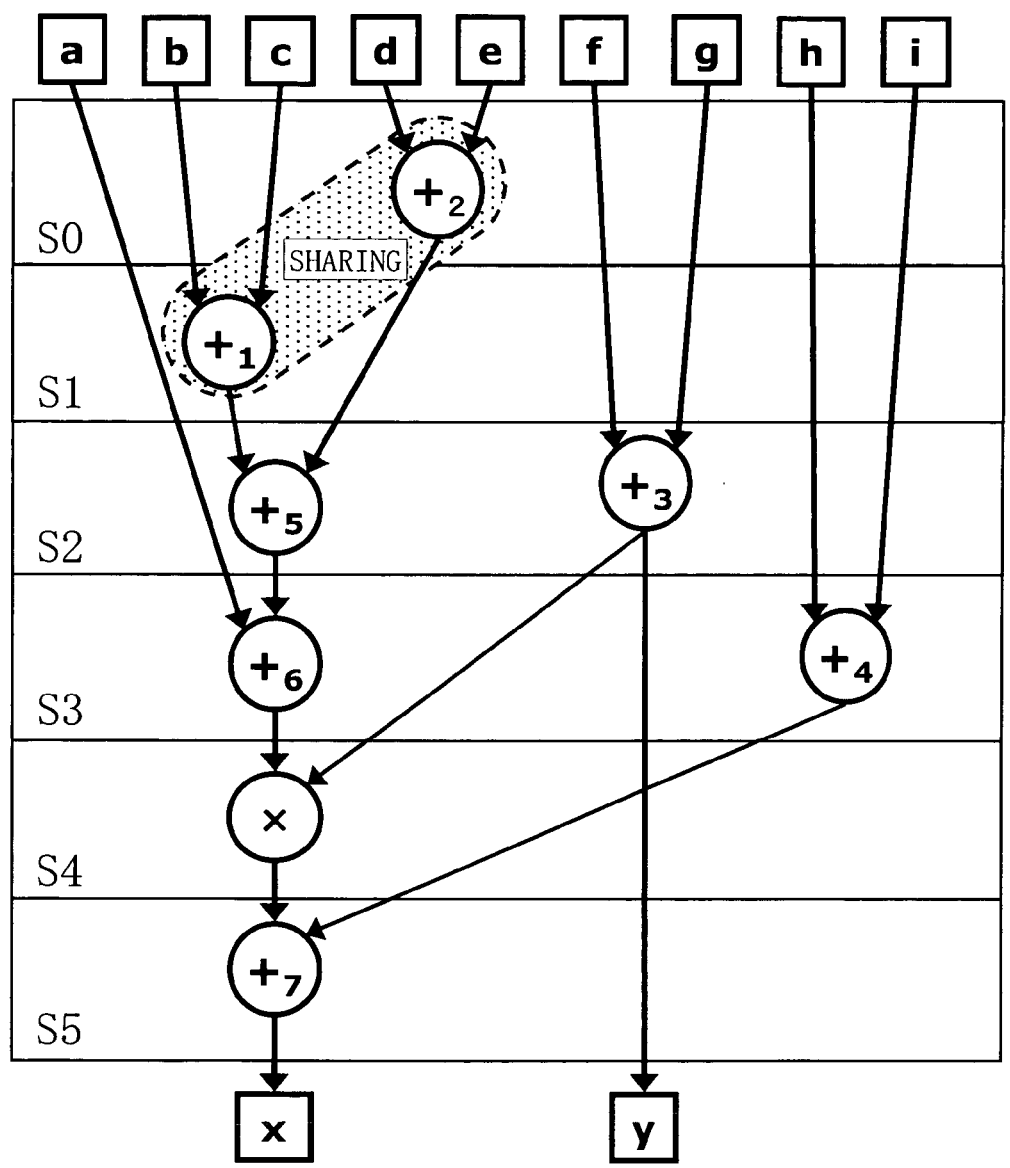
FIG. 7 shows an allocated resource connection graph in which the total execution state number is increased by the resource sharing performed by a conventional high level synthesis method.

When the conventional high level synthesis method (FIG. 44) which does not use sharing edges is applied to the initial allocation schedule shown in FIG. 3, the allocated resource $R_{+1}$ (the allocated resource corresponding to $N_{+1}$) and $R_{+2}$ (the allocated resource corresponding to $N_{+2}$) may be arranged close to each other by chance in the layout result. However, sharing the allocated resources $R_{+1}$ and $R_{+2}$ contradicts with the initial allocation schedule (FIG. 3) by which the processing nodes $N_{+1}$ and $N_{+2}$ are processed in the same state. This requires the initial allocation schedule to be changed to, for example, a new allocation schedule as shown in FIG. 7. In the allocation schedule in FIG. 7, the processing nodes $N_{+1}$ and $N_{+2}$ are allocated to different states S0 and S1, respectively. As can be appreciated from this, according to the conventional high level synthesis method, the total execution state number may exceed the value obtained in the initial allocation scheduling step.

By contrast, according to the high level synthesis method of this embodiment, an allocated resource connection graph having sharing edges added thereto is used. Accordingly, when, for example, the processing nodes $N_{+2}$ and $N_{+3}$ are present on a route other than the critical paths of the CDFG, a sharing edge acting as an attraction force (hereinafter, referred to as an "attraction force sharing edge") is added between the allocated resources $R_{+2}$ and $R_{+3}$ (the allocated resource corresponding to $N_{+3}$). When the processing nodes $N_{+1}$ and $N_{+2}$ are present on a critical path of the CDFG, a sharing edge acting as a repulsion force (hereinafter, referred to as a "repulsion force sharing edge") is added between the allocated resources $R_{+1}$ and $R_{+2}$. By this, the allocated resources $R_{+2}$ and $R_{+3}$ can be arranged close to each other while the allocated resources $R_{+1}$ and $R_{+2}$ can be arranged discretely. Thus, according to the high level synthesis method of this embodiment, by preferably controlling the result of sharing the allocated resources, the total execution state number is controlled not to exceed the value obtained in the initial allocation scheduling step.

Hereinafter, the sharing edge generation step (step S103) and the scheduling and resource arrangement step (step S104) of the high level synthesis method according to this embodiment will be described in detail. First, the details of the sharing edge generation step will be described.

A sharing edge which is generated in the sharing edge generation step has two types of properties of an attraction force and a repulsion force, and may also have a weight representing the strength of the attraction force and the repulsion force. In this case, the result of sharing the allocated resources can be controlled with higher precision. For example, in order to promote the sharing of the allocated resources strongly, a large weight can be set on a sharing edge added between the seal located resources. In order to promote the sharing of the allocated resources weakly, a small weight can be set on a sharing edge added between these allocated resources.

In the sharing edge generation step, the weight may be set in each sharing edge manually, or automatically in accordance with a predetermined processing procedure. Hereinafter, an exemplary method of automatically calculating the weight which is to be set on a sharing edge will be described. By this method, a range in which the states can be changed such that the total execution state number does not exceed the initially obtained value (hereinafter, referred to as a "schedule changeable range") is obtained for each processing node, based on the initial allocation schedule, and the weight set on the sharing edge is calculated based on the obtained range.

Figure 8:
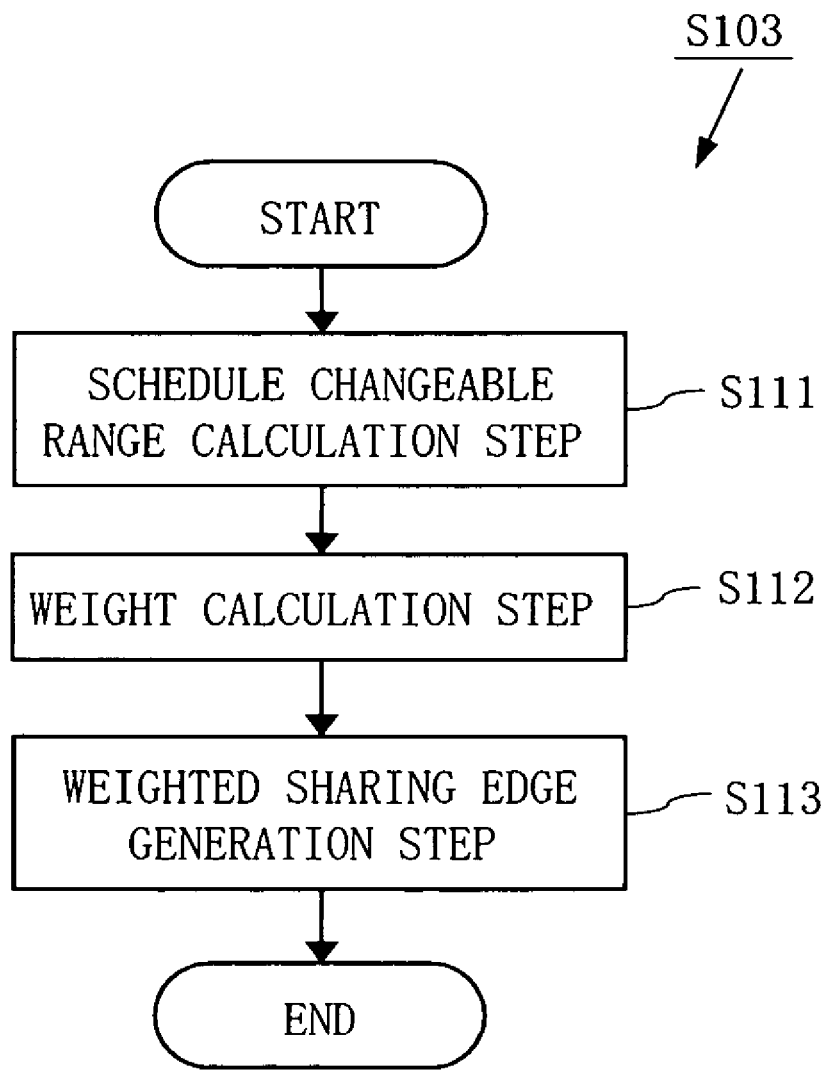
FIG. 8 is a flowchart showing the details of the sharing edge generation step shown in FIG. 1.

FIG. 8 is a flowchart showing the details of the sharing edge generation step when a weighted sharing edge is generated. In the sharing edge generation step shown in FIG. 8, a schedule changeable range calculation step, a weight calculation step, and a weighted sharing edge generation step are performed, referring to the initial allocation schedule.

In the schedule changeable range calculation step (step S111), a schedule changeable range is calculated for each processing node included in the initial allocation schedule. Next, in the weight calculation step (step S112), a weight to be given to the sharing edge which is to be added between two nodes of the allocated resource connection graph is calculated, based on the calculated schedule changeable range. Then, in the weighted sharing edge generation step (step S113), a sharing edge having the calculated weight is generated and added between the nodes of the allocated resource connection graph.

Hereinafter, a case of calculating the weight to be set on a sharing edge which is added to the allocated resource connection graph RG1 shown in FIG. 4 will be described, referring to the initial allocation schedule shown in FIG. 3. In the schedule changeable range calculation step (step S111), for each processing node, the earliest allocated state having the processing node allocated thereto and the latest allocated state having the processing node allocated thereto are obtained, within the range that the total execution state number does not exceed the initially obtained value. The range from the earliest allocated state to the latest allocated state is the schedule changeable range for the corresponding processing node. The details of a method for obtaining the schedule changeable range is described in, for example, Pierre G. Paulin and one other, "Force-Directed Scheduling for the Behavioral Synthesis of ASIC's", IEEE Transactions on Computer-Aided Design, Vol. 8, No. 6, June 1989.

Figure 9:
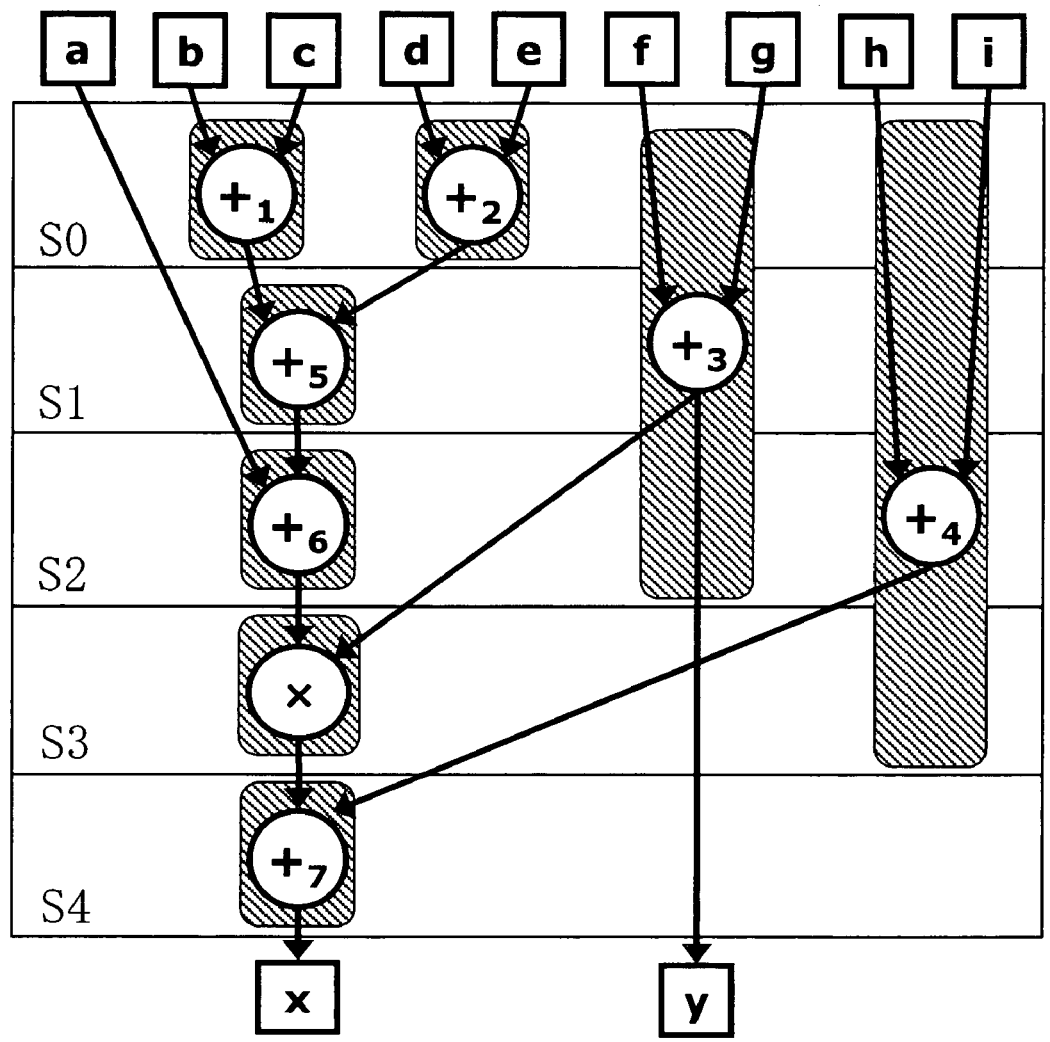
FIG. 9 shows schedule changeable ranges for the initial allocation schedule shown in FIG. 3.

FIG. 9 shows schedule changeable ranges obtained for the initial allocation schedule shown in FIG. 3. As shown in FIG. 9, the processing node $N_{+3}$ has a schedule changeable range including three states (states S0 through S2), and the processing node $N_{+4}$ has a schedule changeable range including four states (states S0 through S3). The other processing nodes are on the critical paths of the CDFG and each have a schedule changeable range including one state.

In the weight calculation step (step S112), a weight of an attraction force sharing edge which is added between the allocated resources having the same function is calculated, based on the schedule changeable range of each processing node. For example, weight $Wa_{ij}$ of an attraction force sharing edge is calculated using equation (2).

$$Wa_{ij} = \frac{\sum_{l=S_i}^{E_i} \sum_{m=S_j}^{E_j} \{(1 - \delta_{lm})\}}{M_i \times M_j} \quad (2)$$

In equation (2), $\delta_{lm}$ represents the Kronecker delta. Where the schedule changeable ranges of the i'th and j'th processing nodes are $SR_i$ and $SR_j$, $S_i$ and $S_j$ represent the starting states of $SR_i$ and $SR_j$, $E_i$ and $E_j$ represent the termination states of $SR_i$ and $SR_j$, $M_i$ and $M_j$ represent the numbers of states included in $SR_i$ and $SR_j$, and variables 1 and m represent values in $SR_i$ and $SR_j$. When the i'th and j'th processing nodes are sharable and allocated to the same state (i.e., 1=m), $\delta_{lm}$=1. Accordingly, as the possibility of two allocated resources being allocated to the same state is lower, the value $Wa_{ij}$ obtained by equation (2) is larger.

FIG. 10 shows the results of calculation of weight $Wa_{ij}$ which is to be given to attraction force sharing edges. The calculation is executed using equation (2) based on the schedule changeable range shown in FIG. 9. When a sharing edge added between two allocated nodes is a repulsion force sharing edge, a weight $Wr_{ij}$ is given to such a sharing edge. The weight $Wr_{ij}$ is obtained by subtracting 1 from the weight given to the attraction force sharing edge, i.e., by using equation (3).

$$Wr_{ij} = Wa_{ij} - 1 \quad (3)$$

Figure 11:
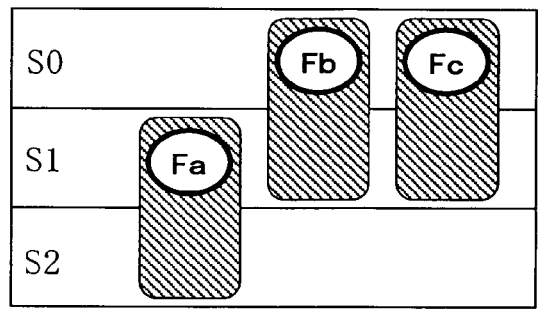
FIG. 11 shows schedule changeable ranges of three processing nodes.
Figure 12A:
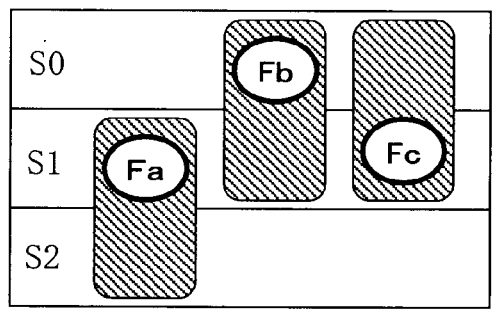
FIG. 12A through FIG. 12D show schedules usable when the processing nodes Fb and Fc shown in FIG. 11 are shared.
Figure 12B:
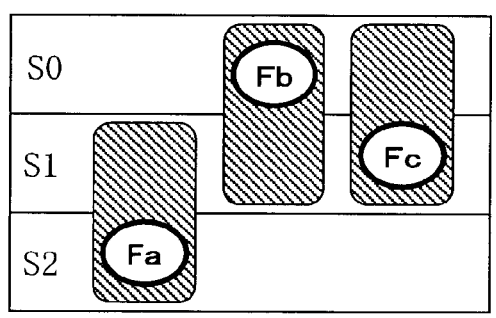
Figure 12C:
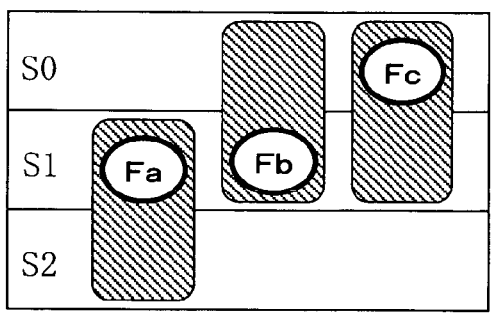
Figure 12D:
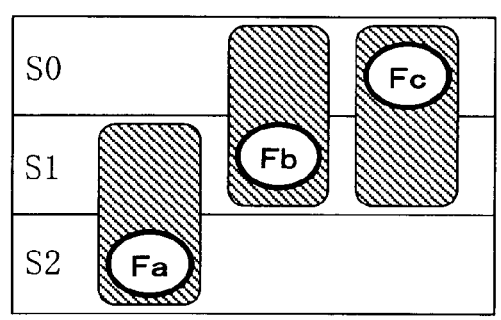
Figure 13A:
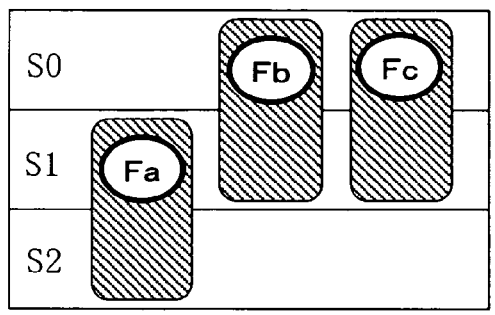
FIG. 13A through FIG. 13F show schedules usable when the processing nodes Fa and Fb shown in FIG. 11 are shared.
Figure 13B:
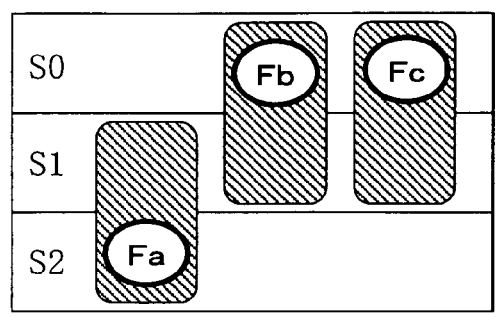
Figure 13C:
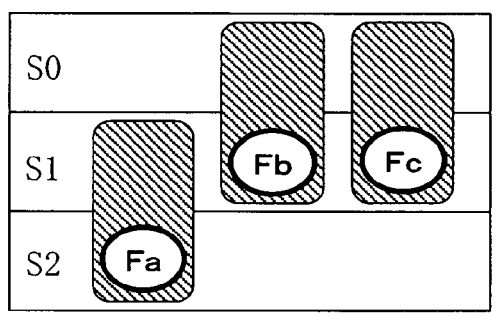
Figure 13D:
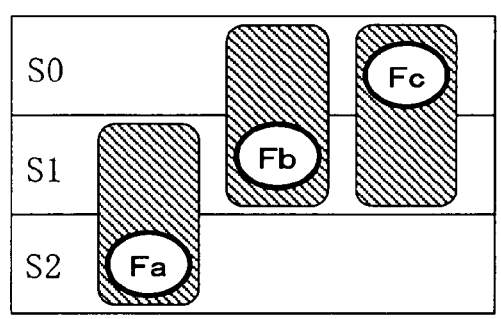
Figure 13E:
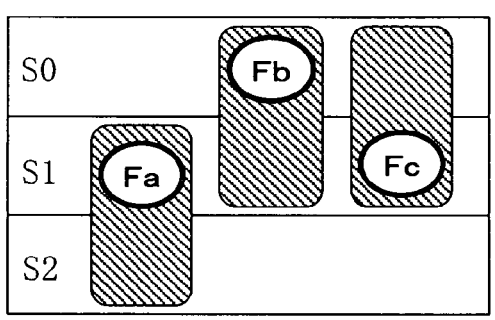
Figure 13F:
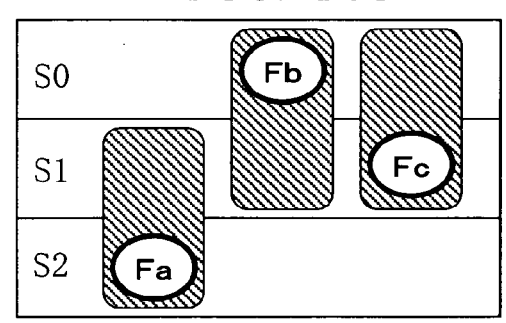
Figure 14A:
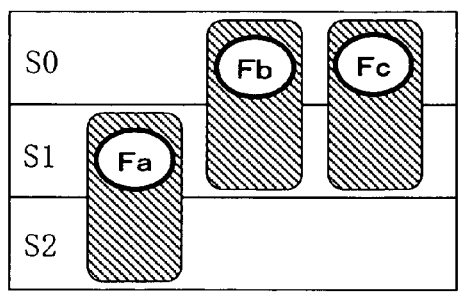
FIG. 14A through FIG. 14F show schedules usable when the processing nodes Fa and Fc shown in FIG. 11 are shared.
Figure 14B:
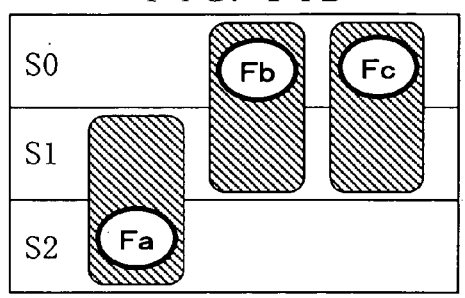
Figure 14C:
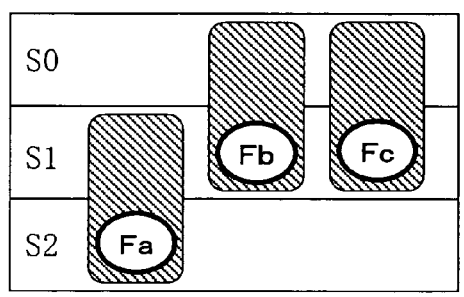
Figure 14D:
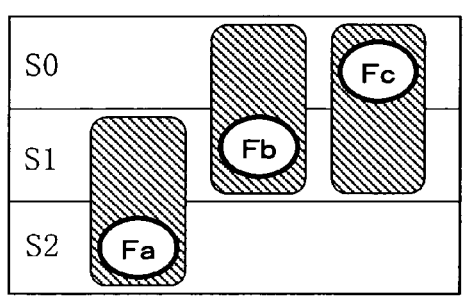
Figure 14E:
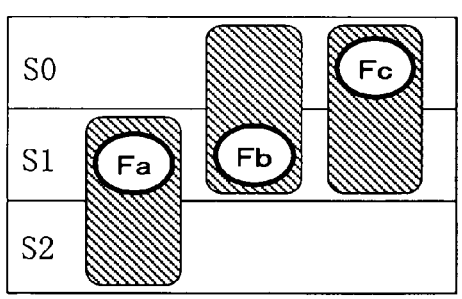
Figure 14F:
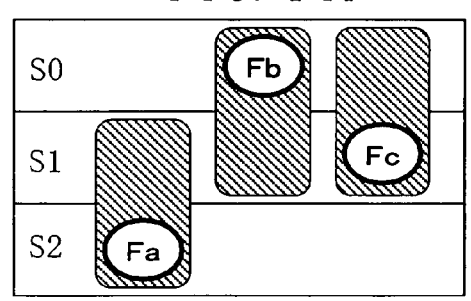

Now, with reference to FIG. 11 through FIG. 14F, the effectiveness of the method of calculating the weight of a sharing edge using equation (2) will be described. FIG. 11 shows schedule changeable ranges of three sharable processing nodes Fa through Fc. As a result of calculating a weight of a sharing edge to be added between the processing nodes Fa and Fb using equation (2), the value ¾ is obtained. A weight of a sharing edge to be added between processing nodes Fa and Fc is ¾, and a weight of a sharing edge to be added between the processing nodes Fb and Fc is ½. When the processing nodes Fa through Fc are not shared, these three processing nodes can be allocated to states in eight ways ($2^3$).

Among these eight ways, the processing nodes Fb and Fc can be shared in four ways (FIG. 12A through FIG. 12D). Weight $Wa_{ij}$ of a sharing edge added between the processing nodes Fb and Fc is ½. The processing nodes Fa and Fb can be shared in six ways (FIG. 13A through FIG. 13F). Weight $Wa_{ij}$ of a sharing edge added between the processing nodes Fa and Fb is ¾. The processing nodes Fa and Fc can be shared in six ways (FIG. 14A through FIG. 14F). Weight $Wa_{ij}$ of a sharing edge added between the processing nodes Fa and Fc is ¾. From this, it is understood that weight $Wa_{ij}$ calculated using equation (2) represents the possibility that the total execution state number does not exceed the initially obtained value when the allocated resources are shared. Accordingly, even when allocated resources connected by a sharing edge given a large weight are shared, the possibility that the total execution state number exceeds the initially obtained value is low. Thus, these allocated resources can be arranged close to each other so as to be easily shared. By contrast, when allocated resources connected by a sharing edge given a small weight are shared, the possibility that the total execution state number exceeds the initially obtained value is high. Thus, these allocated resources do not need to be positively arranged close to each other.

By calculating the weight of a sharing edge added between processing nodes based on the schedule changeable range of each processing node as described above, an effective weight of a sharing edge can be obtained for promoting the sharing of allocated resources such that the total execution state number does not exceed the value obtained in the initial allocation scheduling step.

Next, the details of the scheduling and resource arrangement step (step S104) will be described. As mentioned above, in the scheduling and resource arrangement step, the allocated state of each processing node is determined using the initial allocation schedule as the initial solution. Also, a rough arrangement of the allocated resources included in the allocated resource connection graph having sharing edges added thereto in the sharing edge generation step is determined.

In the scheduling and resource arrangement step, a layout result, by which the cost is minimum when the allocated resource connection graph having the sharing edges added thereto is arranged in accordance with a certain layout model, is obtained. Here, the allocated resources included in the allocated resource connection graph are used as elements to be arranged, and the cost is calculated based on the weight and length of the edges added between allocated resources (signal edges or sharing edges). Here, the number of sharable allocated resources which can be arranged at the same position is not limited. The cost when the allocated resource connection graph is arranged is given by, for example, equation (4). The result of arrangement of the allocated resources by which the cost COST by equation (4) is minimum is obtained.

$$COST = \sum_{i=1}^{R_n} \sum_{j=1}^{R_n} (WM_{ij} \times L_{ij}) \quad (4)$$

In equation (4), $R_n$ represents the total number of allocated resources, $L_{ij}$ represents the distance between the i'th and j'th allocated resources in the layout result, and $WM_{ij}$ represents the weight of a connection edge between the i'th and j'th allocated resources. Weight $WM_{ij}$ of a connection edge is defined for each type of edge (signal edge, attraction force sharing edge, repulsion force sharing edge). For example, when the connection edge is a signal edge, weight $WM_{ij}$ is set to 1; when the connection edge is an attraction force sharing edge, weight $WM_{ij}$ is set to $Wa_{ij}$ obtained by equation (2); and when the connection edge is a repulsion force sharing edge, weight $WM_{ij}$ is set to $Wr_{ij}$ obtained by equation (3). When there is no edge between the i'th and j'th allocated resources (for example, when allocated resources having different functions are not directly connected via a signal edge), weight $WM_{ij}$ of the connection edge is set to 0.

In the scheduling and resource arrangement step, the allocated state of each processing node is changed within the schedule changeable range, in order to obtain the arrangement by which the cost calculated using equation (4) is minimum. In the example shown in FIG. 9, the processing node $N_{+3}$ has a schedule changeable range including three states S0 through S2 and the processing node $N_{+4}$ has a schedule changeable range including three states S0 through S3. When the initial allocation schedule includes a processing node having a schedule changeable range including a plurality of states, the allocated state of such a processing node is changed at a predetermined frequency, and the cost of arrangement performed based on the post-change allocation schedule is calculated. When the allocated state of a processing node is changed, there is a possibility that a repulsion force sharing edge is added between allocated resources which had an attraction force sharing edge or vice versa. In such a case, after weight $WM_{ij}$ of the connection edge is changed, the cost is calculated using equation (4).

More specifically, in the scheduling and resource arrangement step, the allocated resources are first arranged randomly. The cost of the initial arrangement is calculated using equation (4). Then, the processing of changing the arranged positions of the allocated resources (MOVE processing) and the processing of changing the allocated states of the processing nodes (RESCH processing) are repeated in accordance with an incremental improving technique such as, for example, the simulated annealing. By this, the layout result by which the cost COST obtained by equation (4) is minimum is obtained. The details of the simulated annealing are described in, for example, S. Kirkpatrik and two others, "Optimization by Simulated Annealing", Science 200 (1983), pp. 671-680.

By performing the scheduling and resource arrangement step, the layout result of the allocated resource connection graph is obtained. In the layout result, the signal edges and also the attraction force sharing edges are shortened. Accordingly, sharing is promoted for sharable allocated resources corresponding to processing nodes allocated to different states. On the other hand, a negative weight is set on a repulsion force sharing edge. Therefore, sharing is suppressed for sharable allocated resources corresponding to processing nodes allocated to the same state.

In the above description, an unlimited number of sharable allocated resources can be arranged at the same position. Alternatively, the number of allocated resources which can be arranged at the same position (hereinafter, referred to as an "overlappable number") may be restricted in advance using a design restriction file or the like. In more detail, the allocated resources which are arranged at the same position have a high possibility of being shared in the resource sharing step performed later. However, when the allocated resources are shared and a great number of types of processing are performed by one allocated resource by switching, the delay time of a selection circuit (multiplexer) for selecting input data of the allocated resource is increased. This may possibly results in a phenomenon that all the processing allocated to one state cannot be completed within a clock cycle (hereinafter, referred to as a "clock timing error"). This problem is solved by restricting the overlappable number. Thus, the allocated resources can be provisionally arranged in consideration of the delay time of the selection circuit required by the sharing of the allocated resources, and thus occurrence of the clock timing error described later can be prevented.

In the above description, the cost of arrangement of the allocated resource connection graph is calculated using equation (4). Alternatively, the cost of arrangement of the allocated resource connection graph may be calculated using equation (5) after the layout area is divided into small rectangular areas.

$$COST' = \alpha \times \left\{ \sum_{i=1}^{R_n} \sum_{j=1}^{R_n} (WM_{ij} \times L_{ij}) \right\} + \beta \times \sum_{x=1}^{X_{max}} \sum_{y=1}^{Y_{max}} \{H[Ov_{xy} - Ovs_{xy}] \times (Ov_{xy} - Ovs_{xy})\} \quad (5)$$

In equation (5), Xmas and Ymax represent the number of small areas in an X direction and a Y direction; $Ovs_{xy}$ represents the overlappable number in a small area which is x'th in the X direction and y'th in the Y direction; $Ov_{xy}$ represents the number of allocated resources actually arranged in the small area which is x'th in the X direction and y'th in the Y direction; function H[x] represents the Heaviside step function which gives 0 when x is less than 0 and 1 when x is equal to or greater than 0; and $\alpha$ and $\beta$ are parameters obtained by experiments or the like. Owing to the second term of equation (5), in the layout result by which the cost COST' obtained by equation (5) is minimum, the number of allocated resources which can be arranged in the same small area is restricted to the overlappable number of each small area.

By using an evaluation function, by which the evaluation value is degraded when the number of nodes arranged at the same position exceeds a predetermined value, to evaluate the layout result, the number of nodes which can be arranged at the same position can be restricted merely by performing the layout processing.

In the scheduling and resource arrangement step, the overlappable number may be dynamically changed based on, for example, the result of estimation of the delay time of a selection circuit. In more detail, when, for example, a new allocated resource is arranged at the position at which another allocated resource has been already arranged, the delay time of the selection circuit required for sharing these allocated resources is estimated, and a sum of the estimated value and the delay time of the allocated resources is calculated. This sum is the estimated value of the processing time of the state to which these allocated resources are allocated. When the estimated value of the processing time approaches a certain reference level within a predetermined clock cycle, the newly arranged allocated resource is moved to another position. In this case, the overlappable number is changed so as to match the number of allocated resources which are arranged at that position at that point. Thus, a new allocated resource is prevented from being arranged in the same position after this.

The delay time of a selection circuit is determined by the number or bit length of shared allocated resources. Therefore, after the allocated resources to be shared are determined, the delay time can be estimated with high precision. By estimating the delay time with such high precision, the maximum sharing by which no clock timing error occurs can be performed and a minimum circuit in which no clock timing error occurs can be obtained.

In the scheduling and resource arrangement step, layout models reflecting an actual layout may be adopted. Hereinafter, with reference to FIG. 15A through FIG. 21, an exemplary layout model reflecting a physical structure of an allocated resource (area, shape, etc.) will be described. Using this layout model, processing closer to the actual layout processing can be performed. Thus, a smaller scale circuit can be obtained.

In the layout models shown below, the physical structure of an allocated resource is represented by unit elements having a predetermined two-dimensional shape and connection elements for connecting the unit elements. In more detail, as in the case of calculating the cost using equation (5), the layout area is divided into smaller rectangular areas. Each allocated resource is also divided into areas having the same shape or the same area size as these smaller rectangular areas. Each of the areas obtained in this manner is a unit element. The unit elements are connected with each other via a connection element provided in accordance with a predetermined rule.

Figure 15A:
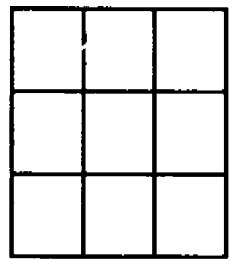
FIG. 15A and FIG. 15B show that an allocated resource is divided into a plurality of unit elements in a layout model used in the scheduling and resource arrangement step shown in FIG. 1.
Figure 15B:
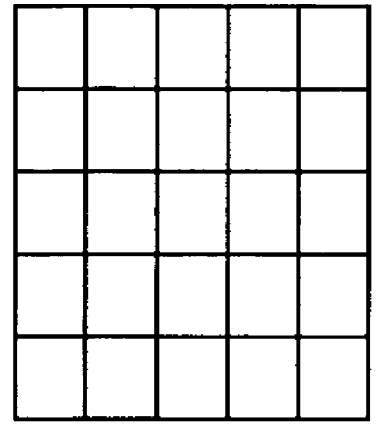
Figure 16:
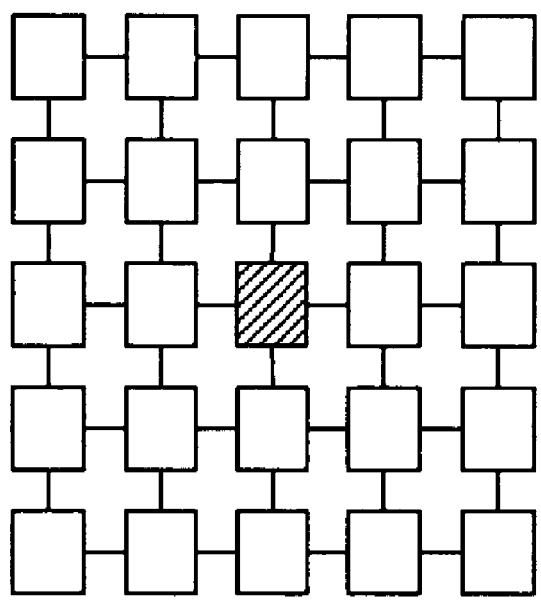
FIG. 16 shows a model of a hard resource in a layout model used in the scheduling and resource arrangement step shown in FIG. 1.

For example, an allocated resource is divided into a plurality of unit elements as shown in FIG. 15A and FIG. 15B. The allocated resource $R_{+1}$ shown in FIG. 15A has an area size corresponding to nine small areas and is divided into nine unit elements. An allocated resource $R_{+5}$ shown in FIG. 15B has an area size corresponding to 25 small areas and is divided into 25 unit elements. FIG. 16 shows the 25 unit elements of the allocated resource $R_{+5}$ shown in FIG. 15B which are connected by connection elements. As shown in FIG. 16, the 25 unit elements are arranged two-dimensionally, and connection elements are provided between unit elements which are adjacent to each other in up, down, right and left directions.

When an allocated resource is represented using unit elements and connection elements, the number of unit elements corresponds to the area size of the allocated resource in the layout. The connection elements represent the degree to which the shape of the allocated resource in the layout can be changed. When arranging an allocated resource in the scheduling and resource arrangement step, the allocated resource represented using the unit elements and the connection elements as described above is arranged in the layout area which is divided into small rectangular areas.

Allocated resources included in the allocated resource connection graph include resources having a fixed shape such as a memory (hereinafter, referred to as a "hard resource") and resources having a variable shape such as a calculator (hereinafter, referred to as a "soft resource"). The difference between these resources is represented by the manner of providing connection elements between the unit elements. In more detail, the connection elements are provided at a high density for a hard resource, and at a low density for a soft resource. When weighting each connection element and laying out the allocated resources in consideration of the added weight, a large weight may be set on connection elements provided for a hard resource and a small weight may be set on connection elements provided for a soft resource.

For a hard resource, as shown in FIG. 16 for example, connection edges as the connection elements are provided between unit elements adjacent to each other in all the fours directions. In this case, the allocated resources can be arranged while each connection edge is provided with a sufficiently larger weight than the weight given to each connection edge included in the allocated resource connection graph (signal edges and sharing edges). In this way, the allocated resources are arranged with the initial shape being kept. By providing the connection elements at a high density between unit elements, even if the arranged position of each unit element is individually optimized, the unit elements as a whole are arranged such that total length of the connection edges is minimum (i.e., the shape of the allocated resources before the division) when the arrangement is completed.

For a soft resource, as shown in FIG. 17A for example, one connection element for connecting all the unit elements may be provided. In general, as a method for estimating the connection length after arrangement, a so-called minimum bounding box method (when unit elements connected to one connection element are arranged in a certain rectangular area, the half circumferential length of the area is minimized) is often used. Accordingly, even if the original shape of each allocated resource is square as shown in FIG. 17A, the unit elements are expected to be arranged in a rectangular shape as a whole as shown in FIG. 17B and FIG. 17C when the arrangement is completed, in consideration of the connection edges of the allocated resource connection graph.

Figure 18A:
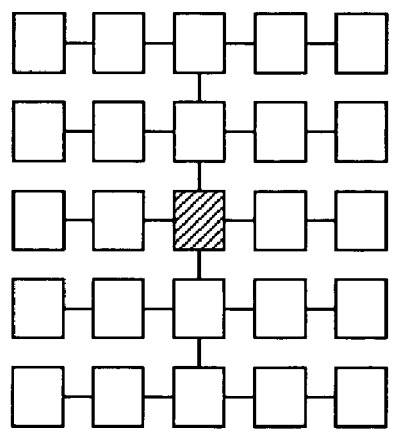
FIG. 18A and FIG. 18B show models of a soft resource in a layout model used in the scheduling and resource arrangement step shown in FIG. 1.
Figure 18B:
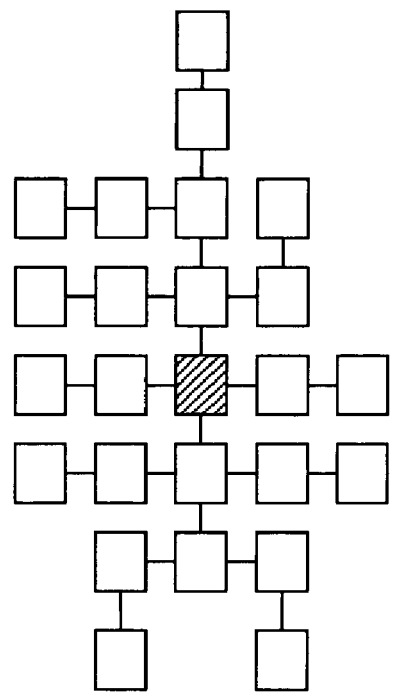

For a soft resource, as shown in FIG. 18A and FIG. 18B for example, a connection element, which connects one or more but three or less unit elements, among the unit elements which are adjacent to each other in all the four directions, maybe provided. The connection state shown in FIG. 18A is obtained from the connection state in FIG. 16 by deleting some of the connection edges so as to reduce the density of the connection elements. When such a connection style is used, the possibility that the unit elements are arranged far from a central unit element is higher than in the connection style shown in FIG. 17A. Therefore, the shape of the allocated resources can be more flexibly deformed. The connection style shown in FIG. 18B has the same inter-unit element distance as that in FIG. 18A. When the connection style shown in FIG. 18B is used, the shape of the allocated resources can be more flexibly deformed.

Figure 19A:
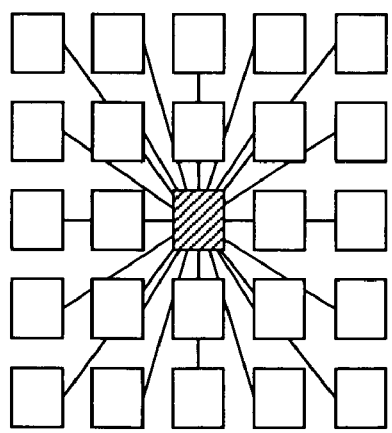
FIG. 19A and FIG. 19B show models of a soft resource in a layout model used in the scheduling and resource arrangement step shown in FIG. 1.
Figure 19B:
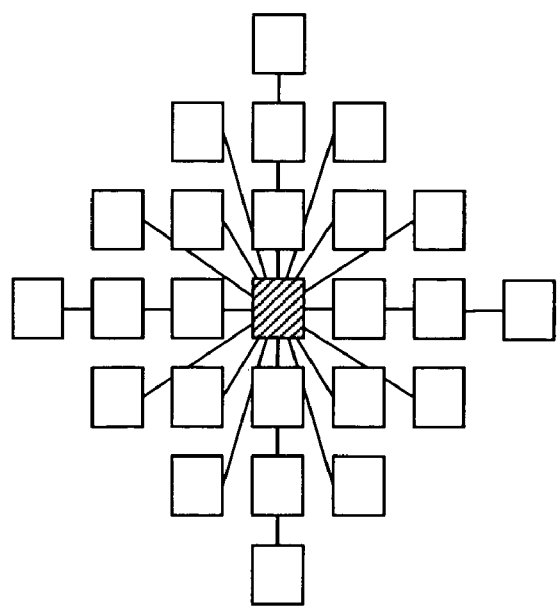
Figure 20A:
FIG. 20A and FIG. 20B show models of two types of adders in a layout model used in the scheduling and resource arrangement step shown in FIG. 1.
Figure 20B:
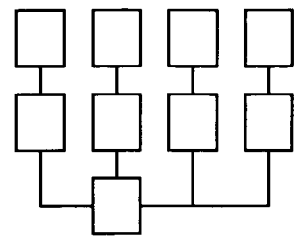

Alternatively, for a soft resource, as shown in FIG. 19A for example, connection elements for connecting a central unit element and the other unit elements may be provided. When such a connection style is used, each unit element is arranged such that a Manhattan distance of each unit element from the central unit element is within a predetermined value. Therefore, when the arrangement is completed, as shown in FIG. 19B, the unit elements are arranged in a diamond shape as a whole. In this case, the allocated resources can be arranged while each connection edge is provided with an equivalent weight to the weight given to each connection edge included in the allocated resource connection graph (signal edges and sharing edges). In this way, the shape of the allocated resources is determined in consideration of the arrangement in the entirety of the allocated resource connection graph. The connection style shown in FIG. 19A has smaller number of connection edges in many cases as compared to connection styles shown in FIG. 18A and FIG. 18B. Therefore, the number of connection edges to be considered at the time of layout can be reduced, and thus the layout processing can be performed in a shorter period of time.

For allocated resources, the shape of which can be changed but the calculator architecture of which is fixed, connection elements in a style suitable to the calculator architecture may be provided. For example, a connection style for the case where the allocated resources are ripple-carry adders (FIG. 20A) and a connection style for the case where the allocated resources are carry-look ahead adders (FIG. 20B) will be described. When the allocated resource is a ripple-carry adder and the area size of each of the small areas obtained by dividing the layout area is equal to the area size of an n-bit adder, the n-bit adder is associated with a unit element. In addition, a carry propagation signal is associated with a connection element provided between unit elements. Accordingly, the allocated resource is represented as in FIG. 20A using the unit elements and the connection elements.

When the allocated resource is a carry-look ahead adder, an n-bit adder or a carry generation/propagation circuit is associated with a unit element and a carry generation/propagation signal is associated with a connection element provided between unit elements. Accordingly, the allocated resource is represented as in FIG. 20B using the unit elements and the connection elements. By providing connection elements in a style suitable to the calculator architecture as an allocated resource model in this manner, the unit elements can be arranged in consideration of the connection state of the signal lines in the allocated resources as well as the area size of the allocated resources. Thus, the layout model of the allocated resource(s) can be represented more accurately. Here, adders are described as an example, substantially the same methods are applicable to other allocated resources which can assume a plurality of calculator architectures such as multipliers.

Figure 21:
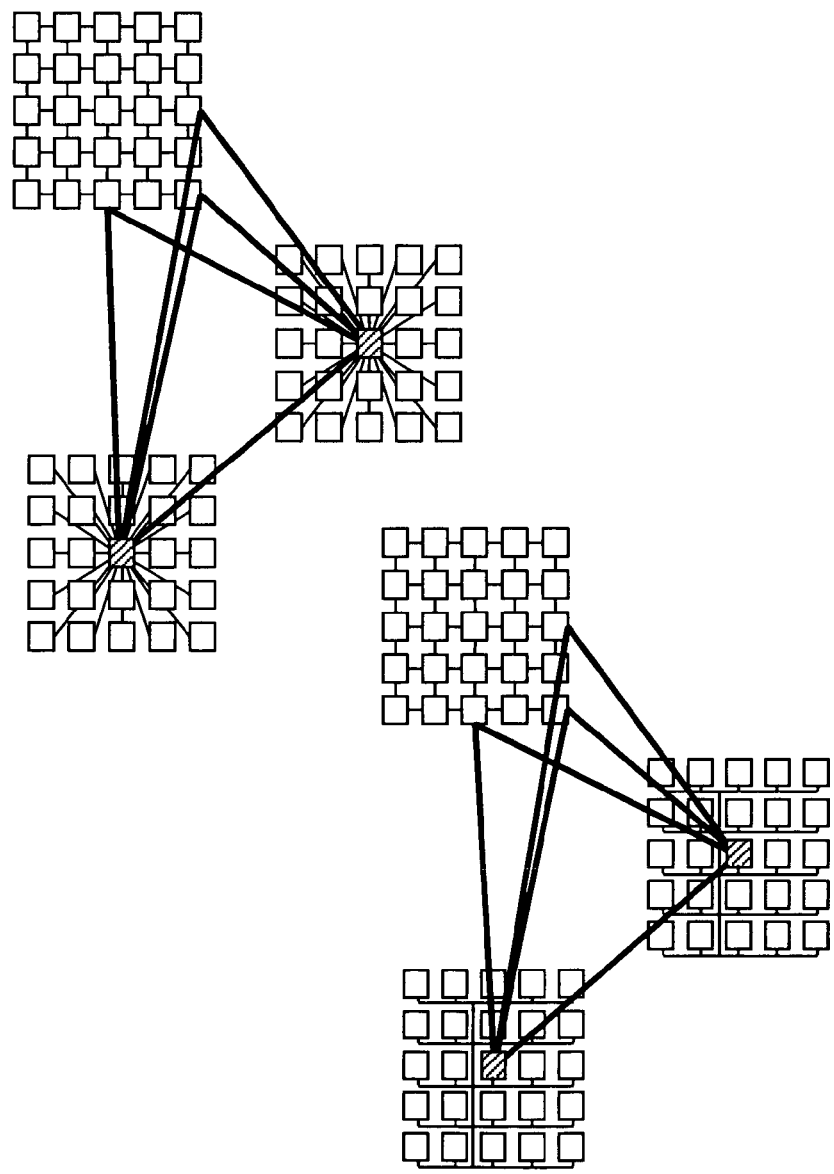
FIG. 21 shows a method for connecting allocated resources in a layout model used in the scheduling and resource arrangement step shown in FIG. 1.

For allocated resources having an input/output pin at a fixed position, such as memories, connection elements may be provided as shown in, for example, FIG. 21. FIG. 21 shows allocated resources having an input/output pin at a fixed position (the central unit element is not hatched) and allocated resources having an input/output pin at a variable position (the central unit element is hatched). In the former allocated resources, an input/output pin is allocated to the unit element arranged at the same position as the input/output pin. In the latter allocated resources, an input/output pin is allocated to the central unit element. Thus, for the allocated resources having an input/output pin at a fixed position, the unit elements can be arranged in consideration of the position of the input/output pin.

By arranging the allocated resources after the allocated resources are represented using unit elements and connection elements in this manner, the allocated resources, the area size of which is known but the shape of which has not been determined, can be preferably arranged while the shape is freely changed in consideration of the influence of the area size and shape which will be exerted on the arrangement result. Therefore, by adopting such highly precise layout models, superb results can be obtained when the allocated resources are shared.

As described above, according to the high level synthesis method in this embodiment, the scheduling and resource arrangement step and the resource sharing step are performed on the allocated resource connection graph having sharing edges added thereto in the sharing edge generation step. The allocated resources are provisionally arranged in consideration of whether each allocated resource is sharable or not. Accordingly, the sharable allocated resources can be arranged close to each other at the stage of provisional arrangement of the allocated resources. As a result, when the allocated resources are shared later, occurrence of clock timing error or other problems can be prevented. In addition, the allocated resources are shared in the range that the total execution state number does not exceed the initially obtained value. Thus, a synthesis result having a smaller total execution state number can be obtained.

By weighting sharing edges, the degree at which the sharing of the allocated resources is promoted or suppressed can be controlled, which provides a better synthesis result. By adopting a layout model in consideration of the physical properties of the allocated resources, a better synthesis result in consideration of the actual layout result can be obtained.

FIRST VARIANT OF FIRST EMBODIMENT

Figure 22:
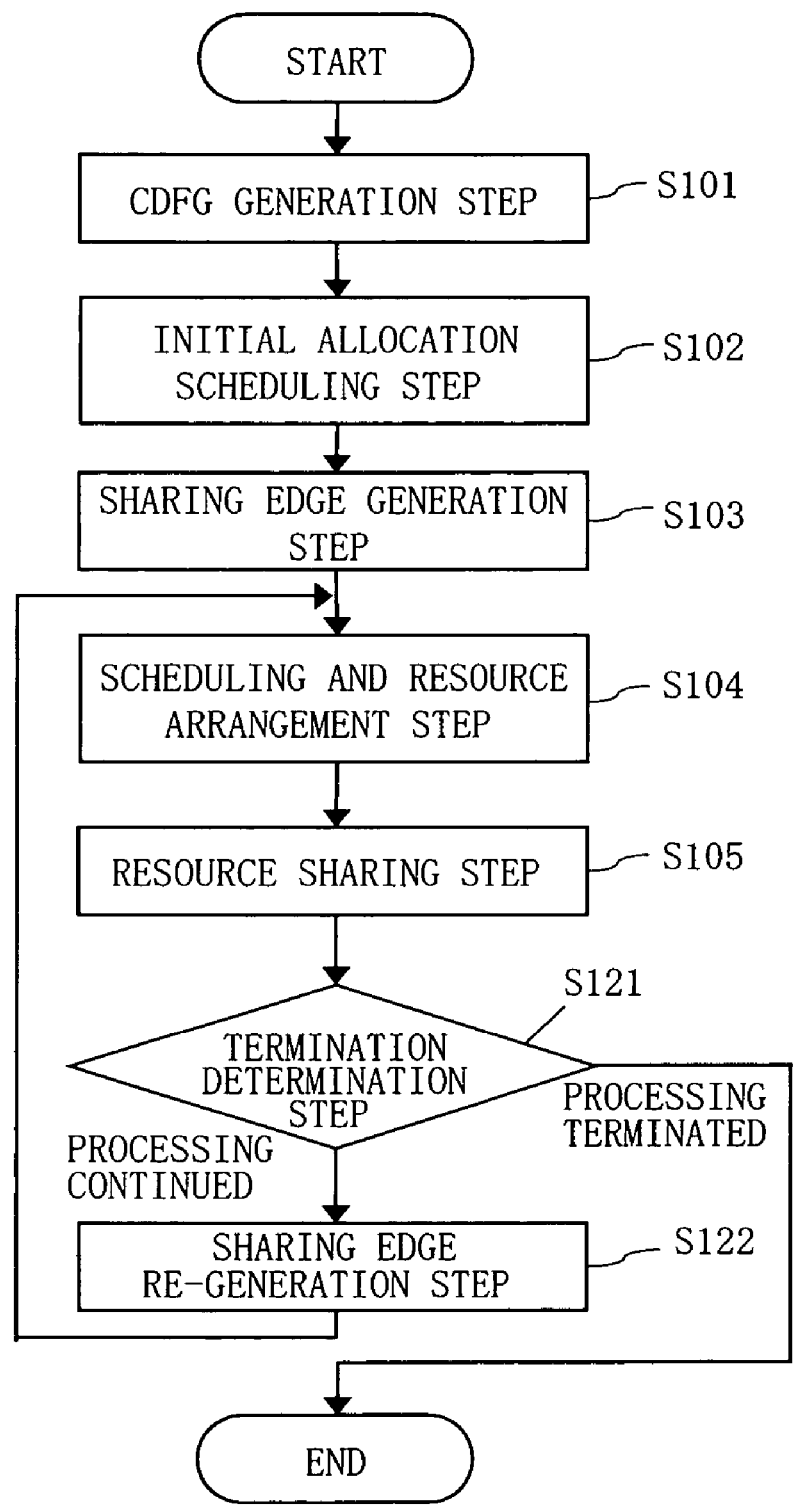
FIG. 22 is a flowchart showing a high level synthesis method according to a first variant of the first embodiment of the present invention.

FIG. 22 is a flow chart showing a layout-based high level synthesis method according to a first variant of the first embodiment of the present invention. The flowchart shown in FIG. 22 includes a termination determination step (step S121) and a sharing edge re-generation step (step S122) after the resource sharing step (step S105) in the flowchart shown in FIG. 1. Identical steps to those of FIG. 1 bear the same step numbers and will not be described here.

With the high level synthesis method according to this variation, as shown in FIG. 22, the termination determination step (step S121) is performed after the resource sharing step (step S105). In the termination determination step, it is determined whether to terminate or continue the processing in accordance with predetermined determination criteria. When it is determined to continue the processing, sharing edges are re-added to the allocated resource connection graph in the sharing edge re-generation step (step S122). Then, the scheduling and resource arrangement step (step S104) is performed again. Steps S104 through S122 are repeated until it is determined to terminate the processing in the termination determination step.

Figure 23:
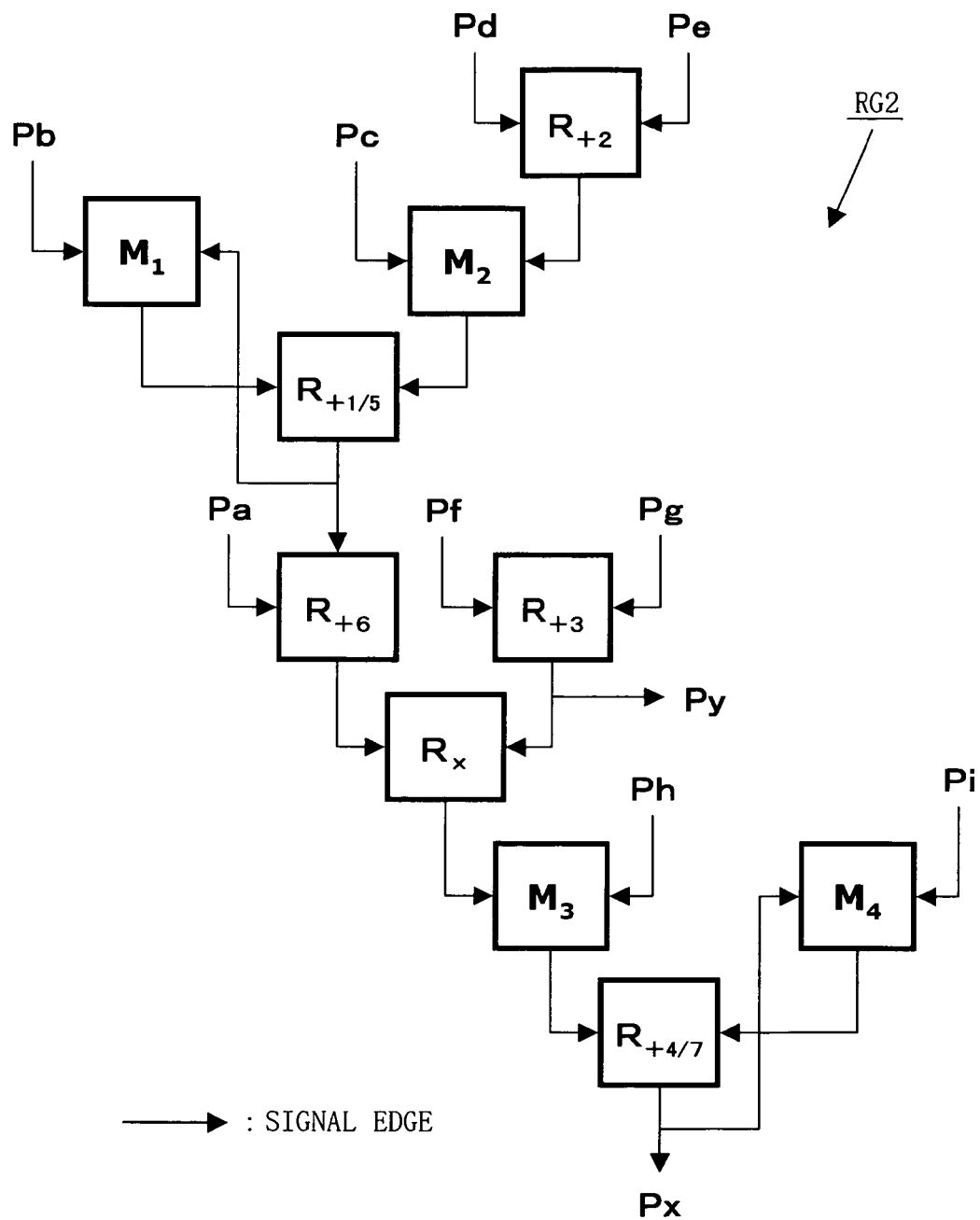
FIG. 23 shows an allocated resource connection graph obtained after the allocated resources are shared in the high level synthesis method shown in FIG. 22.
Figures 27A, 27B, 27C, 27D:
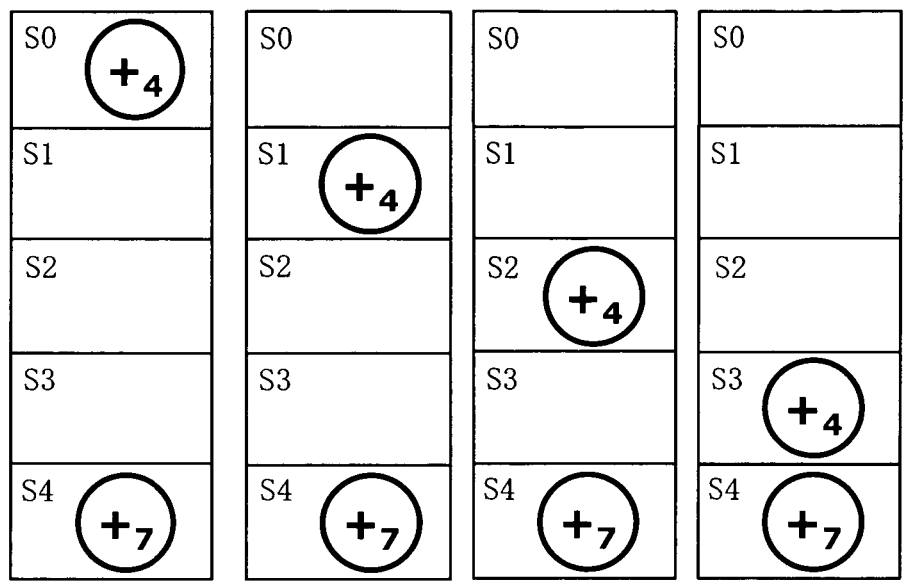
FIG. 27A through FIG. 27D show usable schedules of processing node corresponding to an allocated resource $R_{+4/7}$ shown in FIG. 23.
Figure 28:
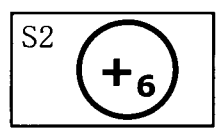
FIG. 28 shows a usable schedule of processing node corresponding to an allocated resource $R_{+6}$ shown in FIG. 23.

Hereinafter, exemplary processing which is performed according to the high level synthesis method of this variation when the operation description data BD mentioned above (i.e., equations (1a) and (1b)) are input will be described. In this variation also, steps S101 through S105 are performed like in the first embodiment. As a result, when the resource sharing step (step S105) is completed, the allocated resource connection graph with some of the allocated resources being shared and the arranged position of each allocated resource are obtained. In this example, it is assumed that the resource sharing step is performed on the allocated resource-connection graph RG10 shown in FIG. 6 and as a result, the allocated resources $R_{+1}$ and $R_{+5}$ are shared and the allocated resources $R_{+4}$ and $R_{+7}$ are shared to generate an allocated resource connection graph RG2 shown in FIG. 23. In FIG. 23, an allocated resource $R_{+1/5}$ is obtained by sharing the allocated resources $R_{+1}$ and $R_{+5}$, and an allocated resource $R_{+4/7}$ is obtained by sharing the allocated resources $R_{+4}$ and $R_{+7}$. $M_1$ through $M_4$ represent selection circuits added for the sharing.

In the termination determination step (step S121), it is determined whether or not predetermined termination conditions are fulfilled. In the termination determination step, it is determined to terminate the processing, for example, when the number of times that the termination determination step was repeated exceeds a predetermined number, or when the allocated resource connection graph has not been changed since this step was performed the last time. Otherwise, it is determined to continue the processing.

When it is determined to continue the processing in the termination determination step, the sharing edge re-generation step (step S122) is performed. In the sharing edge re-generation step, a new sharing edge is generated between sharable allocated resources having the same function which are included in the allocated resource connection graph at the point.

In the sharing edge re-generation step, a schedule realization permutation number of a processing node is calculated for re-generating a new sharing edge. The "schedule realization permutation number of a processing node" is the number of methods for allocating processing nodes to states in the range in which the total execution state number does not exceed the value obtained in the initial allocation scheduling step. In the sharing edge re-generation step, a new sharing edge is generated between sharable allocated resources included in the allocated resource connection graph at that point. Weight $Wa'_{ij}$ calculated using equation (6) is given to the sharing edge.

$$Wa'_{ij} = PG_{ij}/(P_i \times P_j) \quad (6)$$

In equation (6), $P_i$ and $P_j$ are schedule realization permutation numbers of the processing nodes corresponding to the i'th and j'th allocated resources, respectively. When the i'th and j'th allocated resources are shared, $PG_{ij}$ represents a schedule realization permutation number of the processing node corresponding to these two allocated resources. In the case where the sharing edge is a repulsion force sharing edge, weight $Wr'_{ij}$ of such a sharing edge is calculated using equation (7) as in the case of equation (3).

$$Wr'_{ij} = Wa'_{ij} - 1 \quad (7)$$

A schedule realization permutation number of each processing node in the allocated resource connection graph shown in FIG. 23, for example, can be obtained as follows with reference to the schedule changeable range shown in FIG. 9. FIG. 24, FIG. 25, FIG. 26A through FIG. 26C, FIG. 27A through FIG. 27D, and FIG. 28 each show a method for allocating a processing node to a state regarding the allocated resources $R_{+1/5}$, $R_{+2}$, $R_{+3}$, $R_{+4/7}$ and $R_{+6}$ shown in FIG. 23, in the range in which the total execution state number does not exceed the value obtained in the initial allocation scheduling step. For example, in FIG. 9, the schedule changeable range of the processing node $N_{+1}$ includes only state S0, and the schedule changeable range of the processing node $N_{+5}$ includes only state S1. Accordingly, even when the processing for the processing nodes $N_{+1}$ and $N_{+5}$ is performed by one allocated resource $R_{+1/5}$, such processing can only be performed in states S0 and S1 (see FIG. 24). By contrast, in FIG. 9, the schedule changeable range of the processing node $N_{+4}$ includes states S0 through S3, and the schedule changeable range of the processing node $N_{+7}$ includes only state S4. Accordingly, when the processing for the processing nodes $N_{+4}$ and $N_{+7}$ is performed by one allocated resource $R_{+4/7}$, such processing can be performed in four methods (see FIGS. 27A through 27D). In this way, the schedule realization permutation numbers of the allocated resources $R_{+1/5}$, $R_{+2}$, $R_{+3}$, $R_{+4/7}$ and $R_{+6}$ are 1, 1, 3, 4, and 1, respectively.

Figure 29:
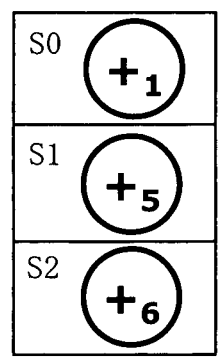
FIG. 29 shows a usable schedule when the allocated resources $R_{+1/5}$ and $R_{+6}$ shown in FIG. 23 are shared.
Figures 30A, 30B, 30C, 30D, 30E:
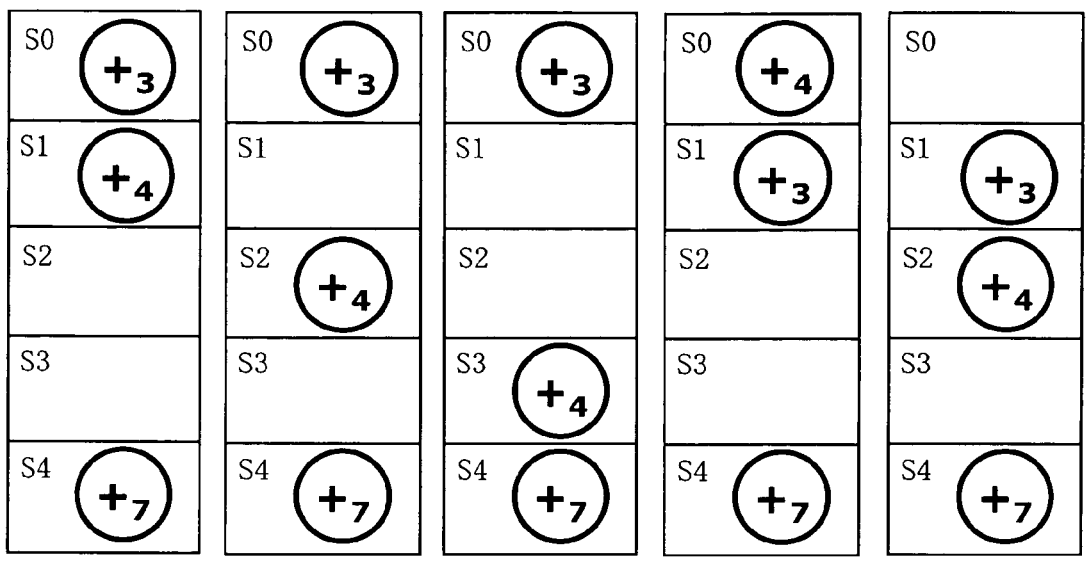
FIGS. 30A through 30I show usable schedules when the allocated resources $R_{+4/7}$ and $R_{+3}$ shown in FIG. 23 are shared.
Figures 30F, 30G, 30H, 30I:
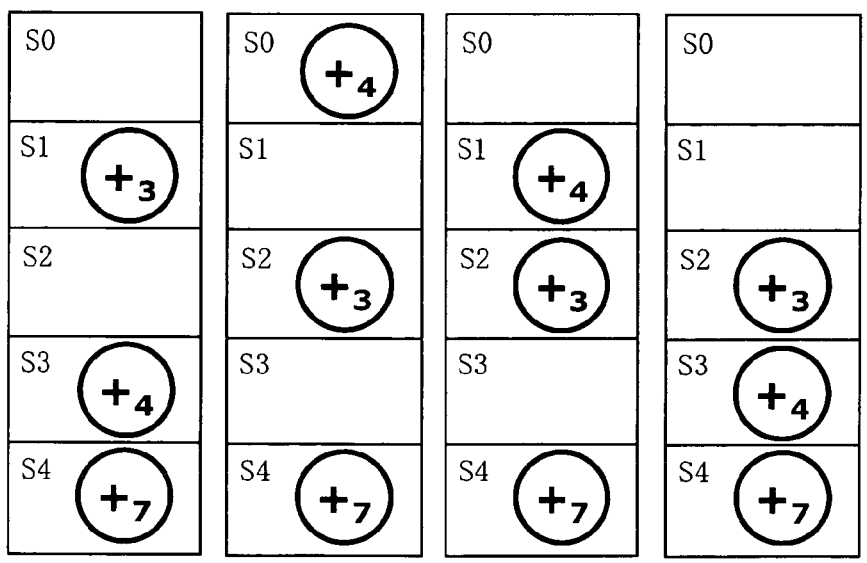

There is only one method for allocating processing nodes corresponding to the allocated resources $R_{+1/5}$ and $R_{+6}$ to states in the range in which the total execution state number does not exceed the value obtained in the initial allocation scheduling step (see FIG. 29). Accordingly, $PG_{+1/5, +6} = 1$. Since $P_{+1/5} = P_{+6} = 1$ as mentioned above, $Wa'_{+1/5, +6}$ is 1 by equation (6). Similarly, there are nine methods for allocating processing nodes corresponding to the allocated resources $R_{+4/7}$ and $R_{+3}$ to states in the range in which the total execution state number does not exceed the value obtained in the initial allocation scheduling step (see FIG. 30A through FIG. 30I). Accordingly, $PG_{+4/7, +3} = 9$. Since $P_{+4/7} = 4$ and $P_{+3} = 3$ as mentioned above, $Wa'_{+4/7, +3}$ is ¾ by equation (6).

Figure 32:
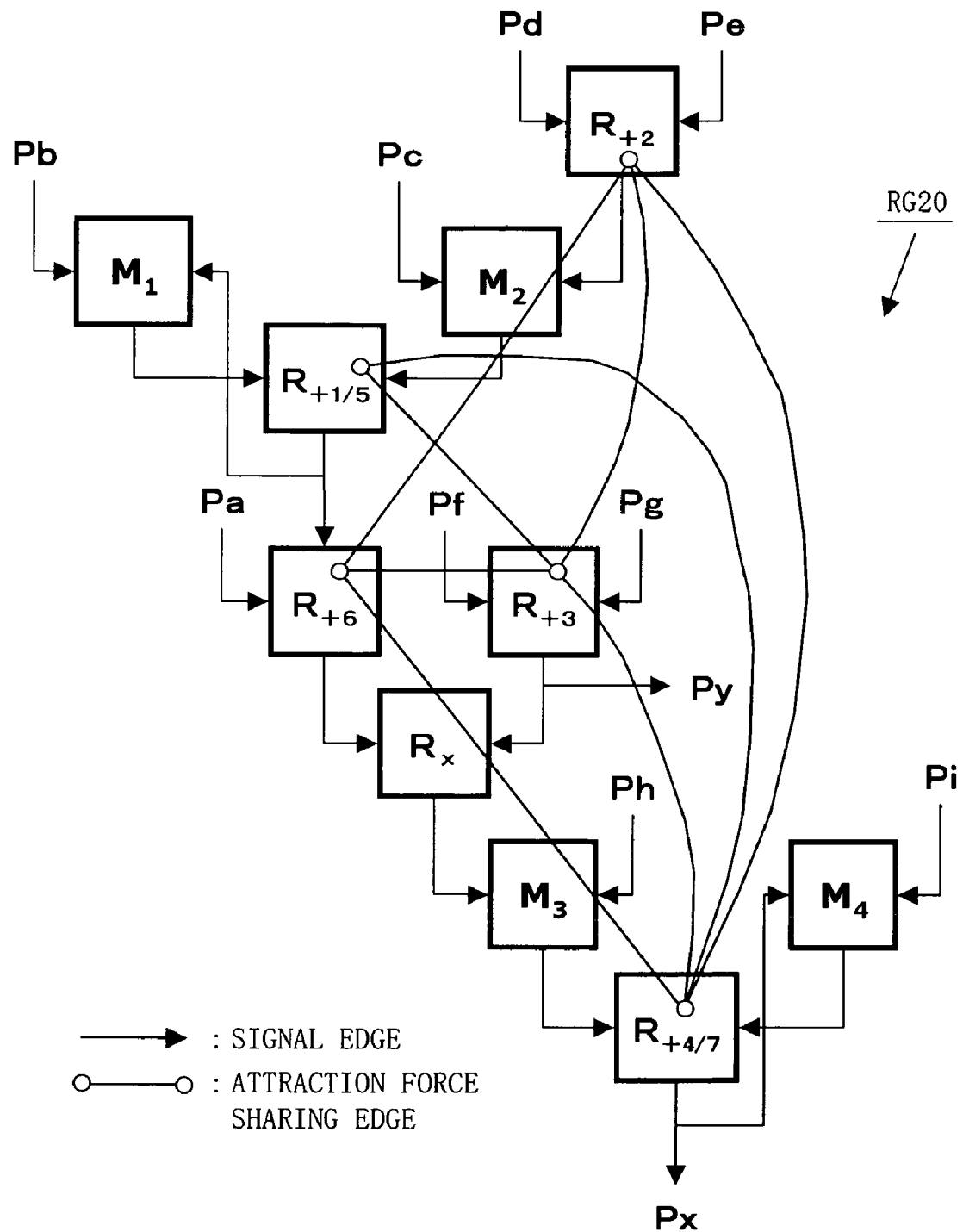
FIG. 32 shows an allocated resource connection graph obtained by adding the types of sharing edges shown in FIG. 31 to the allocated resource connection graph shown in FIG. 23.

FIG. 31 shows weights to be given to attraction force sharing edges which are to be added to the allocated resource connection graph RG2 shown in FIG. 23 based on the allocation schedule shown in FIG. 3. FIG. 32 shows an allocated resource connection graph RG20 obtained by adding the sharing edges shown in FIG. 31 to the allocated resource connection graph RG2 shown in FIG. 23. In this variation, sharing edges are not added between allocated resources directly connected to each other via one signal line or between allocated resources which are indirectly connected to each other via a selection circuit and two signal lines (for example, $R_{+2}$ and $R_{+1/5}$ which are connected via the selection circuit $M_2$ and two signal lines).

Subsequent to the sharing edge re-generation step, the scheduling and resource arrangement step (step S104) is performed again. Until it is determined to terminate the processing in the termination determination step, steps S104 through S122 are repeated. As described above, in this variation, the scheduling and resource arrangement step is repeated using the result obtained the first time when the resource sharing step is performed as the initial solution. Thus, sharing of the allocated resources is further promoted to provide a better synthesis result.

In the scheduling and resource arrangement step in the first embodiment, the allocated state of each processing node is changed in the schedule changeable range. In the scheduling and resource arrangement step in this variation, only the allocated states of the processing nodes corresponding to the shared allocated resources are changed in the range of the schedule realization permutation number for each of the processing nodes at a predetermined frequency. Owing to such setting, even if the allocated states of the processing nodes corresponding to the shared allocated resources are changed, the total execution state number never exceeds the initially obtained value. Therefore, sharing of allocated resources can be further promoted in consideration of the new allocation schedule obtained by the change in accordance with the sharing of the allocated resources in the range in which the total execution state number does not exceed the initially obtained value.

As described above, according to the high level synthesis method of this variation, each time the allocated resource connection graph is changed in accordance with the sharing of allocated resources, the sharing edge re-generation step, the scheduling and resource arrangement step and the resource sharing step are performed. Thus, the possibility of sharing can be found for more hardware resources and a smaller scale circuit can be obtained.

SECOND VARIANT OF FIRST EMBODIMENT

According to a second variant of the first embodiment of the present invention, the number of allocated resources to be shared is restricted in the resource sharing step (step S105) in the first variant of the first embodiment mentioned above.

In a layout-based high level synthesis method according to this variation, the upper limit of the number of allocated resources to be shared (hereinafter, referred to as a "sharing upper limit") is predetermined. In the resource sharing step, the priority level is calculated for each sharable allocated resource. As the sharing is more preferable, the value of the priority level is larger. Then, the allocated resources having a priority level which is equal to or larger than a predetermined value are shared within the range of not exceeding the sharing upper limit, starting from the allocated resources having the highest value of priority level.

There are various methods for obtaining the priority level of allocated resources. For example, as indicated by equation (8), a priority level which is in inverse proportion to the distance between the allocated resources in the layout result is usable.

$$COST1_{ij}=A1/L_{ij} \qquad (8)$$

In equation (8), $L_{ij}$ is the distance between the i'th and j'th allocated resources in the layout result, and A1 is a parameter obtained by experiments or the like.

The allocated resources having the priority level $COST1_{ij}$ (by equation (8)) of less than a predetermined value are not shared. The reason is that sharing the allocated resources arranged discretely may have some harm on the layout result.

Alternatively, as indicated by equation (9), a priority level which is in proportion to the value obtained by dividing the weight of a connection edge by the distance between allocated resources in the layout result may be used. In this case, the allocated resources are shared when the priority level obtained by equation (9) is, for example, equal to or larger than 0.

$$COST2_{ij}=A2 \times WM_{ij}/L_{ij} \qquad (9)$$

In equation (9), $WM_{ij}$ is the value defined by equation (4), and $L_{ij}$ the value defined by equation (8). A2 is a parameter obtained by experiments or the like.

By calculating the priority level in consideration of weight $WM_{ij}$ of the connection edge in this manner, the allocated resources provided with a repulsion force sharing edge are never shared even if the distance therebetween is minimum. If the allocated resources provided with a repulsion force sharing edge are shared, the total execution state number increases. By using the priority level by equation (9), the allocated resources provided with a repulsion force sharing edge are prevented from being shared. Thus, an increase of the total execution state number can be prevented with certainty.

Still alternatively, as indicated by equation (10), the priority level may be calculated using an equation having a term in proportion to the weight of a connection edge and a term in inverse proportion to the distance between allocated resources in the layout result.

$$COST3_{ij}=B \times WM_{ij}+C/L_{ij} \qquad (10)$$

In equation (10), $WM_{ij}$ is the value defined by equation (4), and $L_{ij}$ is the value defined by equation (8). B and C are parameters obtained by experiments or the like.

When equation (9) is used, if $WM_{ij}$ is negative, the priority level is also negative. When equation (10) is used, even if $WM_{ij}$ is negative, the priority level may be positive depending on the value of the second term. Accordingly, when equation (10) is used, which of $WM_{ij}$ and $L_{ij}$ is to be provided with more importance can be adjusted using parameters B and C. When parameter B is large enough, sharing is performed with more importance being put on the total execution state number. When parameter C is large enough, sharing is performed with more importance being put on the layout estimation precision. By such setting, the trade-off situation can be adjusted between the layout estimation precision (estimation precision of layout attributes required for logic synthesis, such as line length and signal delay) and the overall performance can be adjusted. This can prevent the necessity of re-designing which is caused by incorrect estimation in the post step such as physical design.

Still alternatively, the priority level between allocated resources may be calculated using equations (11) through (13) independently or in an appropriate combination.

$$COST4_{ij}=D1/BW_{ij} \qquad (11)$$

$$COST5_{ij}=D2/AR_{ij} \qquad (12)$$

$$COST6_{ij}=D3/DL_{ij} \qquad (13)$$

In equations (11) through (13), $BW_{ij}$, $AR_{ij}$ and $DL_{ij}$ are respectively the difference in bit length, the difference in area size, and the difference in delay time between the i'th and j'th allocated resources. D1 through D3 are parameters obtained by experiments or the like. By sharing the allocated resources based on the evaluation value calculated by such a method, sharing of allocated resources which are significantly different in the bit length, the area size or the performance can be suppressed. Thus, inefficient sharing can be prevented.

As described above, according to the high level synthesis method of this variation, the number of allocated resources to be shared in the resource sharing step is restricted. Then, the sharing edge re-generation step, the scheduling and resource arrangement step, and the resource sharing step are repeated. By such setting, sharing of allocated resources gradually proceeds, and a final solution is obtained. Therefore, the change in the layout result which is caused by a change in the allocated resource connection graph can be understood in more detail and thus the quality of the layout can be improved.

THIRD VARIANT OF FIRST EMBODIMENT

A third variant of the first embodiment according to the present invention has the following feature. In the scheduling and resource arrangement step (step S104) in the first embodiment mentioned above, when two sharable processing nodes allocated to the same state fulfill a predetermined condition, the weight of a sharing edge which is added between the allocated resources corresponding to these processing nodes is set to an invalid value (a value which does not promote or suppress sharing). The predetermined condition is that two sharable processing nodes allocated to the same state are connected to each other via one or more signal edges in the same state. In the first embodiment, a repulsion force sharing edge having a negative weight is added between the allocated resources corresponding to two processing nodes which fulfill this condition. In this variation, a sharing edge having weight 0 is added.

In the allocation scheduling, two processing nodes, which are directly connected via one signal line or indirectly connected via a plurality of signal lines, may be allocated to the same state. Hereinafter, such allocation will be referred to as "chaining". A series of calculations performed by a plurality of chained processing nodes are performed within one clock cycle. In consideration of the connection delay time between the allocated resources, the allocated resources corresponding to the plurality of chained processing nodes are preferably arranged close to each other. Such a preferable arrangement is realized by providing a sharing edge having weight 0 between the allocated resources corresponding two processing nodes which fulfill the above-described predetermined condition.

Hereinafter, exemplary processing which is performed according to the high level synthesis method of this variation when equation (14) is input as the operation description data will be described.

$$x=((a+b)<<2) \times (d+e) \qquad (14)$$

In this variant also, when equation (14) is input, steps S101 through S103 in the first embodiment are performed.

Figure 34:
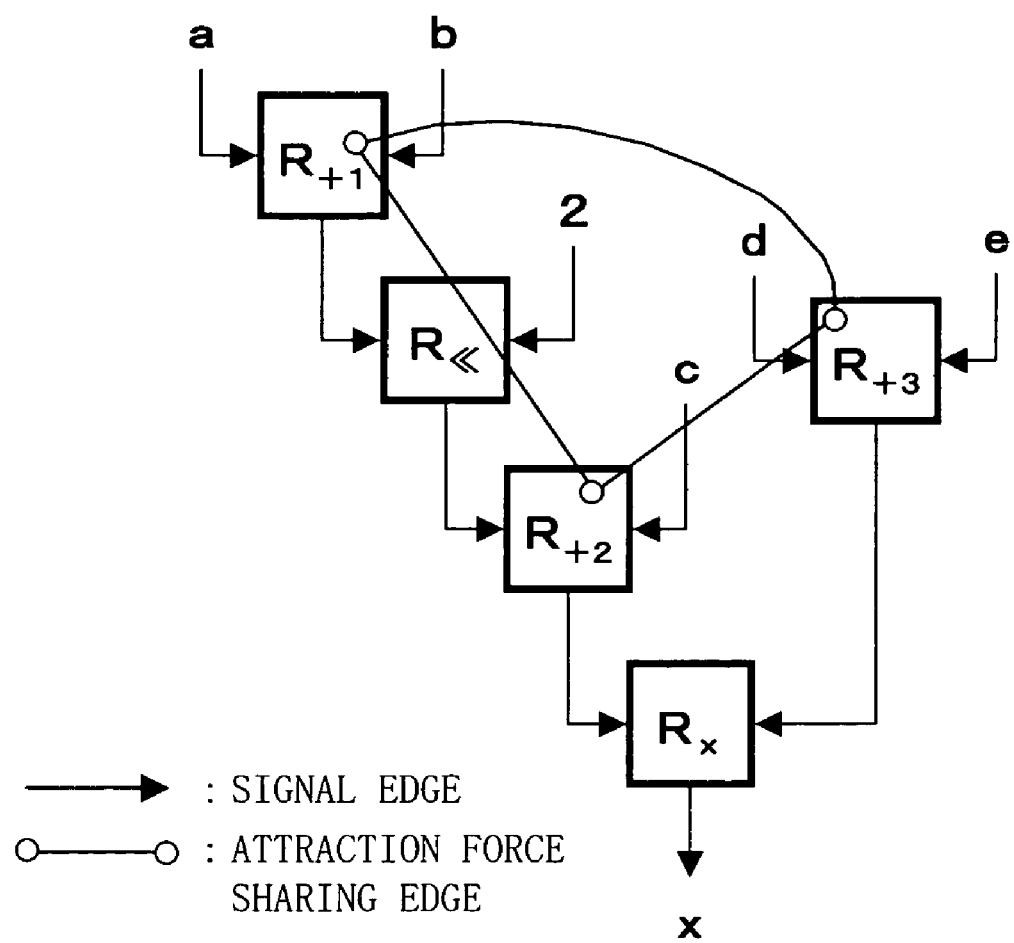
FIG. 34 shows an allocated resource connection graph corresponding to the CDFG shown in FIG. 33.

It is assumed that when step S103 is completed, the allocation schedule shown in FIG. 33 and the allocated resource connection graph shown in FIG. 34 are obtained. The allocated resources $R_{+1}$, $R_{+2}$, $R_{+3}$, $R_{<<}$, and $R_x$ in the allocated resource connection graph shown in FIG. 34 respectively correspond to the processing nodes $N_{+1}$, $N_{+2}$, $N_{+3}$, $N_{<<}$, and $N_x$ in the allocation schedule shown in FIG. 33. As shown in FIG. 33, the processing nodes $N_{+1}$, $N_{<<}$, and $N_{+2}$ connected via two signal edges are allocated to the same state. Namely, these three processing nodes are chained. The allocated resources $R_{+1}$, $R_{+2}$ are sharable and allocated to the same state. Therefore, a repulsion force sharing edge is added between these allocated resources.

In the first embodiment, the scheduling and resource arrangement step (step S104) is performed on the allocation schedule and the allocated resource connection graph obtained by performing the steps up to step S103. Thus, in the first embodiment, the scheduling and resource arrangement step is performed in the state where a repulsion force sharing edge is added between the allocated resources $R_{+1}$ and $R_{+2}$. Therefore, the allocated resources $R_{+1}$ and $R_{+2}$ are arranged discretely although it is preferable to arrange these allocated resources close to each other.

By contrast, in this variation, the allocated resources $R_{+1}$ and $R_{+2}$ are connected via the allocated resources $R_{<<}$ and two signal lines, and thus fulfill the predetermined condition. Accordingly, a sharing edge having weight 0 is added between the allocated resources $R_{+1}$ and $R_{+2}$, and the scheduling and resource arrangement step is performed in this state. As a result, the allocated resources $R_{+1}$ and $R_{+2}$ are arranged close to each other.

As describe above, in this variation, even when a plurality of processing nodes are chained in the allocation schedule, the allocated resource corresponding to such processing nodes are likely to be arranged close to each other. Thus, even in such a case, a circuit operating within a predetermined clock cycle can be obtained.

FOURTH VARIANT OF FIRST EMBODIMENT

Figure 35:
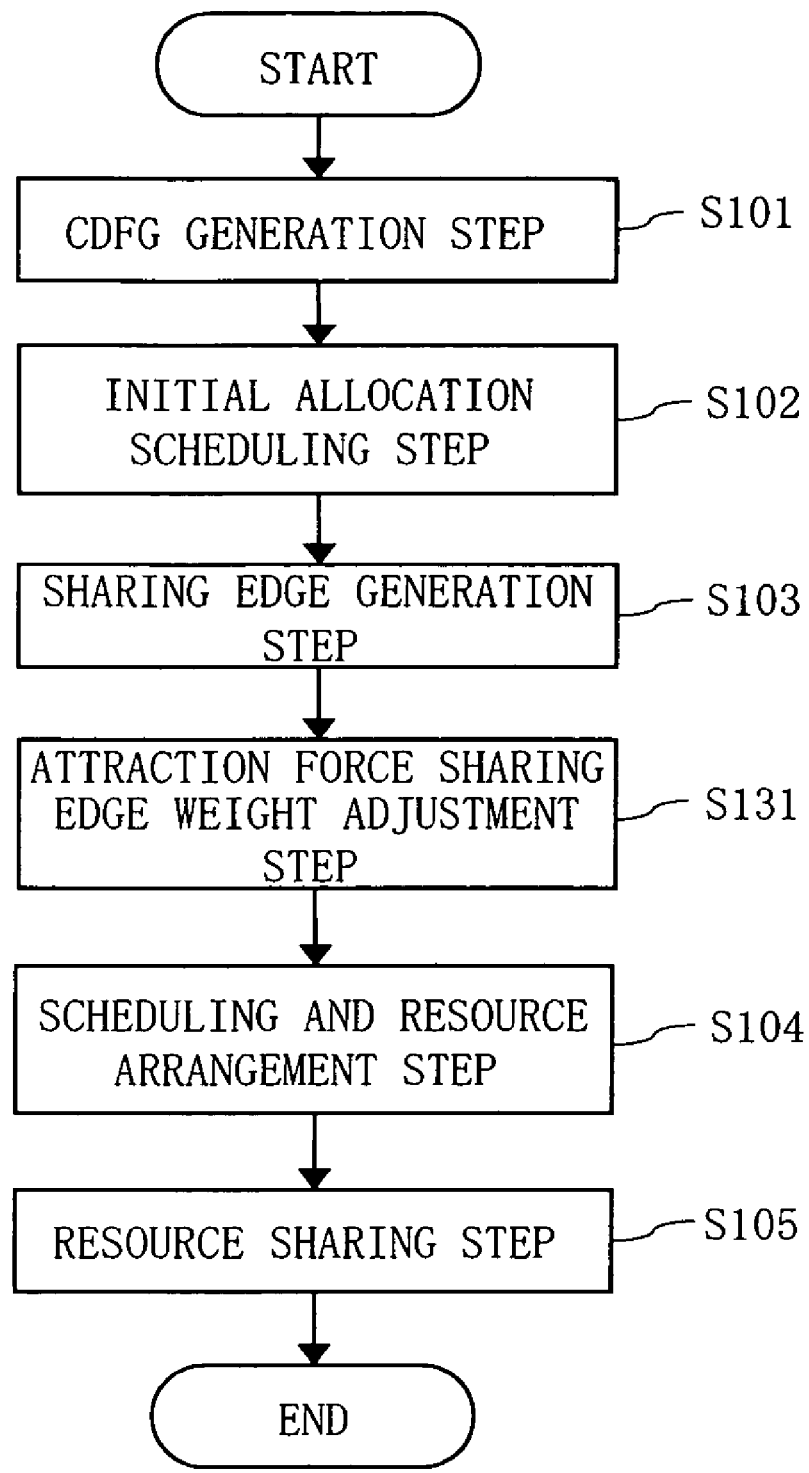
FIG. 35 is a flowchart showing a high level synthesis method according to a fourth variant of the first embodiment of the present invention.

FIG. 35 is a flowchart showing a layout-based high level synthesis method according to a fourth variant of the first embodiment of the present invention. In the flowchart shown in FIG. 35, an attraction force sharing edge weight adjustment step (step S131) is added between the sharing edge generation step (step S103) and the scheduling and resource arrangement step (step S104) in the flowchart shown in FIG. 1. Identical steps to those of FIG. 1 bear the same step numbers and will not be described here.

With the high level synthesis method according to this variation, the attraction force sharing edge weight adjustment step (step S131) is performed after the sharing edge generation step (step S103). In the attraction force sharing edge weight adjustment step, the weight given to the attraction force sharing edge generated in the sharing edge generation step is changed in accordance with certain criteria.

In the sharing edge generation step described above, a sharing edge (an attraction force sharing edge or a repulsion force sharing edge) is added between sharable allocated resources included in the allocated resource connection graph, except for the case where the allocated resources are directly connected to each other via one signal edge. Therefore, there are too many sharing edges which are irrelevant to signal propagation. As a result, the provisional layout result and the layout result obtained in the non-provisional layout step performed later become quite different. Thus, the estimation of the layout result is incorrect. In order to solve this problem, the high level synthesis method in this variation includes the attraction force sharing edge weight adjustment step. In this variation, the weight of a repulsion force sharing edge is not adjusted for the purpose of restricting the increase in the total execution state number.

Figure 36:
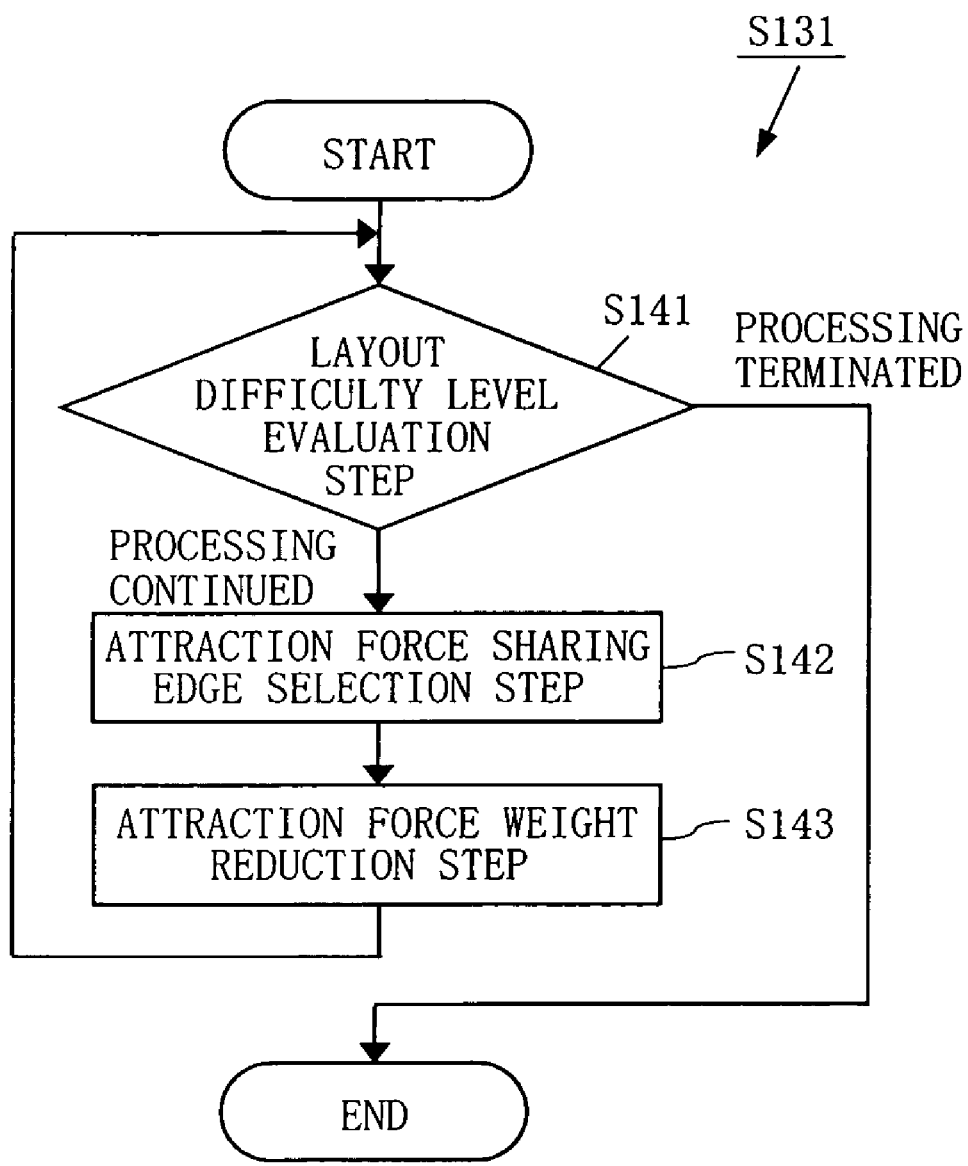
FIG. 36 is a flowchart showing the details of the attraction force sharing edge weight adjustment step shown in FIG. 35.

FIG. 36 is a flowchart showing details of the attraction force sharing edge weight adjustment step (step S131). In the attraction force sharing edge weight adjustment step shown in FIG. 36, a layout difficulty level evaluation step, an attraction force sharing edge selection step, and an attraction force sharing edge weight reduction step are performed on the allocated resource connection graph having sharing edges added thereto in the sharing edge generation step.

In the layout difficulty level evaluation step (step S141), an evaluation value indicating the difficulty level of the layout (hereinafter, referred to as a "layout difficulty level evaluation value") is calculated for the allocated resource connection graph having sharing edges added. Based on the obtained layout difficulty level evaluation value, it is determined whether to terminate or continue the processing. When it is determined to continue the processing, a sharing edge is selected in the attraction force sharing edge selection step (step S142), based on predetermined criteria. Next, in the attraction force sharing edge weight reduction step (step S143), the weight of the attraction force sharing edge selected in the attraction force sharing edge selection step is reduced to a predetermined value which is larger than 0. Then, the layout difficulty level evaluation step is performed again. Steps S141 through S143 are repeated until it is determined to terminate the processing in the layout difficulty level evaluation step.

Hereinafter, the details of the layout difficulty level evaluation step (step S141) and the attraction force sharing edge selection step (step S142) will be described. First, the details of the layout difficulty level evaluation step will be described.

In the layout difficulty level evaluation step, as indicated by equation (15) for example, the layout difficulty level evaluation value may be calculated using a sum of weights given to the signal edges and weights given to the attraction force sharing edges in the allocated resource connection graph.

$$COSTw1 = Ws + Wa \quad (15)$$

In equation (15), Ws is the sum of weights given to the signal edges, and Wa is the sum of weights given to the attraction force sharing edges. The value COSTw1 obtained by equation (15) is the sum of weights given to the signal edges and the attraction force sharing edges. When this value is equal to or larger than a predetermined value, it is determined to continue the processing. When this value is less than the predetermined value, it is determined to terminate the processing.

Alternatively, the layout difficulty level evaluation value may be the difference between the sum Wa of weights given to the attraction force sharing edges and the sum Ws of weights given to the signal edges (equation (16)). The layout difficulty level evaluation value may also be the ratio of the sum Wa of weights given to the attraction force sharing edges with respect to the sum of weights given to the attraction force sharing edges and the signal edges (equation (17)).

$$COSTw2 = Ws - Wa \quad (16)$$

$$COSTpw = Wa/(Ws + Wa) \quad (17)$$

When the value obtained by equation (16) or (17) is equal to or larger than a predetermined value, it is determined to continue the processing. When the value obtained by equation (16) or (17) is less than the predetermined value, it is determined to terminate the processing.

The value obtained by any of equations (15) through (17) is larger as the influence of the attraction force sharing edges is larger. An attraction force sharing edge is a redundant edge which is added to promote the sharing of allocated resources. The attraction force sharing edge is not present in an actual circuit. When the influence of the number or weight of such attraction force sharing edges on the entire circuit is too large, the influence of the signal edges actually forming a circuit which is exerted on the arrangement, delay time or the like is evaluated low. This may possibly reduce the quality of the layout. In this variant, the weight given to the attraction force sharing edges is reduced such that the value obtained by any of equations (15) through (17) is equal to or less than a predetermined value. Thus, excessive influence of the attraction force sharing edges can be prevented.

Still alternatively, the value obtained as follows may be used as the layout difficulty level evaluation value. A node, to which a dummy hardware resource is allocated, is added to an attraction force sharing edge having a weight of a predetermined value or less, which is included in the allocated resource connection graph. (A node to which a dummy hardware is allocated is referred to as a "dummy node".) Thus, an allocated resource connection graph for evaluation is generated. A calculation is performed on the graph using equation (18). The obtained value may be used as layout difficulty level evaluation value.

$$COSTd=\{\log(N1)-\log(N2)\}/\log(2) \quad (18)$$

In equation (18), N1 and N2 are defined as follows. One node in the graph will be used as reference. The number of nodes which are connected to the reference node via one signal edge (hereinafter, referred to as a "primary adjacent node) is n1, and the number of nodes which are connected to the reference node via two or less signal edges (hereinafter, referred to as a "up-to-secondary adjacent node) is n2. Where, for example, a node TG shown in FIG. 37 is the reference node, the number n1 of the primary adjacent nodes connected to the reference node via solid lines is five, and the number n2 of the up-to-secondary adjacent nodes connected to the reference node via solid lines and dashed lines is 13. In equation (18), N1 represents a sum of n1 of all the nodes included in the allocated resource connection graph (i.e., the total number of the primary adjacent nodes). N2 represents a sum of n2 of all the nodes included in the allocated resource connection graph (i.e., the total number of the up-to-secondary adjacent nodes). N1 and N2 in equation (18) may be the average number of the primary adjacent nodes per node, and the average number of the up-to-secondary adjacent nodes per node, respectively.

Equation (18) is described in Japanese Patent No. 2977422, and is used to estimate the quality of the layout based on the connection relationship of the graph. The value COSTd obtained by equation (18) indicates the dimension of complexity of a given allocated resource connection graph. When this value is larger than two, it is difficult to layout the allocated resource connection graph two-dimensionally. Thus, the weight of the attraction force sharing edges is reduced such that the value obtained by equation (18) is equal to or less than a predetermined value (e.g., 2). In this manner, the allocated resource connection graph having the attraction force sharing edges added thereto can be laid out two-dimensionally with no specific difficulty.

According to the method described in Japanese Patent No. 2977422, a weighted graph cannot be used. In this variation, a dummy node is added to an attraction force sharing edge having a weight of a predetermined value or less, so as to generate an allocated resource connection graph for evaluation. For example, when the nodes shown in FIG. 37 are included in the original allocated resource connection graph, the corresponding part of the allocated resource connection graph for evaluation is as shown in FIG. 38. In FIG. 38, the number n2 of the up-to-secondary adjacent nodes is changed from 13 to 12, because two dummy nodes are added.

By adding dummy nodes as described above, the values n1 and n2 are decreased. As a result, the value COSTd is decreased. By this, equation (18) can reflect that for obtaining an optimum layout result in the scheduling and resource arrangement step, edges having a small value are not taken into serious consideration. Thus, the method described in Japanese Patent No. 2977422 can be expanded to be applicable to a weighted graph.

Next, the details of the attraction force sharing edge selection step (step S142) will be described. As described above, in the attraction force sharing edge selection step, an attraction force sharing edge, the weight of which is to be reduced in the subsequent attraction force sharing edge weight reduction step, is selected based on predetermined criteria. In the case where sharing of the allocated resources connected to both ends of an attraction force sharing edge provides little effect, such an attraction force sharing edge (i.e., a sharing edge providing little sharing effect) is selected.

There are various methods for selecting an attraction force sharing edge in the attraction force sharing edge selection step. For example, according to a first selection method, the difference in the bit length between the allocated resources connected to both ends of an attraction force sharing edge is obtained. An attraction force sharing edge corresponding to a large difference may be selected. In this case, an attraction force sharing edge corresponding to the maximum difference in the bit length may be selected, or an attraction force sharing edge corresponding to a difference of a predetermined value or larger may be selected. When two allocated resources having different bit lengths are shared, the allocated resource having a larger bit length executes calculations for the allocated resource having a smaller bit length. In such a state, the performance of the allocated resources cannot be fully utilized, and such sharing is inefficient. Therefore, an attraction force sharing edge corresponding the maximum difference in the bit length is selected in the attraction force sharing edge selection step, and the weight of the selected attraction force sharing edge is reduced in the attraction force sharing edge weight reduction step. In this manner, sharing of allocated resources having different bit lengths can be prevented.

According to a second selection method, the difference in the delay time between the allocated resources connected to both ends of an attraction force sharing edge is obtained. An attraction force sharing edge corresponding to a large difference may be selected. In this case, an attraction force sharing edge corresponding to the maximum difference in the delay time may be selected, or an attraction force sharing edge corresponding to a difference of a predetermined value or larger may be selected. When two allocated resources having different delay times are shared also, the performance of the allocated resources cannot be fully utilized for a similar reason to that described above. Therefore, an attraction force sharing edge corresponding the maximum difference in the delay time is selected and the weight thereof is reduced in the attraction force sharing edge selection step and the attraction force sharing edge weight reduction step. In this manner, sharing of allocated resources having different delay times can be prevented.

According to a third selection method, among each pair of allocated resources connected to both ends of each of attraction force sharing edges, the allocated resource having a smaller area size is found. The smaller area sizes thus found are compared among the attraction force sharing edges. An attraction force sharing edge corresponding to a small area size of such an allocated resource maybe selected. In this case, an attraction force sharing edge corresponding to the minimum area size may be selected, or an attraction force sharing edge corresponding to an area size of a predetermined value or smaller may be selected. Even if allocated resources having small area sizes are shared, it does not much contribute to size reduction of the entire circuit. Therefore, an attraction force sharing edge corresponding to an allocated resource having the minimum area size, among the smaller allocated resources of the pairs, is selected and the weight thereof is reduced in the attraction force sharing edge selection step and the attraction force sharing edge weight reduction step. In this manner, sharing of allocated resources having small area sizes can be prevented.

According to a fourth selection method, an attraction force sharing edge having a weight which more suppresses sharing (a smaller weight in this variation) may be selected. In this case, an attraction force sharing edge having the minimum weight may be selected, or an attraction force sharing edge having a weight of a predetermined value or less may be selected. As the weight given to an attraction force sharing edge is smaller, it is less preferable to share the allocated resources connected to both ends of the attraction force sharing edge. Therefore, an attraction force sharing edge having the minimum weight is selected and the weight thereof is reduced in the attraction force sharing edge selection step and the attraction force sharing edge weight reduction step. In this manner, the influence of an attraction force sharing edge providing little effect of sharing can be removed, and the allocated resources can be shared more efficiently.

According to a fifth selection method, a lifetime of an output value of each of the allocated resources connected to both ends of an attraction force sharing edge is obtained. An attraction force sharing edge corresponding to the allocated resources having a high probability of the lifetimes overlapping may be selected. In this case, an attraction force sharing edge corresponding to the allocated resources having the maximum probability may be selected, or an attraction force sharing edge corresponding to the allocated resources having a probability of a predetermined value or larger may be selected. When two allocated resources having overlapping lifetimes are shared, registers holding the output values of the allocated resources cannot be shared. Therefore, the possibility of reducing the circuit area by sharing the registers performed later is low. Therefore, an attraction force sharing edge corresponding to the allocated resources having a high probability of overlapping is selected and the weight thereof is reduced in the attraction force sharing edge selection step and the attraction force sharing edge weight reduction step. In this manner, the influence of an attraction force sharing edge providing little effect of sharing can be removed, and the allocated resources can be shared more efficiently.

The probability calculated in the fifth selection method is as follows. When the i'th and j'th allocated resources are shared, there are a plurality of methods for allocating two processing nodes corresponding to these allocated resources to states such that the total execution state number does not exceed the value obtained in the initial allocation scheduling. The probability is the ratio of the number of methods by which the lifetimes of the output values from the processing nodes overlap each other, with respect to the number of the above-mentioned plurality of methods. The probability is calculated using equation (19).

$$Po_{ij}=Oc_{ij}/PG_{ij} \quad (19)$$

In equation (19), $PG_{ij}$ is the value defined by equation (6), and $Oc_{ij}$ is the number of methods by which the lifetimes of the output values from the processing nodes overlap each other, among the methods for allocating two processing nodes corresponding to the i'th and j'th allocated resources to states such that the total execution state number does not exceed the value obtained in the initial allocation scheduling.

Figure 39A:
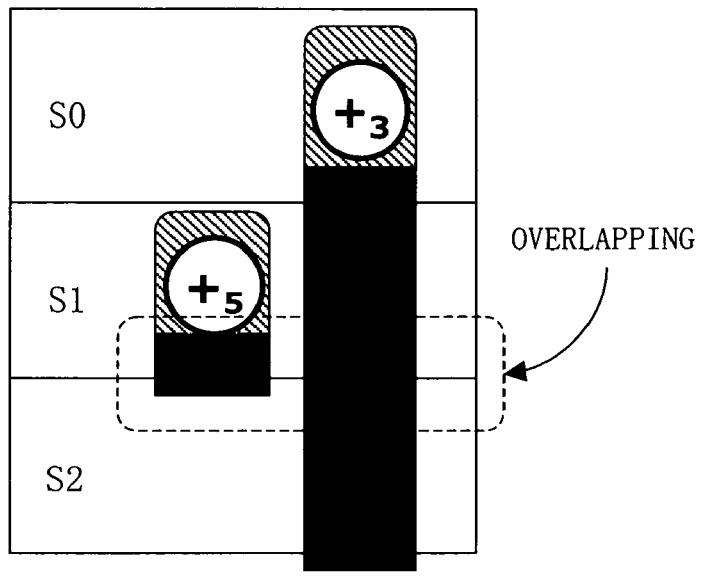
FIG. 39A and FIG. 39B show that lifetimes of output values from the processing nodes $N_{+3}$ and $N_{+5}$ regarding the CDFG shown in FIG. 2 overlap each other.
Figure 39B:
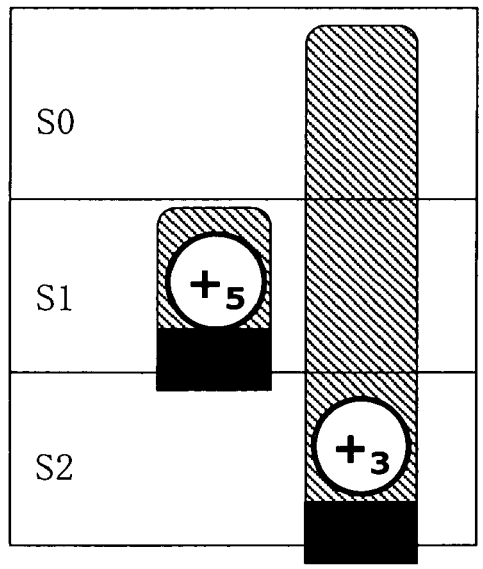

For example, probability $Po_{ij}$ can be calculated for the schedule changeable range in FIG. 9 using equation (19) as follows. When the allocated resources $R_{+3}$ and $R_{+5}$ are to be shared, there are two methods for allocating two processing nodes corresponding to these allocated resources to states such that the total execution state number does not exceed the initially obtained value (see FIG. 39A and FIG. 39B). In FIG. 39A, for example, the processing node $N_{+3}$ (corresponding to the allocated resource $R_{+3}$) is allocated to state S0, and the processing node $N_{+5}$ (corresponding to the allocated resource $R_{+5}$) is allocated to state S1. In this case, the lifetime of the output value of the processing node $N_{+3}$ overlaps the lifetime of the output value of the processing node $N_{+5}$. By contrast, in FIG. 39B, the processing node $N_{+3}$ is allocated to state S2, and the processing node $N_{+5}$ is allocated to state S1. In this case, the lifetime of the output value of the processing node $N_{+3}$ does not overlap the lifetime of the output value of the processing node $N_{+5}$. Accordingly, $PG_{+3, +5}=2$; $Oc_{+3, +5}=1$. As a result, $Po_{+3, +5}=\frac{1}{2}$.

Figure 40A:
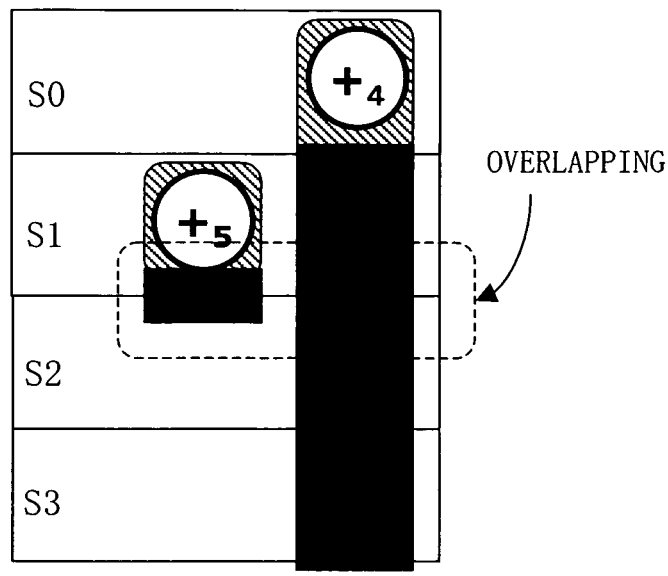
FIG. 40A through FIG. 40C show that lifetimes of output values from the processing nodes $N_{+4}$ and $N_{+5}$ regarding the CDFG shown in FIG. 2 overlap each other.
Figure 40B:
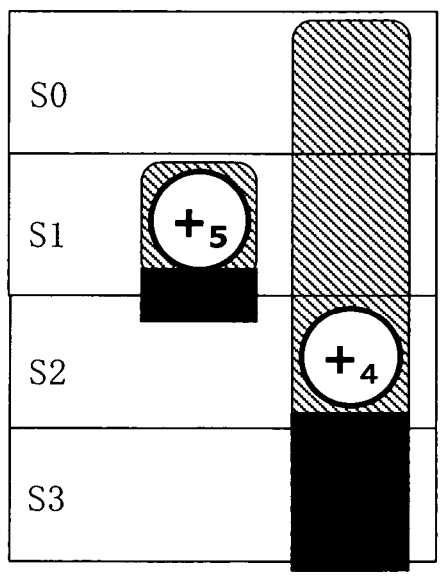
Figure 40C:
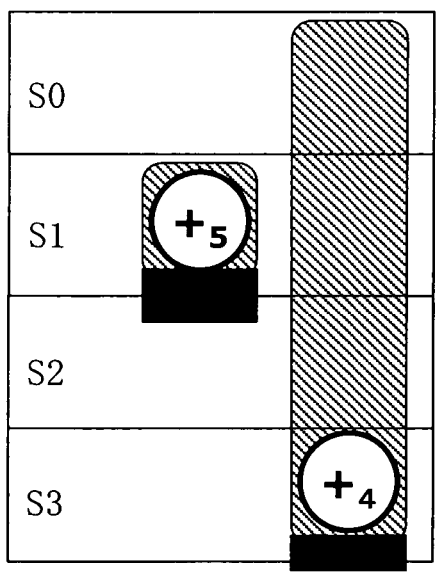

Similarly, when the allocated resources $R_{+4}$ and $R_{+5}$ are to be shared, there are three methods for allocating two processing nodes corresponding to these allocated resources to states such that the total execution state number does not exceed the initially obtained value (see FIG. 40A through FIG. 40C). By the method of FIG. 40A, the lifetime of the output value of the processing node $N_{+4}$ (corresponding to the processing node $R_{+4}$) overlaps the lifetime of the output value of the processing node $N_{+5}$. By the other two methods, the lifetimes do not overlap. Accordingly, $PG_{+4, +5}=3$; $Oc_{+4, +5}=1$. As a result, $Po_{+4, +5}=\frac{1}{3}$.

According to a sixth selection method, an evaluation value obtained by appropriately combining the evaluation values obtained in the first through fifth selection methods is obtained. An attraction force sharing edge corresponding to the maximum (or minimum) evaluation value may be selected. For example, a sharing edge corresponding to the maximum evaluation value Sc obtained by equation (20) may be selected.

$$Sc=\alpha 1\times\Delta B+\alpha 2\times\Delta D+\alpha 3/A+\alpha 4/W+\alpha 5\times Po \quad (20)$$

In equation (20), $\Delta B$ is the difference in the bit length between the allocated resources (evaluation value in the first selection method), $\Delta D$ is the difference in the delay time between the allocated resources (evaluation value in the second selection method), A is an area size of a smaller allocated resources (evaluation value in the third selection method), W is the weight of the attraction force sharing edge (evaluation value in the fourth selection method), Po is the probability that the lifetimes of output values of the allocated resources overlap (evaluation value in the fifth selection method), and α1 through α5 are parameters for adjusting which selection method is to be provided with more importance. By adjusting α1 through α5 to appropriate values, various selection methods can be easily realized.

As described above, according to the high level synthesis method of this variation, the weight given to an attraction force sharing edge is changed to an appropriate value in the attraction force sharing edge weight adjustment step. Thus, an allocated resource connection graph with the weight of the attraction force sharing edges appropriately reduced is generated. Accordingly, even when sharing edges are added to the allocated resource connection graph, the quality of the layout is not significantly reduced. Therefore, a circuit requiring a small total execution state number than in a conventional circuit can be provided while the quality of the layout is maintained.

Second Embodiment

Figure 41:
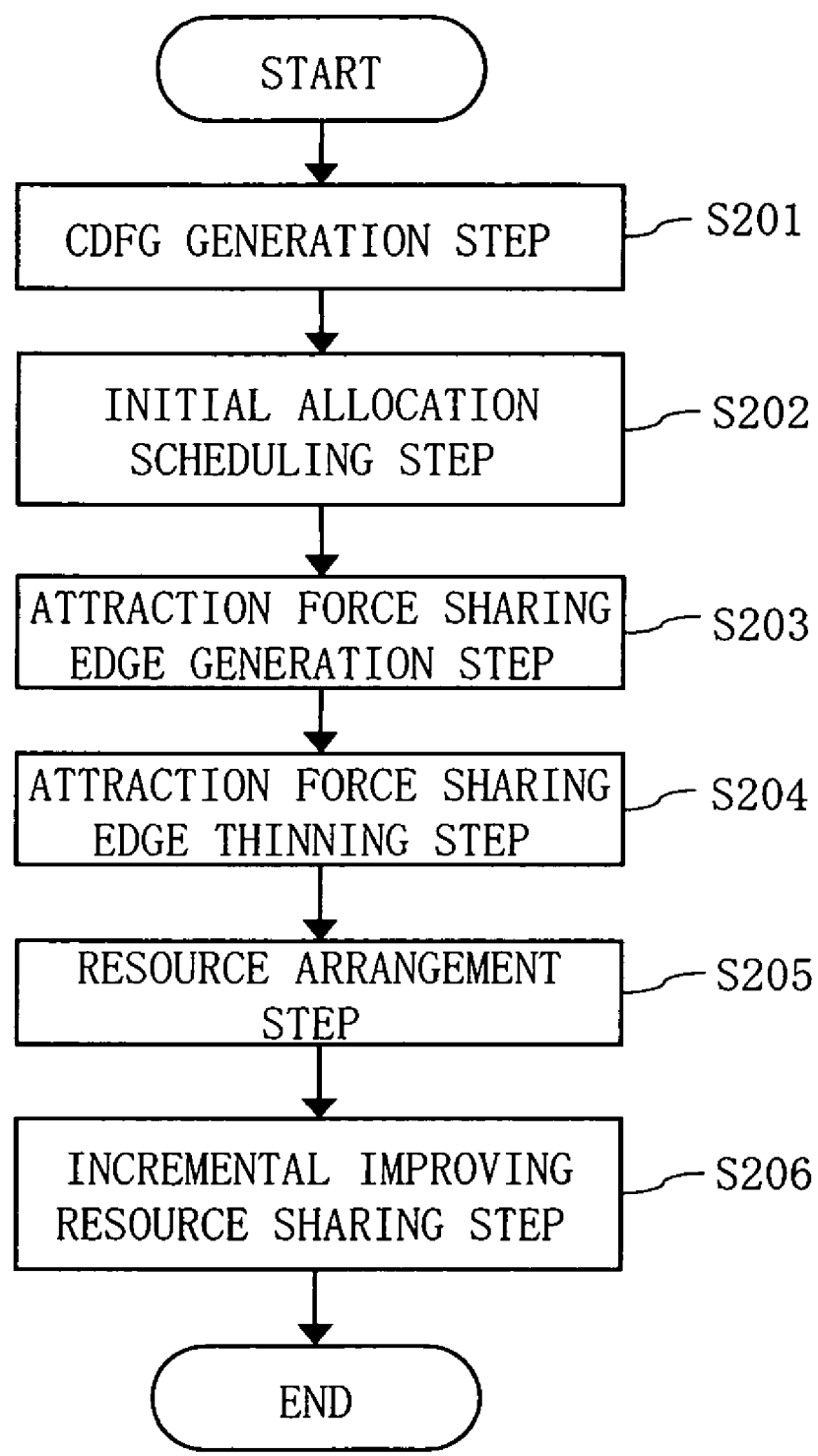
FIG. 41 is a flowchart showing a high level synthesis method according to a second embodiment of the present invention.

FIG. 41 is a flowchart showing a layout-based high level synthesis method according to a second embodiment of the present invention. According to the high level synthesis method shown in FIG. 41, a CDFG generation step, an initial allocation scheduling step, an attraction force sharing edge generation step, an attraction force sharing edge thinning step, a resource arrangement step, and an incremental improving resource sharing step are performed for operation description data describing the operation specifications of a design target circuit.

In FIG. 41, the CDFG generation step (step S201) and the initial allocation scheduling step (step S202) are the same as those included in the high level synthesis method (FIG. 1) according to the first embodiment, and will not be described here.

In the attraction force sharing edge generation step (step S203), a new sharing edge is added between sharable allocated resources included in allocated resource connection graph which was generated in the initial allocation scheduling step. In this embodiment, unlike in the first embodiment, only an attraction force sharing edge is added in the attraction force sharing edge generation step, but a repulsion force sharing edge is not added. Like in the first embodiment, an attraction force sharing edge maybe weighted in order to adjust the degree at which the allocated resources are shared. The weight given to an attraction force sharing edge is calculated using, for example, equation (2).

In the attraction force sharing edge thinning step (step S204), a part of the attraction force sharing edges generated in the attraction force sharing edge generation step is thinned out. Owing to the attraction force sharing edge thinning step, an allocated resource connection graph in which attraction force sharing edges are added to a part of the allocated resources but no attraction force sharing edge is added to the other allocated resources is obtained.

In the resource arrangement step (step S205), a rough arrangement of the allocated resources in a provisional layout area is obtained based on the allocated resource connection graph obtained in the attraction force sharing edge thinning step. This step uses the allocated resources as elements to be arranged, and the edges between the allocated resources as connection elements. In the resource arrangement step, a relative positional relationship when the allocated resources are represented with points having no size is obtained, and then an arranged position of each allocated resource in the layout area is determined.

In the incremental improving resource sharing step (step S206), allocated resources are shared as follows in order to reduce the number thereof, like in the resource, sharing step in the conventional high level synthesis (FIG. 44, step S14). When a plurality of allocated resources having the same function are arranged close to each other in the layout result, such allocated resources are shared in consideration of processing timing. In addition, unlike in the conventional high level synthesis, when the allocated resource connection graph is changed in accordance with the sharing of the allocated resources, a sharing edge is re-generated and thus the layout result is corrected.

Hereinafter, the attraction force sharing edge thinning step (step S204), the resource arrangement step (step S205), and the incremental improving resource sharing step (step S206), which are features of this embodiment will be described in detail. First, the details of the attraction force sharing edge thinning step will be described.

Figure 42:
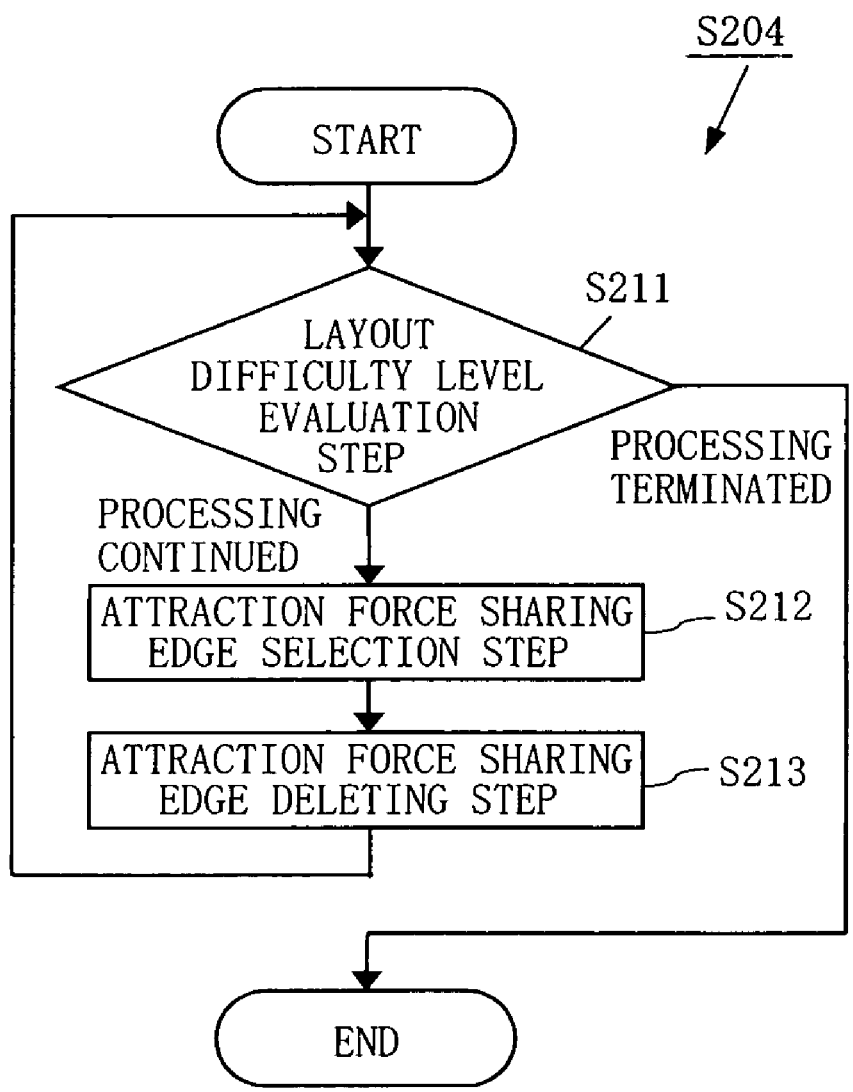
FIG. 42 is a flowchart showing the details of the attraction force sharing edge thinning step shown in FIG. 41.

FIG. 42 is a flowchart showing the details of the attraction force sharing edge thinning step. In the attraction force sharing edge thinning step shown in FIG. 42, a layout difficulty level evaluation step, an attraction force sharing edge selection step, and an attraction force sharing edge deleting step are performed on the allocated resource connection graph having the attraction force sharing edges added thereto in the attraction force sharing edge generation step. The details of the attraction force sharing edge thinning step are similar to the details of the attraction force sharing edge weight adjustment step (step S131, FIG. 36) described in the fourth variant of the first embodiment.

In FIG. 42, the layout difficulty level evaluation step (step S211) and the attraction force sharing edge selection step (step S212) are the same as the layout difficulty level evaluation step (step S141) and the attraction force sharing edge selection step (step S142) described in the fourth variant of the first embodiment. In the attraction force sharing edge deleting step (step S213), the attraction force sharing edge selected in the attraction force sharing edge selection step is deleted, and then the layout difficulty level evaluation step is performed again. Steps S211 through S213 are repeated until it is determined to terminate the processing in the layout difficulty level evaluation step.

In the fourth variant of the first embodiment, the weight of the selected attraction force sharing edge is reduced in the attraction force sharing edge weight reduction step (step S143). By contrast, in this embodiment, the selected attraction force sharing edge is completely deleted from the allocated resource connection graph. In this embodiment, only the attraction force sharing edges are provided between the allocated resources in the allocated resource connection graph, and no repulsion force sharing edge is provided. Therefore, deletion of an attraction force sharing edge means reduction of the weight of the attraction force sharing edge to 0. Accordingly, by deleting the attraction force sharing edge, the number of attraction force sharing edges to be processed in the incremental improving resource sharing step performed later is reduced, and thus the time required for the arrangement of the resource can be shortened.

Next, the details of the resource arrangement step (step S205) will be described. In the resource arrangement step, a layout result, by which the cost is minimum when the allocated resource connection graph having the attraction force sharing edges added thereto is arranged in accordance with a certain layout model, is obtained. The cost when the allocated resource connection graph is arranged is given by, for example, equation (21). Then, the result of arrangement of the allocated resources by which the cost COST by equation (21) is minimum is obtained.

$$COST = \sum_{i=1}^{R_n} \sum_{j=1}^{R_n} (WM'_{ij} \times L_{ij}) \quad (21)$$

In equation (21), Rn and $L_{ij}$ are defined by equation (4), and $WM_{ij}$ is the weight of the connection edge between the i'th and j'th allocated resources. In this embodiment, weight $WM_{ij}$ of a connection edge is defined for each type of edge (signal edge, attraction force sharing edge). For example, when the connection edge is a signal edge, weight $WM_{ij}$ is set to 1; and when the connection edge is an attraction force sharing edge, weight $WM_{ij}$ is set to $Wa_{ij}$ obtained by equation (2).

As described above, in the scheduling and resource arrangement step in the first embodiment (step S104 in FIG. 1), the processing of changing the arranged positions of the allocated resources (MOVE processing) and the processing of changing the allocated states of the processing nodes (RESCH processing) are repeated. By contrast, in the resource arrangement step in this embodiment, only the MOVE processing is repeated. The RESCH processing is not performed. In the scheduling and resource arrangement step in the first embodiment, the sharable allocated resources can be arranged at the same position. By contrast, in the resource arrangement step in this embodiment, even sharable allocated resources are prohibited from being arranged at the same position.

The layout result by which the cost COST by equation (21) is minimum is obtained in the above conditions. According to the obtained layout result, allocated resources connected to via an attraction force sharing edge are arranged close to each other. Therefore, sharing of the allocated resources connected to each other via an attraction force sharing edge is promoted.

Figure 43:
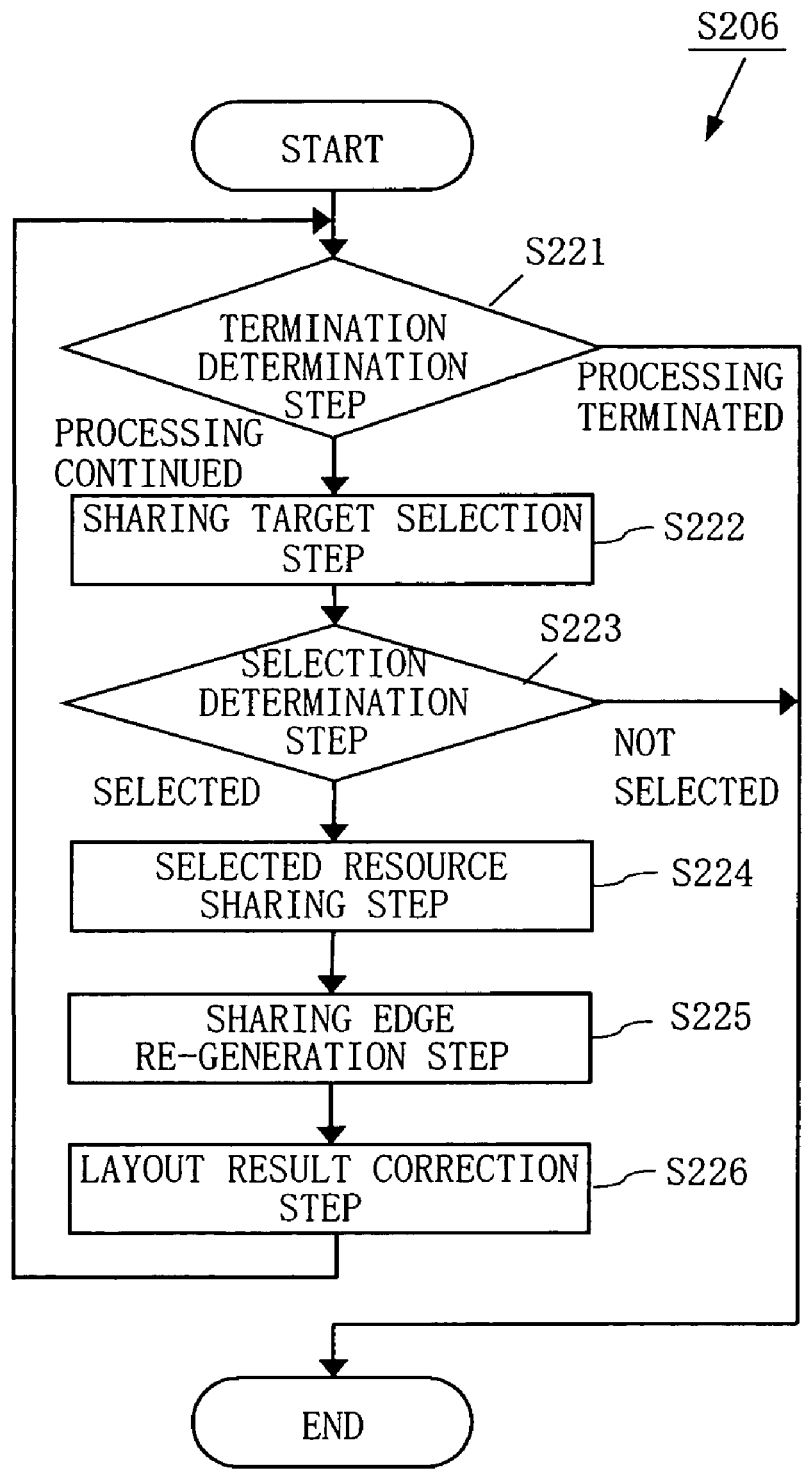
FIG. 43 is a flowchart showing the details of the incremental improving resource sharing step shown in FIG. 41.

Next, the details of the incremental improving resource sharing step (step S206) will be described. FIG. 43 is a flowchart showing the details of the incremental improving resource sharing step. In the incremental improving resource sharing step shown in FIG. 43, a termination determination step, a sharing target selection step, a selection determination step, a selected resource sharing step, a sharing edge re-generation step, and a layout result correction step are performed on the allocated resource connection graph obtained in the attraction force sharing edge thinning step and the layout result obtained in the resource arrangement step.

In the termination determination step (step S221), it is determined whether or not a predetermined sharing termination condition is fulfilled. When it is determined to continue the processing, in the sharing target selection step (step S222), allocated resources to be shared are selected based on the distance between the allocated resources in the layout result. Next, in the selection determination step (step S223), it is determined whether or not the selection has been performed in the sharing target selection step. When the selection has been performed, the selected resource sharing step, the sharing edge re-generation step, and the layout result correction step are performed.

In the selected resource sharing step (step S224), the allocated resources selected in the sharing target selection step are shared, and the allocated resource connection graph is changed. Next, in the sharing edge re-generation step (step S225), an attraction force sharing edge is re-added to the post-change allocated resource connection graph. Next, in the layout result correction step (step S226), the layout result is corrected based on the allocated resource connection graph to which the attraction force sharing edge has been re-added.

Hereinafter, the details of each step shown in FIG. 43 will be described. In the termination determination step (step S221), whether there are a predetermined number or greater of usable allocated resources or not is adopted as the sharing termination condition, for example. In the termination determination step, when there are a predetermined number or greater of usable allocated resources, it is determined to continue the processing. Otherwise, it is determined to terminate the processing.

In the sharing target selection step (step S222), from a set of pairs of sharable allocated resources, a pair of allocated resources having the evaluation value $COST1_{ij}$ by equation (8), which is equal to or larger than a predetermined value and also maximum, is selected for example. Instead of the evaluation value by equation (8), the evaluation value by equation (22) may be used.

$$COST5_{ij} = A2 \times WM'_{ij}/L_{ij} \quad (22)$$

In equation (22), $L_{ij}$ and $WM'_{ij}$ are respectively defined by equation (8) and equation (21), and A2 is a parameter obtained by experiments or the like.

In this embodiment, the allocated resources are shared based on the $WM'_{ij}$ (weight given to a signal edge or an attraction force sharing edge). The allocated resources which are not connected via a signal edge or an attraction force sharing edge are not shared even if the distance therebetween is minimum. If the allocated resources both having $WM'_{ij}$ of 0 are shared, the total execution state number may exceed the value obtained in the initial allocation scheduling step. According to the high level synthesis method of this embodiment, sharing of allocated resources both having $WM'_{ij}$ of 0 is prevented, and thus an increase of the total execution state number can be prevented with certainty.

Alternatively, the evaluation value by equation (23) may be used instead of the evaluation value by equation (8).

$$COST6_{ij} = B \times WM'_{ij} + C/L_{ij} \quad (23)$$

In equation (23), $L_{ij}$ and $WM'_{ij}$ are respectively defined by equation (8) and equation (21), and B and C are parameters obtained by experiments or the like.

When equation (22) is used, if $WM'_{ij}$ is 0, the evaluation value is 0. When equation (23) is used, even if $WM'_{ij}$ is 0, the evaluation value may not be 0 because of the second term. Accordingly, which of $WM'_{ij}$ and $L_{ij}$ is to be provided with more importance can be adjusted using parameters B and C. The effects provided by this are substantially the same as those described in the second variant of the first embodiment.

In the selected resource sharing step (step S224), the allocated resources selected in the sharing target selection step are shared, and the allocated resource connection graph is changed, as described above. At this point, a selection circuit required by the sharing of the allocated resources is added to the allocated resource connection graph.

In the sharing edge re-generation step (step S225), an attraction force sharing edge is re-added to the allocated resource connection graph processed in the selected resource sharing step. This step is the same as the sharing edge re-generation step (step S122 in FIG. 22) in the first variant of the first embodiment. Namely, a sharing edge is added again to sharable allocated resources included in the allocated resource connection graph at that point, and weight Wa'$_{ij}$ by equation (6) is given to the sharing edge.

In the layout result correction step (step S226), the layout result is corrected based on the allocated resource connection graph after the sharing edge is re-added as described above. In more detail, the arrangement result of the allocated resources having the minimum cost COST by equation (21) is obtained for the allocated resource connection graph processed by the sharing edge re-generation step.

In the incremental improving resource sharing step shown in FIG. 43, each time allocated resources are shared, attraction force sharing edge generation, layout result correction, and allocated resource sharing are performed on the allocated resource connection graph at that point, until the termination condition is fulfilled ("processing terminated" in step S221) or no allocated resources to be shared are selected ("not selected" in step S223) By repeating such processing, the final number of allocated resources and the arranged positions of the allocated resources are determined.

According to the high level synthesis method in this embodiment, when sharing the allocated resources in consideration of the layout, an attraction force sharing edge is added to the allocated resource connection graph. By this, the sharing of the allocated resources can be promoted without the total execution state number exceeding the value obtained in the initial allocation scheduling step. Accordingly, a circuit having a smaller total execution state number than provided by the conventional high level synthesis method is obtained, in consideration of the layout.

By weighting an attraction force sharing edge, the degree at which the sharing of allocated resources is promoted can be controlled. As a result, a better synthesis result can be obtained. By deleting an attraction force sharing edge providing little effect provided by sharing from the allocated resource connection graph, a circuit having a smaller total execution state number than provided by the conventional high level synthesis method can be obtained while reducing the processing time and maintaining the quality of the layout.

In this embodiment also, as described in the fourth variant of the first embodiment, the weight of an attraction force sharing edge can be reduced to a predetermined level which is larger than 0. Thus, like in the fourth variant of the first embodiment, a circuit having a smaller total execution state number can be obtained while maintaining the quality of the layout.

So far, high level synthesis methods according to the first and second embodiments of the present invention and variations thereof have been described. The feature of these high level synthesis methods may be arbitrarily combined to construct a new high level synthesis method, as long as such combination is not against the nature thereof.

A high level synthesis method according to the present invention provides an effect of efficiently performing the sharing of allocated resources without increasing the clock cycle required for the processing, and therefore is widely applicable to design various types of digital semiconductor integrated circuits.

While the invention has been described in detail, the foregoing description is in all aspects illustrative and not restrictive. It is understood that numerous other modifications and variations can be devised without departing from the scope of the invention.

What is claimed is:

1. A high level synthesis method for a semiconductor integrated circuit in consideration of layout, the high level synthesis method comprising:
   a flow graph generation step of generating a flow graph associating calculations included in a function description of a design target circuit with nodes, and also associating a data flow included in the function description with edges;
   an initial allocation scheduling step of allocating a usable hardware resource to each of the nodes of the flow graph; allocating each node of the flow graph to a state corresponding to a clock cycle in consideration of the ordering represented by the edges of the flow graph; obtaining a total number of states required for executing processing represented by the flow graph from a result of the state allocation; and generating an allocated resource connection graph which has nodes corresponding to the nodes of the flow graph after the allocation of the hardware resource, and signal edges corresponding to the edges of the flow graph;
   a sharing edge generation step of adding a sharing edge between a pair of nodes which are included in the allocated resource connection graph and to which sharable hardware resources are allocated, the sharing edge being added for controlling sharing of the nodes;
   a resource arrangement step of providing a provisional layout of the allocated resource connection graph having the sharing edges added thereto; and
   a resource sharing step of sharing nodes of the allocated resource connection graph based on a layout result obtained in the resource arrangement step.

2. A high level synthesis method according to claim 1, wherein:
   when there are nodes allocated to different states in the state allocation result, the sharing edge generation step adds attraction force sharing edges for promoting sharing between the corresponding nodes of the allocated resource connection graph; and when there are nodes allocated to the same state in the state allocation result, the sharing edge generation step adds repulsion force sharing edges for suppressing sharing between the corresponding nodes of the allocated resource connection graph; and
   the resource arrangement step arranges the nodes connected by an attraction force sharing edge close to each other, and arranges the nodes connected by a repulsion force sharing edge discretely.

3. A high level synthesis method according to claim 2, wherein:
   the sharing edge generation step gives a weight to an edge in the allocated resource connection graph; and
   the resource arrangement step obtains the layout result based on the weight given by the sharing edge generation step.

4. A high level synthesis method according to claim 3, wherein when each node of the flow graph is re-allocated to a state in the range that a total state number does not exceed a value obtained in the initial allocation scheduling step, the sharing edge generation step sets the weight given to an attraction force sharing edge added between nodes, having a higher possibility of being allocated to different states, to a value which more highly promotes sharing.

5. A high level synthesis method according to claim 3, wherein when each node of the flow graph is re-allocated to a state in the range that a total state number does not exceed a value obtained in the initial allocation scheduling step, the sharing edge generation step sets the weight given to a repulsion force sharing edge added between nodes, having a lower possibility of being allocated to different states, to a value which more highly suppresses sharing.

6. A high level synthesis method according to claim 3, wherein when the nodes allocated to the same state in the state allocation result are connected via one or more signal edges in the same state, the sharing edge generation step sets the weight given to the repulsion force sharing edge, added between the corresponding nodes of the allocated resource connection graph, to an invalid value.

7. A high level synthesis method according to claim 3, further comprising:
- a layout difficulty level evaluation step of evaluating a layout difficulty level of the allocated resource connection graph having sharing edges added thereto;
- an attraction force sharing edge selection step of, when the layout difficulty level evaluation step determines that the layout is difficult, selecting an attraction force sharing edge having a low sharing efficiency from the allocated resource connection graph having sharing edges added thereto; and
- an attraction force sharing edge weight reduction step of reducing the weight of the attraction force sharing edge selected in the attraction force sharing edge selection step.

8. A high level synthesis method according to claim 7, wherein the layout difficulty level evaluation step evaluates the layout difficulty level based on a sum of weights given to signal edges and attraction force sharing edges in the allocated resource connection graph having the sharing edges added thereto.

9. A high level synthesis is method according to claim 7, wherein the layout difficulty level evaluation step evaluates the layout difficulty level based on a difference between a sum of weights given to signal edges and a sum of weights given to attraction force sharing edges in the allocated resource connection graph having the sharing edges added thereto.

10. A high level synthesis method according to claim 7, wherein the layout difficulty level evaluation step evaluates the layout difficulty level based on a ratio of a sum of weights given to attraction force sharing edges with respect to a sum of weights given to the signal edges and the attraction force sharing edges in the allocated resource connection graph having the sharing edges added thereto.

11. A high level synthesis method according to claim 7, wherein the layout difficulty level evaluation step adds a node, to which a dummy hardware resource is allocated, to an attraction force sharing edge having a weight of a predetermined value or less based on the allocated resource connection graph having the sharing edges added thereto, thereby generating an allocated resource connection graph for evaluation; obtains a total number of primary adjacent nodes connected to each of all the nodes in the allocated resource connection graph for evaluation via one signal edge and obtains a total number of up-to-secondary adjacent nodes connected to each of all the nodes in the allocated resource connection graph for evaluation via two or less signal edges; and evaluates the layout difficulty level based on the difference between the logarithms of the two total numbers.

12. A high level synthesis method according to claim 7, wherein, when hardware resources allocated to nodes connected to both ends of a certain attraction force sharing edge have a large difference in bit length, the attraction force sharing edge selection step selects the certain attraction force sharing edge as an attraction force sharing edge having a low sharing efficiency.

13. A high level synthesis method according to claim 7, wherein, when hardware resources allocated to nodes connected to both ends of a certain attraction force sharing edge have a large difference in delay time, the attraction force sharing edge selection step selects the certain attraction force sharing edge as an attraction force sharing edge having a low sharing efficiency.

14. A high level synthesis method according to claim 7, wherein, when one of hardware resources allocated to nodes connected to both ends of a certain attraction force sharing edge has a smaller area than the other hardware resource, and the value of the smaller area is sufficiently small, the attraction force sharing edge selection step selects the certain attraction force sharing edge as an attraction force sharing edge having a low sharing efficiency.

15. A high level synthesis method according to claim 7, wherein the attraction force sharing edge selection step selects an attraction force sharing edge given a weight which suppresses sharing as an attraction force sharing edge having a low sharing efficiency.

16. A high level synthesis method according to claim 7, wherein when lifetimes of output values of hardware resources allocated to nodes connected to both ends of a certain attraction force sharing edge have a high probability of overlapping, the attraction force sharing edge selection step selects the certain attraction force sharing edge as an attraction force sharing edge having a low sharing efficiency.

17. A high level synthesis method according to claim 7, wherein in the state where hardware resources allocated to nodes connected to both ends of a certain attraction force sharing edge are different in the bit length and are different in the delay time, one of the hardware resources has a smaller area than the other hardware resource, and the lifetimes of output values of these hardware resources have a certain probability of overlapping; and in the state where an evaluation value is provided by a calculation equation which includes a term in proportion to the difference in the bit length, a term in proportion to the difference in the delay time, a term in inverse proportion to the value of the smaller area, a term in proportion to the probability of overlapping, and a term in inverse proportion to the weight given to the attraction force sharing edge; the attraction force sharing edge selection step selects an attraction force sharing edge having a high evaluation value obtained by the calculation equation as an attraction force sharing edge having a low sharing efficiency.

18. A high level synthesis method according to claim 1, wherein when there are nodes allocated to different states in the state allocation result, the sharing edge generation step adds attraction force sharing edges for promoting sharing between the corresponding nodes of the allocated resource connection graph; and
- the resource arrangement step arranges the nodes connected by the attraction force sharing edge close to each other based on the weight given in the sharing edge generation step.

19. A high level synthesis method according to claim 18, further comprising:
- a layout difficulty level evaluation step of evaluating a layout difficulty level of the allocated resource connection graph having sharing edges added thereto;
- an attraction force sharing edge selection step of, when the layout difficulty level evaluation step determines that the layout is difficult, selecting an attraction force sharing edge having a low sharing efficiency from the allocated resource connection graph having sharing edges added thereto; and an attraction force sharing edge deleting step of deleting the attraction force sharing edge selected in the attraction force sharing edge selection step.

20. A high level synthesis method according to claim 19, wherein the layout difficulty level evaluation step evaluates the layout difficulty level based on a sum of weights given to signal edges and attraction force sharing edges in the allocated resource connection graph having the sharing edges added thereto.

21. A high level synthesis method according to claim 19, wherein the layout difficulty level evaluation step evaluates the layout difficulty level based on a difference between a sum of weights given to signal edges and a sum of weights given to attraction force sharing edges in the allocated resource connection graph having the sharing edges added thereto.

22. A high level synthesis method according to claim 19, wherein the layout difficulty level evaluation step evaluates the layout difficulty level based on a ratio of a sum of weights given to attraction force sharing edges with respect to a sum of weights given to the signal edges and the attraction force sharing edges in the allocated resource connection graph having the sharing edges added thereto.

23. A high level synthesis method according to claim 19, wherein the layout difficulty level evaluation step adds a node, to which a dummy hardware resource is allocated, to an attraction force sharing edge having a weight of a predetermined value or less based on the allocated resource connection graph having the sharing edges added thereto, thereby generating an allocated resource connection graph for evaluation; obtains a total number of primary adjacent nodes connected to each of all the nodes in the allocated resource connection graph for evaluation via one signal edge and obtains a total number of up-to-secondary adjacent nodes connected to each of all the nodes in the allocated resource connection graph for evaluation via two or less signal edges; and evaluates the layout difficulty level based on the difference between the logarithms of the two total numbers.

24. A high level synthesis method according to claim 19, wherein, when hardware resources allocated to nodes connected to both ends of a certain attraction force sharing edge have a large difference in bit length, the attraction force sharing edge selection step selects the certain attraction force sharing edge as an attraction force sharing edge having a low sharing efficiency.

25. A high level synthesis method according to claim 19, wherein, when hardware resources allocated to nodes connected to both ends of a certain attraction force sharing edge have a large difference in delay time, the attraction force sharing edge selection step selects the certain attraction force sharing edge as an attraction force sharing edge having a low sharing efficiency.

26. A high level synthesis is method according to claim 19, wherein, when one of hardware resources allocated to nodes connected to both ends of a certain attraction force sharing edge has a smaller area than the other hardware resource, and the value of the smaller area is sufficiently small, the attraction force sharing edge selection step selects the certain attraction force sharing edge as an attraction force sharing edge having a low sharing efficiency.

27. A high level synthesis method according to claim 19, wherein the attraction force sharing edge selection step selects an attraction force sharing edge given a weight which suppresses sharing as an attraction force sharing edge having a low sharing efficiency.

28. A high level synthesis method according to claim 19, wherein when lifetimes of output values of hardware resources allocated to nodes connected to both ends of a certain attraction force sharing edge have a high probability of overlapping, the attraction force sharing edge selection step selects the certain attraction force sharing edge as an attraction force sharing edge having a low sharing efficiency.

29. A high level synthesis method according to claim 19, wherein in the state where hardware resources allocated to nodes connected to both ends of a certain attraction force sharing edge are different in the bit length and are different in the delay time, one of the hardware resources has a smaller area than the other hardware resource, and the lifetimes of output values of these hardware resources have a certain probability of overlapping; and in the state where an evaluation value is provided by a calculation equation which includes a term in proportion to the difference in the bit length, a term in proportion to the difference in the delay time, a term in inverse proportion to the smaller area, a term in proportion to the probability of overlapping; and a term in inverse proportion to the weight given to the attraction force sharing edge; the attraction force sharing edge selection step selects an attraction force sharing edge having a higher evaluation value obtained by the calculation equation as an attraction force sharing edge having a low sharing efficiency.

30. A high level synthesis method according to claim 1, wherein the resource arrangement step is a scheduling and resource arrangement step of re-allocating each node of the flow graph to each state in the range that a total state number does not exceed a value obtained in the initial allocation scheduling step, and of providing a provisional layout of the allocated resource connection graph having the sharing edges added thereto.

31. A high level synthesis method according to claim 30, further comprising a sharing edge re-generation step of re-adding a sharing edge to the allocated resource connection graph processed in the resource sharing step;

wherein the scheduling and resource arrangement step, the resource sharing step, and the sharing edge re-generation step are repeated until a predetermined condition is fulfilled.

32. A high level synthesis method according to claim 1, wherein the resource sharing step comprises:

a sharing target selection step of selecting a set of nodes to be shared from the allocated resource connection graph;

a selected resource sharing step of sharing the nodes selected in the sharing target selection step;

a sharing edge re-generation step of re-adding a sharing edge to the allocated resource connection graph processed in the selected resource sharing step; and a layout result correction step of correcting the layout result obtained in the resource arrangement step based on the allocated resource connection graph processed in the sharing edge re-generation step;

wherein the resource sharing step is an incremental improving resource sharing step of repeating the sharing target selection step, the selected resource sharing step, the sharing edge re-generation step and the layout result correction step until a predetermined condition is fulfilled.

33. A high level synthesis method according to claim 1, wherein the resource sharing step obtains a priority level of a pair of nodes which are included in the allocated resource connection graph and to which sharable hardware resources are allocated, and shares the nodes in a predetermined range, starting from the pair of nodes having a higher priority level.

34. A high level synthesis method according to claim 33, wherein the priority level in the resource sharing step is in inverse proportion to a distance between the nodes in the layout result obtained in the resource arrangement step.

35. A high level synthesis method according to claim 33, wherein:
the sharing edge generation step gives a weight to an edge in the allocated resource connection graph; and
the priority level in the resource sharing step is in proportion to a value obtained by dividing the weight given to an edge added between the nodes by the distance between the nodes in the layout result obtained in the resource arrangement step.

36. A high level synthesis method according to claim 33, wherein:
the sharing edge generation step gives a weight to an edge in the allocated resource connection graph; and
the priority level in the resource sharing step is calculated using a calculation formula including a term in proportion to the weight given to the edge added between the nodes and a term in inverse proportion to the distance between the nodes in the layout result obtained in the resource arrangement step.

37. A high level synthesis method according to claim 1, wherein the resource arrangement step provides a provisional layout of the allocated resource connection graph having sharing edges added thereto in accordance with a layout model which allows nodes, to which sharable hardware resources are allocated, to be arranged at the same position.

38. A high level synthesis method according to claim 37, wherein in the layout model in the resource arrangement step, the number of nodes which can be arranged at the same position is limited.

39. A high level synthesis method according to claim 37, wherein when a new node is arranged at the same position as another node already arranged, the resource arrangement step estimates a delay time of a selection circuit provided on an input side of the hardware resource provisionally shared by the nodes arranged at the same position; and then estimates the processing time of the state to which the nodes are allocated, including the delay time of the selection circuit; and when the estimated processing time is close to the clock cycle, the resource arrangement step moves the newly arranged node to another position and prohibits arranging a node at the same position as the node already arranged in the subsequent processing.

40. A high level synthesis method according to claim 37, wherein when providing the provisional layout of the allocated resource connection graph having the sharing edges added thereto, the resource arrangement step uses an evaluation function by which an evaluation value is decreased when the number of nodes arranged at the same position exceeds a predetermined value.

41. A high level synthesis method according to claim 1, wherein the resource arrangement step converts a node of the allocated resource connection graph having sharing edges added thereto into a plurality of unit elements and connection elements connecting the unit elements in accordance with the hardware resource allocated to the node, and provides a provisional layout of the post-conversion allocated resource connection graph.

42. A high level synthesis method according to claim 41, wherein when the hardware resource allocated to a node of the allocated resource connection graph having sharing edges added thereto is a hard resource having a fixed shape, the resource arrangement step provides the connection elements at high density; and when the hardware resource allocated to a node of the allocated resource connection graph having sharing edges added thereto is a soft resource having a variable shape, the resource arrangement step provides the connection elements at low density.

43. A high level synthesis method according to claim 42, wherein the resource arrangement step provides a connection element having a large weight to a hardware resource as the hard resource; provides a connection element having a small weight to a hardware resource as the soft resource; and provides a provisional layout of the post-conversion allocated resource connection graph based on the weight given to each connection element.

44. A high level synthesis method according to claim 42, wherein the hardware resource as the hard resource is provided with connection elements for connecting all the unit elements which are adjacent to each other in up, down, right and left directions.

45. A high level synthesis method according to claim 42, wherein the hardware resource as the soft resource is provided with one connection element for connecting all the unit elements.

46. A high level synthesis method according to claim 42, wherein the hardware resource as the soft resource is provided with a connection element to be connected with one or more but three or less unit elements, among the unit elements which are adjacent to each other in up, down, right and left directions.

47. A high level synthesis method according to claim 42, wherein the hardware resource as the soft resource is provided with a connection element for connecting a central unit element and each of the other unit elements.

48. A high level synthesis method according to claim 42, wherein the hardware resource as the soft resource is provided with a connection element in a style in accordance with an architecture of the hardware resource.

49. A high level synthesis method according to claim 1, wherein the flow graph generation step generates a control/data flow graph including a data flow graph representing calculations and a data flow included in the functional description and a control flow graph representing execution control of the calculations included in the functional description.

* * * * *

UNITED STATES PATENT AND TRADEMARK OFFICE
CERTIFICATE OF CORRECTION

PATENT NO. : 7,237,220 B2
APPLICATION NO. : 11/159291
DATED : June 26, 2007
INVENTOR(S) : Osamu Ogawa et al.

It is certified that error appears in the above-identified patent and that said Letters Patent is hereby corrected as shown below:

On the title page of the letters Patent:

Under section "(56) References Cited, OTHER PUBLICATIONS", add
-- KIRKPATRIK et al., "Optimization by Simulated Annealing", Science 200 (1983), pp. 671-680 --

Signed and Sealed this

Twentieth Day of May, 2008

JON W. DUDAS
*Director of the United States Patent and Trademark Office*